US012660212B2

(12) United States Patent
Park et al.

(10) Patent No.: US 12,660,212 B2
(45) Date of Patent: Jun. 16, 2026

(54) CAPACITOR STRUCTURE, METHOD OF FORMING THE SAME, AND SEMICONDUCTOR DEVICE INCLUDING THE CAPACITOR STRUCTURE

(71) Applicant: SAMSUNG ELECTRONICS CO., LTD., Suwon-si (KR)

(72) Inventors: Jungmin Park, Suwon-si (KR); Hanjin Lim, Suwon-si (KR); Hyungsuk Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 357 days.

(21) Appl. No.: 18/462,394

(22) Filed: Sep. 6, 2023

(65) Prior Publication Data

US 2024/0096931 A1      Mar. 21, 2024

(30) Foreign Application Priority Data

Sep. 20, 2022    (KR) ......................... 10-2022-0118269

(51) Int. Cl.
*H10B 12/00* (2023.01)
*H10D 1/00* (2025.01)
*H10D 1/68* (2025.01)

(52) U.S. Cl.
CPC ......... *H10D 1/042* (2025.01); *H10B 12/0335* (2023.02); *H10B 12/315* (2023.02); *H10D 1/696* (2025.01); *H10D 1/716* (2025.01)

(58) Field of Classification Search
CPC ........ H10D 1/042; H10D 1/696; H10D 1/716; H10D 1/692; H10D 1/68; H10B 12/0335; H10B 12/315; H10B 12/033; H10B 12/30
See application file for complete search history.

(56) References Cited

U.S. PATENT DOCUMENTS

| | | | | |
|---|---|---|---|---|
| 8,481,384 | B2 * | 7/2013 | Chen | ........................ H10D 1/68 |
| | | | | 438/240 |
| 8,791,004 | B2 | 7/2014 | Ando et al. | |
| 8,969,169 | B1 | 3/2015 | Chen et al. | |
| 10,964,614 | B2 * | 3/2021 | Lee | ..................... H01L 23/5329 |
| 11,138,499 | B2 | 10/2021 | Sharma et al. | |
| 11,678,476 | B2 | 6/2023 | Cho et al. | |

(Continued)

FOREIGN PATENT DOCUMENTS

| | | |
|---|---|---|
| CN | 109935589 | 6/2019 |
| CN | 112334916 A | 2/2021 |

(Continued)

OTHER PUBLICATIONS

EESR issued in connection with corresponding European Patent Application No. 23193201.3 issue Apr. 29, 2024.

(Continued)

*Primary Examiner* — David Vu

(74) *Attorney, Agent, or Firm* — Morgan, Lewis & Bockius LLP

(57)     ABSTRACT

A capacitor structure includes a lower electrode structure disposed on a substrate, including an oxide of a first metal having 4 valence electrons, and being doped with a second metal having 3, 5, 6, or 7 valence electrons, a dielectric pattern disposed on a sidewall of the lower electrode structure, and an upper electrode disposed on a sidewall of the dielectric pattern.

20 Claims, 43 Drawing Sheets

(56)                  References Cited

U.S. PATENT DOCUMENTS

| | | |
|---|---|---|
| 11,791,374 B2 | 10/2023 | Lee et al. |
| 2014/0183696 A1 | 7/2014 | Rui et al. |
| 2021/0066446 A1 | 3/2021 | Lee et al. |
| 2021/0183718 A1 | 6/2021 | Lee et al. |
| 2022/0157823 A1 | 5/2022 | Jung et al. |

FOREIGN PATENT DOCUMENTS

| | | |
|---|---|---|
| EP | 3971976 A1 | 3/2022 |
| KR | 10-604672 | 7/2006 |
| KR | 10-2022-0014997 A | 2/2022 |
| KR | 10-2022-0106336 A | 7/2022 |
| TW | 1769792 B | 7/2022 |

OTHER PUBLICATIONS

Office Action issued in connection with corresponding Taiwan Patent Application No. 112134150 issued on May 15, 2024.
Office Action dated May 6, 2026 issued in corresponding to Korean Patent Application No. 10-2022-0118269.

\* cited by examiner

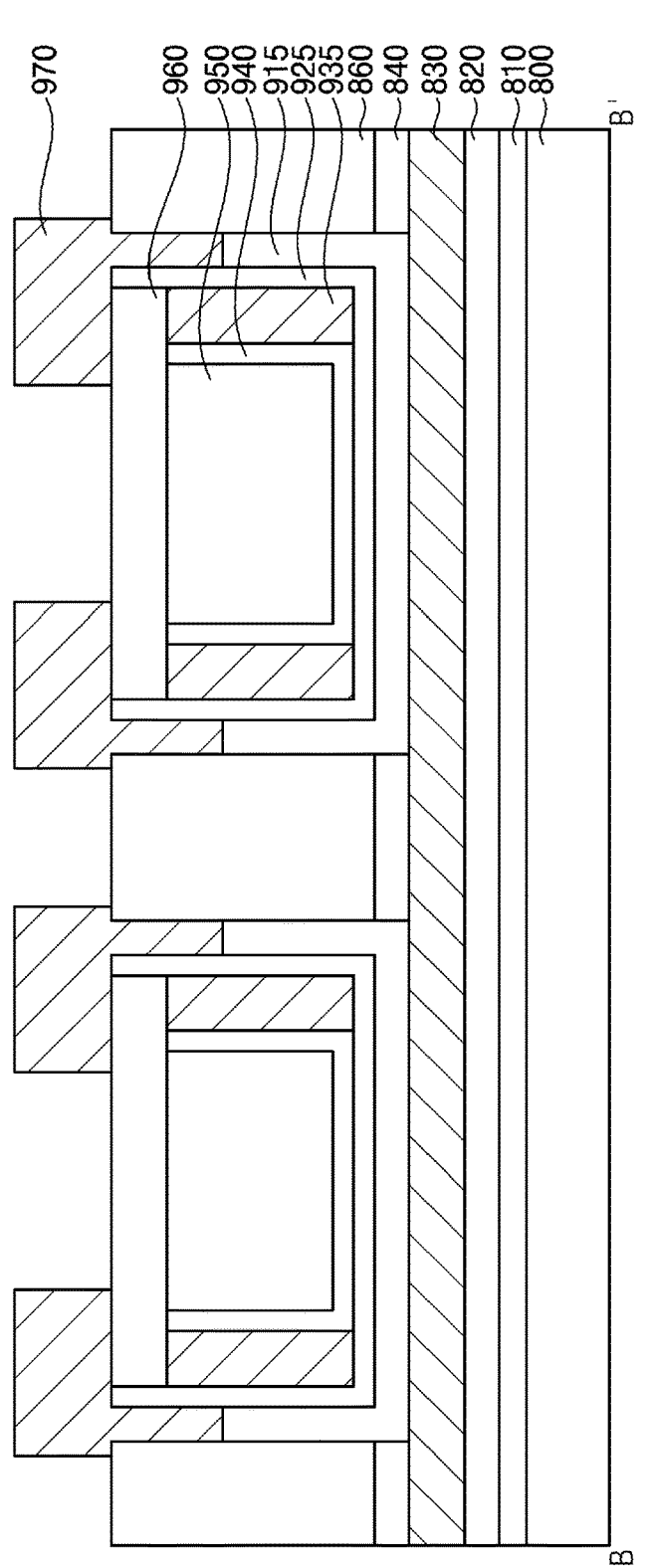
FIG. 45
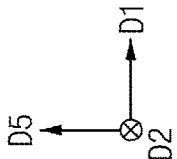

1

CAPACITOR STRUCTURE, METHOD OF FORMING THE SAME, AND SEMICONDUCTOR DEVICE INCLUDING THE CAPACITOR STRUCTURE

CROSS-REFERENCE TO RELATED APPLICATION

This application claims priority under 35 U.S.C. § 119 to Korean Patent Application No. 10-2022-0118269 filed on Sep. 20, 2022 in the Korean Intellectual Property Office, the disclosure of which is hereby incorporated by reference in its entirety.

TECHNICAL FIELD

The present disclosure relates to a capacitor structure, a method of forming the same, and a semiconductor device including the capacitor structure.

DISCUSSION OF RELATED ART

A capacitor in a dynamic random-access memory (DRAM) device includes a lower electrode, an upper electrode and a dielectric pattern disposed between the lower electrode and the upper electrode. A natural oxide layer may be formed between the dielectric pattern and each of the upper and lower electrodes, and may deteriorate the electric characteristics of the capacitor.

SUMMARY

A capacitor structure includes a lower electrode structure disposed on a substrate, including an oxide of a first metal having 4 valence electrons, and being doped with a second metal having 3, 5, 6, or 7 valence electrons, a dielectric pattern disposed on a sidewall of the lower electrode structure, and an upper electrode disposed on a sidewall of the dielectric pattern.

A capacitor structure includes a lower electrode structure including a second lower electrode disposed on a substrate, and a first lower electrode disposed on a sidewall of the second lower electrode, including an oxynitride of a first metal having 4 valence electrons, and being doped with a second metal having 3, 5, 6, or 7 valence electrons, a dielectric pattern disposed on a sidewall of the lower electrode structure, and an upper electrode disposed on a sidewall of the dielectric pattern.

A capacitor structure includes a lower electrode structure including a second lower electrode disposed on a substrate and extending in a vertical direction that is substantially perpendicular to an upper surface of the substrate, and a first lower electrode disposed on a sidewall of the second lower electrode, including an oxide of a first metal having 4 valence electrons, and being doped with a second metal having 3, 5, 6, or 7 valence electrons, support layers contacting a sidewall of the lower electrode structure and being spaced apart from each other in the vertical direction, a dielectric pattern disposed on a portion of the sidewall of the lower electrode structure, between neighboring pairs of the support layers, and an upper electrode disposed on a sidewall of the dielectric pattern.

A method of forming a capacitor structure includes forming a lower electrode structure on a substrate to include an oxide of a first metal having 4 valence electrons and to be doped with a second metal having 3, 5, 6, or 7 valence electrons. A dielectric pattern is formed on a sidewall of the lower electrode structure. An upper electrode is formed on a sidewall of the dielectric pattern.

A method of forming a capacitor structure includes forming a lower electrode structure on a substrate to include an oxynitride of a first metal having 4 valence electrons and to be doped with a second metal having 3, 5, 6, or 7 valence electrons. A dielectric pattern is formed on a sidewall of the lower electrode structure. An upper electrode is formed on a sidewall of the dielectric pattern.

A method of forming a capacitor structure includes alternately and repeatedly stacking a mold layer and support on a substrate. A first opening is formed through the mold layers and the support layers. A first lower electrode layer is formed to include an oxide of a first metal having 4 valence electrons and to be doped with a second metal having 3, 5, 6, or 7 valence electrons. A second lower electrode layer is formed on the first lower electrode layer to fill a remaining portion of the first opening. The second lower electrode layer and the first lower electrode layer are planarized until an upper surface of an uppermost one of the support layers is exposed to form a second lower electrode and a first lower electrode, respectively. The mold layer is removed to form a second opening exposing a sidewall of the first lower electrode and lower and upper surfaces of the support layers. A dielectric layer is formed on the sidewall of the first lower electrode and the lower and upper surfaces of the support layers exposed by the second opening to include an oxide of a third metal having 4 valence electrons. An upper electrode layer is formed on a surface of the dielectric layer to fill the second opening to include an oxide of a fourth metal having 4 valence electrons and to be doped with a fifth metal having 3, 5, 6, or 7 valence electrons.

A semiconductor device includes an active pattern disposed on a substrate, a gate structure extending through an upper portion of the active pattern in a first direction that is substantially parallel to an upper surface of the substrate, a bit line structure disposed on a central portion of the active pattern and extending in a second direction that is substantially parallel to the upper surface of the substrate and substantially perpendicular to the first direction, a contact plug structure disposed on each of opposite end portions of the active pattern, and a capacitor structure disposed on the contact plug structure. The capacitor structure includes a lower electrode structure including an oxide of a first metal having 4 valence electrons and being doped with a second metal having 3, 5, 6, or 7 valence electrons, a dielectric pattern disposed on a sidewall of the lower electrode structure, and an upper electrode disposed on a sidewall of the dielectric pattern.

A semiconductor device includes an active pattern disposed on a substrate, a gate structure extending through an upper portion of the active pattern in a first direction that is substantially parallel to an upper surface of the substrate, a bit line structure disposed on a central portion of the active pattern and extending in a second direction that is substantially parallel to the upper surface of the substrate and substantially perpendicular to the first direction, a contact plug structure disposed on each of opposite end portions of the active pattern, and a capacitor structure disposed on the contact plug structure. The capacitor structure includes a lower electrode structure including a second lower electrode and a first lower electrode disposed on a sidewall of the second lower electrode, including an oxynitride of a first metal having 4 valence electrons, and being doped with a second metal having 3, 5, 6, or 7 valence electrons, a dielectric pattern disposed on a sidewall of the lower electrode structure, and an upper electrode disposed on a sidewall of the dielectric pattern.

A semiconductor device includes an active pattern disposed on a substrate, a gate structure extending through an upper portion of the active pattern in a first direction that is substantially parallel to an upper surface of the substrate, a bit line structure disposed on a central portion of the active pattern and extending in a second direction that is substantially parallel to the upper surface of the substrate and substantially perpendicular to the first direction, a contact plug structure disposed on each of opposite end portions of the active pattern, and a capacitor structure disposed on the contact plug structure. The capacitor structure includes a lower electrode structure including a second lower electrode extending in a vertical direction that is substantially perpendicular to an upper surface of the substrate, and a first lower electrode disposed on a sidewall of the second lower electrode, including an oxide of a first metal having 4 valence electrons, and being doped with a second metal having 3, 5, 6, or 7 valence electrons, support layers contacting a sidewall of the lower electrode structure and being spaced apart from each other in the vertical direction, a dielectric pattern disposed on a portion of the sidewall of the lower electrode structure, between neighboring pairs of the support layers, and an upper electrode disposed on a sidewall of the dielectric pattern.

A semiconductor device includes a bit line structure disposed on a substrate, a gate electrode disposed on the bit line and being spaced apart from the bit line, a gate insulation pattern disposed on a sidewall of the gate electrode, a channel disposed on a sidewall of the gate insulation pattern and including an oxide semiconductor material, a contact plug structure contacting an upper surface of the channel, and a capacitor structure disposed on the contact plug structure. The contact plug structure includes a lower electrode structure disposed on a substrate, including an oxide of a first metal having 4 valence electrons, and being doped with a second metal having 3, 5, 6, or 7 valence electrons, a dielectric pattern disposed on a sidewall of the lower electrode structure, and an upper electrode disposed on a sidewall of the dielectric pattern.

A semiconductor device includes bit line structures, gate electrodes, gate insulation patterns, channels, contact plug structures, and capacitor structures. The bit line structures are formed on a substrate, and each of the bit line structures extends in a first direction that is substantially parallel to an upper surface of the substrate. The bit lines are spaced apart from each other in a second direction that is substantially parallel to the upper surface of the substrate and crossing the first direction. The gate electrodes are spaced apart from each other in the first direction on the bit lines, and each of the gate electrodes extends the second direction. The gate insulation patterns are formed on sidewalls in the first direction of the gate electrodes, respectively. The channels are formed on sidewalls in the first direction of the gate insulation patterns, respectively, and each of the channels includes an oxide semiconductor material. The contact plug structures contacts upper surfaces of the channels, respectively. The capacitor structures are formed on the contact plug structures, respectively. Each of the capacitor structures includes a lower electrode structure including a second lower electrode disposed on a substrate, and a first lower electrode disposed on a sidewall of the second lower electrode, including an oxynitride of a first metal having 4 valence electrons, and being doped with a second metal having 3, 5, 6, or 7 valence electrons, a dielectric pattern disposed on a sidewall of the lower electrode structure, and an upper electrode disposed on a sidewall of the dielectric pattern.

A semiconductor device includes bit line structures, gate electrodes, gate insulation patterns, channels, contact plug structures, and capacitor structures. The bit line structures are formed on a substrate, and each of the bit line structures extends in a first direction that is substantially parallel to an upper surface of the substrate. The bit lines are spaced apart from each other in a second direction that is substantially parallel to the upper surface of the substrate and crossing the first direction. The gate electrodes are spaced apart from each other in the first direction on the bit lines, and each of the gate electrodes extends in the second direction. The gate insulation patterns are formed on sidewalls in the first direction of the gate electrodes, respectively. The channels are formed on sidewalls in the first direction of the gate insulation patterns, respectively, and each of the channels includes an oxide semiconductor material. The contact plug structures contact upper surfaces of the channels, respectively. The capacitor structures are formed on the contact plug structures, respectively. Each of the capacitor structures includes a second lower electrode disposed on a substrate and extending in a vertical direction that is substantially perpendicular to an upper surface of the substrate, and a first lower electrode disposed on a sidewall of the second lower electrode, including an oxynitride of a first metal having 4 valence electrons, and being doped with a second metal having 3, 5, 6, or 7 valence electrons, support layers contacting a sidewall of the lower electrode structure and being spaced apart from each other in the vertical direction, a dielectric pattern disposed on a portion of the sidewall of the lower electrode structure, between neighboring pairs of the support layers, and an upper electrode disposed on a sidewall of the dielectric pattern.

BRIEF DESCRIPTION OF THE DRAWINGS

FIGS. 17 to 32 are plan views and cross-sectional views illustrating a method of manufacturing a semiconductor device according to example embodiments.

FIGS. 35 to 45 are plan views and cross-sectional views illustrating a method of manufacturing a semiconductor device in accordance with example embodiments.

DETAILED DESCRIPTION

The above and other aspects and features of the capacitor structures and the methods of manufacturing the same, the semiconductor devices including the capacitor structures and the methods of manufacturing the same in accordance with example embodiments will become readily understood from detail descriptions that follow, with reference to the accompanying drawings.

It will be understood that, although the terms "first," "second," and/or "third" may be used herein to describe various materials, layers, regions, pads, electrodes, patterns, structure and/or processes, these various materials, layers, regions, pads, electrodes, patterns, structure and/or processes should not necessarily be limited by these terms. These terms are used to distinguish one material, layer, region, pad, electrode, pattern, structure or process from another material, layer, region, pad, electrode, pattern, structure or process. Thus, "first", "second" and/or "third" may be used selectively or interchangeably for each material, layer, region, electrode, pad, pattern, structure or process respectively.

Figure 1:
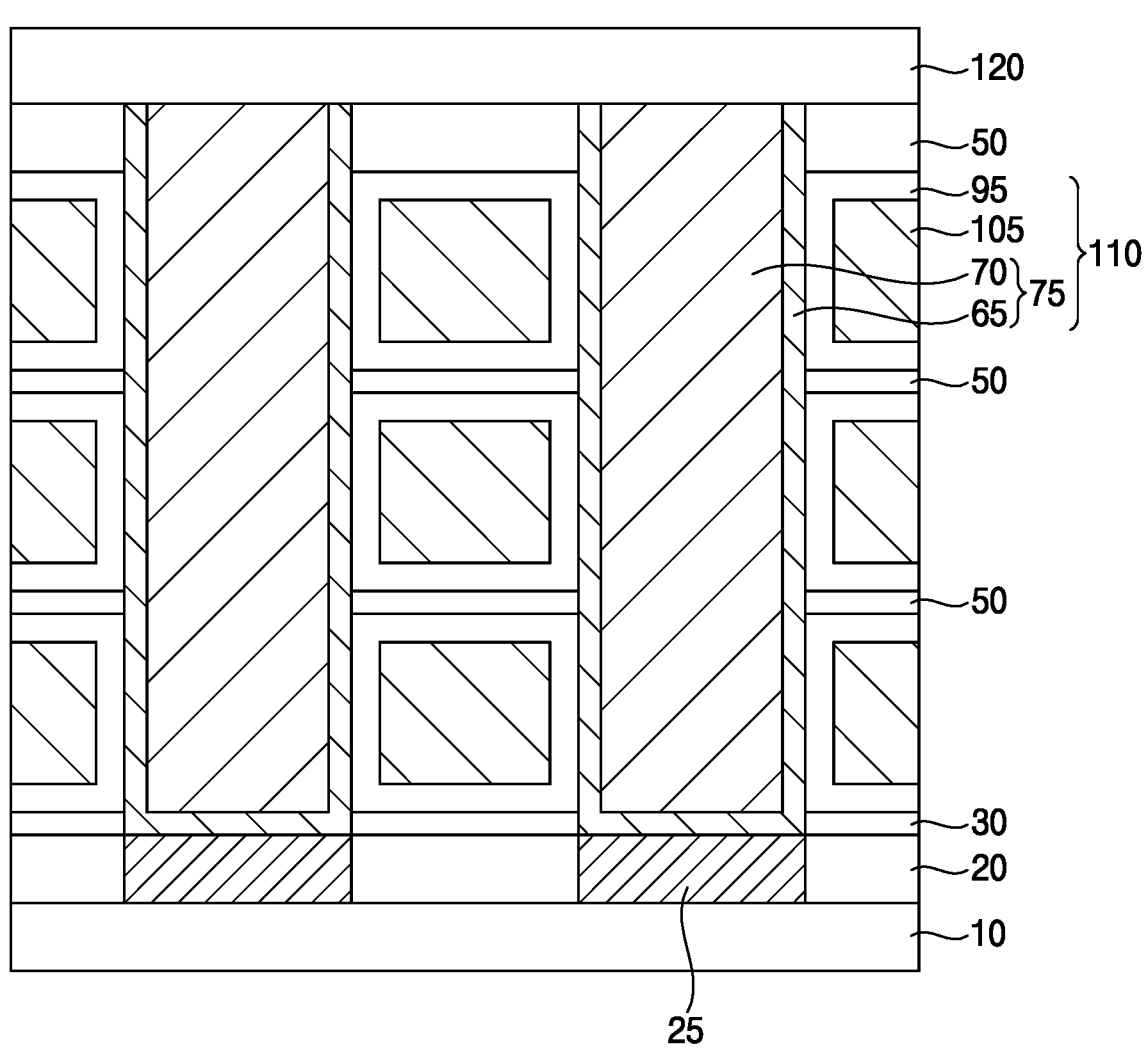
FIG. 1 is a cross-sectional view illustrating a first capacitor structure according to example embodiments.

FIG. 1 is a cross-sectional view illustrating a first capacitor structure according to example embodiments.

The first capacitor structure may include a first capacitor 110, a support layer 50 and an upper electrode plate 120 disposed on a substrate 10, and the first capacitor 110 may include a first lower electrode structure 75, a dielectric pattern 95 and a first upper electrode 105. Additionally, the first capacitor structure may further include a first insulating interlayer 20 containing a first conductive pattern 25 disposed on the substrate 10 and a first etch stop layer 30.

The substrate 10 may include silicon, germanium, silicon-germanium, or a III-V group compound semiconductor, such as GaP, GaAs, or GaSb. In example embodiments, the substrate 10 may be a silicon-on-insulator (SOI) substrate or a germanium-on-insulator (GOI) substrate.

The first conductive pattern 25 may include, e.g., contact plugs, landing pads, etc., and a plurality of first conductive patterns 25 may be spaced apart from each other in a horizontal direction that is substantially parallel to an upper surface of the substrate 10.

The first insulating interlayer 20 may include an oxide, e.g., silicon oxide or a low-k dielectric material (e.g., a material having a dielectric constant at least as low as that of silicon oxide), and the first conductive pattern 25 may include, e.g., a metal, a metal nitride, a metal silicide, doped polysilicon, etc.

The first etch stop layer 30 may be formed on the first insulating interlayer 20. The first etch stop layer 30 may include an insulating nitride, e.g., silicon nitride, silicon boronitride, silicon carbonitride, etc.

The first lower electrode structure 75 may extend through the first etch stop layer 30, and may contact an upper surface of a corresponding one of the first conductive patterns 25. The first lower electrode structure 75 may have a pillar shape extending in a vertical direction that is substantially perpendicular to the upper surface of the substrate 10. However, the inventive concept is not necessarily limited thereto, and the first lower electrode structure 75 may have a shape of, e.g., a cup or a hollow cylinder.

The first lower electrode structure 75 may include a second lower electrode 70, and a first lower electrode 65 at least partially covering a lower surface and a sidewall of the second lower electrode 70.

In example embodiments, the first lower electrode 65 may include an oxide of a metal having 4 valence electrons, and the oxide of the metal may be doped with a metal having 3, 5, 6, or 7 valence electrons.

The metal having 4 valence electrons may include a IV group element, e.g., hafnium, zirconium, etc.

The metal having 5 valence electrons may include a V group element, e.g., vanadium, niobium, tantalum, etc., the metal having 6 valence electrons may include a VI group element, e.g., chromium, molybdenum, tungsten, etc., and the metal having 7 valence electrons may include a VII group element, e.g., manganese, technetium, etc. The metal having 3 valence electrons may include a III group element or a XIII, e.g., yttrium, lanthanum, aluminum, etc.

Thus, the first lower electrode 65 may include, e.g., hafnium oxide or zirconium oxide doped with vanadium, chromium, manganese, yttrium, etc. The first lower electrode 65 may include the oxide of the metal having 4 valence electrons doped with the metal having 3, 5, 6, or 7 valence electrons so as to be electrically conductive, and thus may serve as an electrode.

The second lower electrode 70 may include a metal nitride, e.g., titanium nitride, tantalum nitride, etc.

If the first lower electrode structure 75 has a shape of a cup, the second electrode 70 may also have a shape of a cup, and a filling pattern including, e.g., a semiconductor material such as amorphous silicon or an insulating material may be formed in a space defined by the second lower electrode 70.

The support layer 50 may be formed on a sidewall of each of the first lower electrode structure 75, and may have a shape of a plate having lower and upper surfaces substantially parallel to an upper surface of the substrate 10. In example embodiments, a plurality of support layers 50 may be spaced apart from each other on the first etch stop layer 30 in a vertical direction that is substantially perpendicular to the upper surface of the substrate 10.

The support layer 50 may include an insulating nitride, e.g., silicon nitride, silicon boronitride, silicon carbonitride, etc.

The dielectric pattern 95 may contact a sidewall of each of the first lower electrode structures 75 between the first etch stop layer 30 and a lowermost one of the support layers 50 and between the support layers 50.

The dielectric pattern 95 may include a metal having 4 valence electrons, e.g., hafnium, zirconium, etc.

A surface of the first upper electrode 105 may be at least partially covered by the dielectric pattern 95, and the first upper electrode 105 may be formed between the first etch stop layer 30 and the lowermost one of the support layers 50 and between the support layers 50.

The first upper electrode 105 may include an oxide of a metal having 4 valence electrons, and the oxide of the metal may be doped with a metal having 3, 5, 6, or 7 valence electrons.

Thus, the first upper electrode 105 may include, e.g., hafnium oxide or zirconium oxide doped with vanadium, chromium, manganese, yttrium, etc. The first upper electrode 105 may include the oxide of the metal having 4 valence electrons doped with 3, 5, 6, or 7 valence electrons so as to be electrically conductive, and thus may serve as an electrode.

The first upper electrode 105 may include a material that is the same as or different from a material of the first lower electrode 65.

The upper electrode plate 120 may include, e.g., doped silicon-germanium.

As illustrated below with reference to FIGS. 2 to 6, an interface oxide layer might not be formed between the dielectric pattern 95 included in the first capacitor 110 and the first upper electrode 105. If the interface oxide layer is formed between the dielectric pattern 95 and the first upper electrode 105, the interface oxide layer may serve as a depletion layer so as to deteriorate the electric characteristics of the first capacitor 110. However, in example embodiments, no interface oxide layer might be formed between the dielectric pattern 95 and the first upper electrode 105 in the first capacitor 110, so that the first capacitor 110 may have enhanced electric characteristics.

FIGS. 2 to 6 are cross-sectional views illustrating a method of forming a first capacitor structure in accordance with example embodiments.

Figure 2:
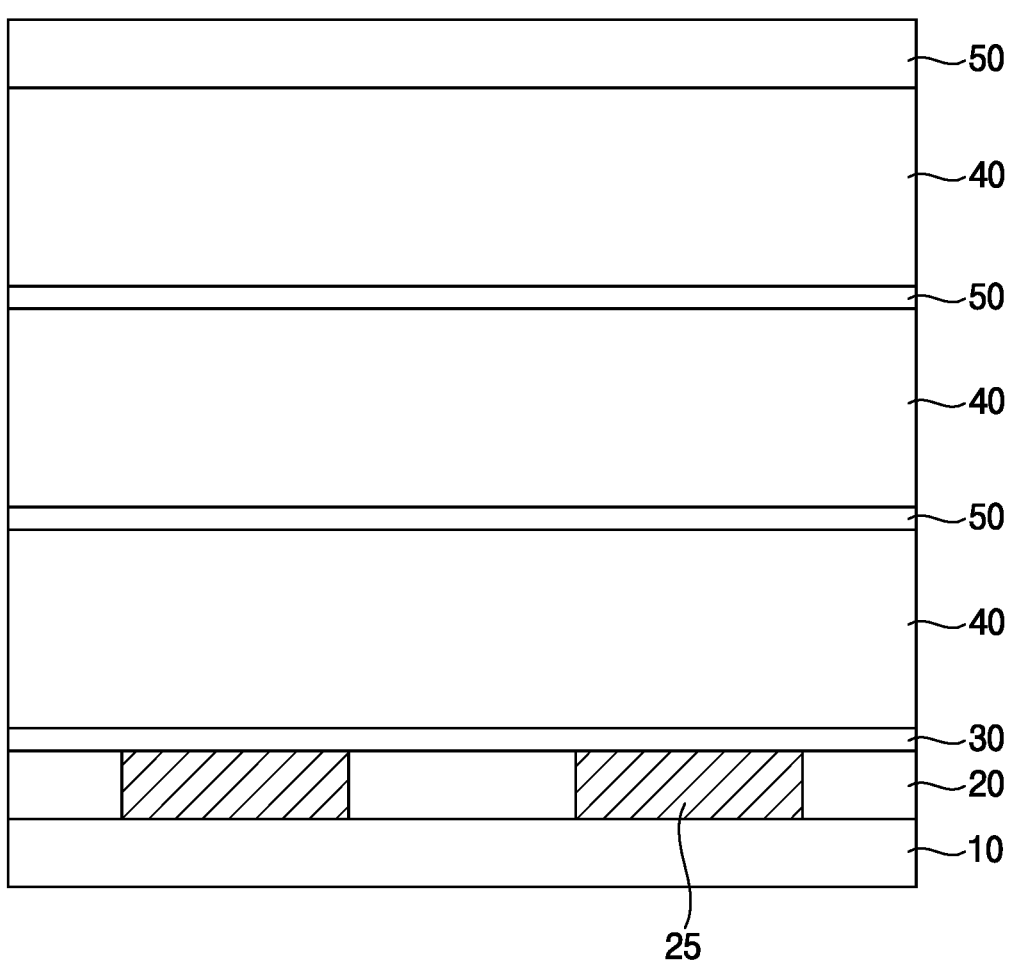
FIGS. 2 to 6 are cross-sectional views illustrating a method of forming a first capacitor structure in accordance with example embodiments.

Referring to FIG. 2, a first insulating interlayer 20 containing first and second conductive patterns 22 and 26 may be formed on a substrate 10, a first etch stop layer 30 may be formed on the first insulating interlayer 20 and the first conductive pattern 25, and a mold layer 40 and a support layer 50 may be alternately and repeatedly stacked on the first etch stop layer 30.

In example embodiments, a plurality of first conductive patterns 25 may be spaced apart from each other in a horizontal direction that is substantially parallel to an upper surface of the substrate 10.

The mold layer 40 may include an oxide, e.g., silicon oxide or a low-k dielectric material (e.g., a material having a dielectric constant at least as low as that of silicon oxide).

Figure 3:
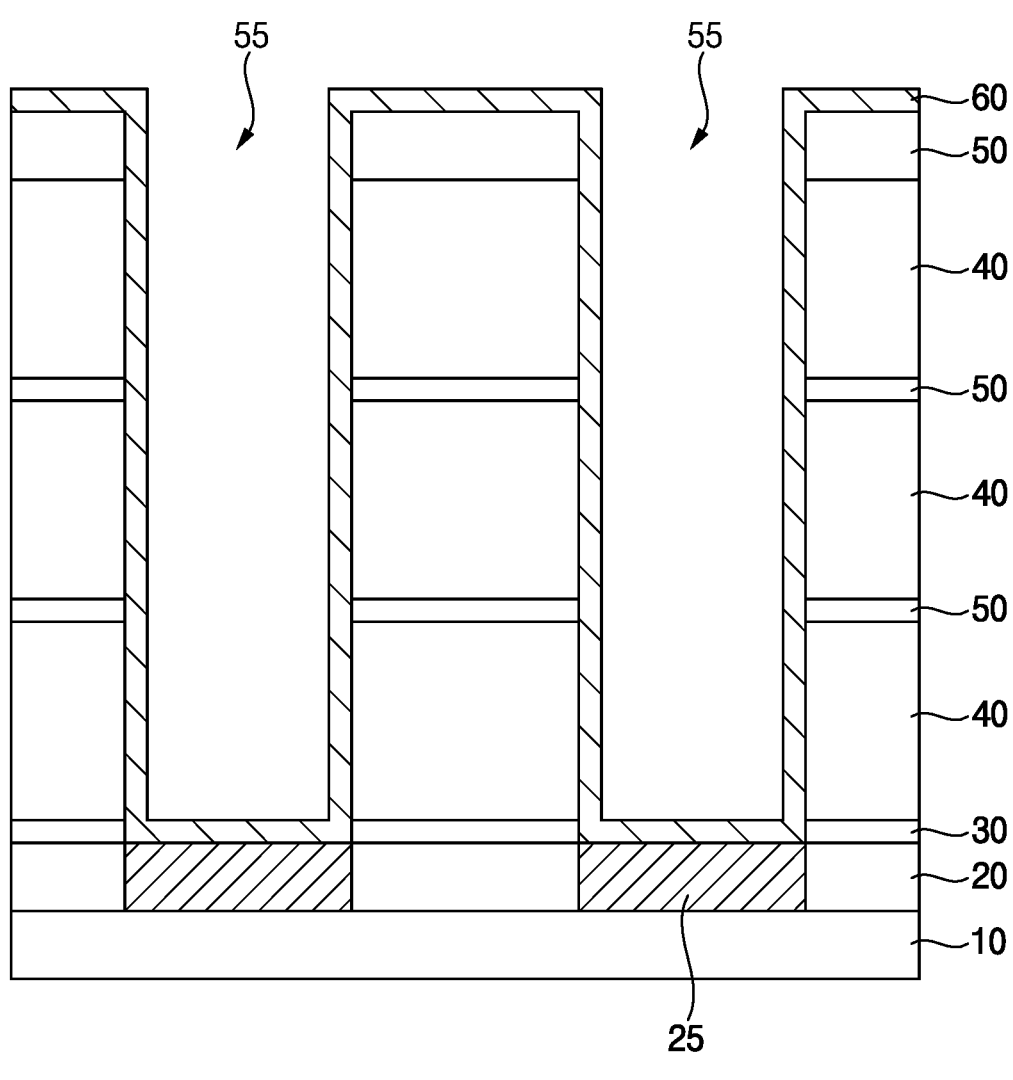

Referring to FIG. 3, a first opening 55 may be formed through the support layer 50, the mold layer 40 and the first etch stop layer 30 to expose an upper surface of each of the first conductive patterns 25.

A first lower electrode layer 60 may be formed on the upper surface of the first conductive pattern 25 exposed by the first opening 55, a sidewall of the first opening 55 and an upper surface of an uppermost one of the support layers 50.

In example embodiments, the first lower electrode layer 60 may be formed by a deposition process using a metal source gas of a metal having 4 valence electrons, e.g., hafnium or zirconium, an oxygen source gas, e.g., ozone plasma, and a metal source gas of a metal having 3, 5, 6, or 7 valence electrons.

Thus, the first lower electrode layer 60 may include an oxide of a metal having 4 valence electrons doped with a metal having 3, 5, 6, or 7 valence electrons.

Figure 4:
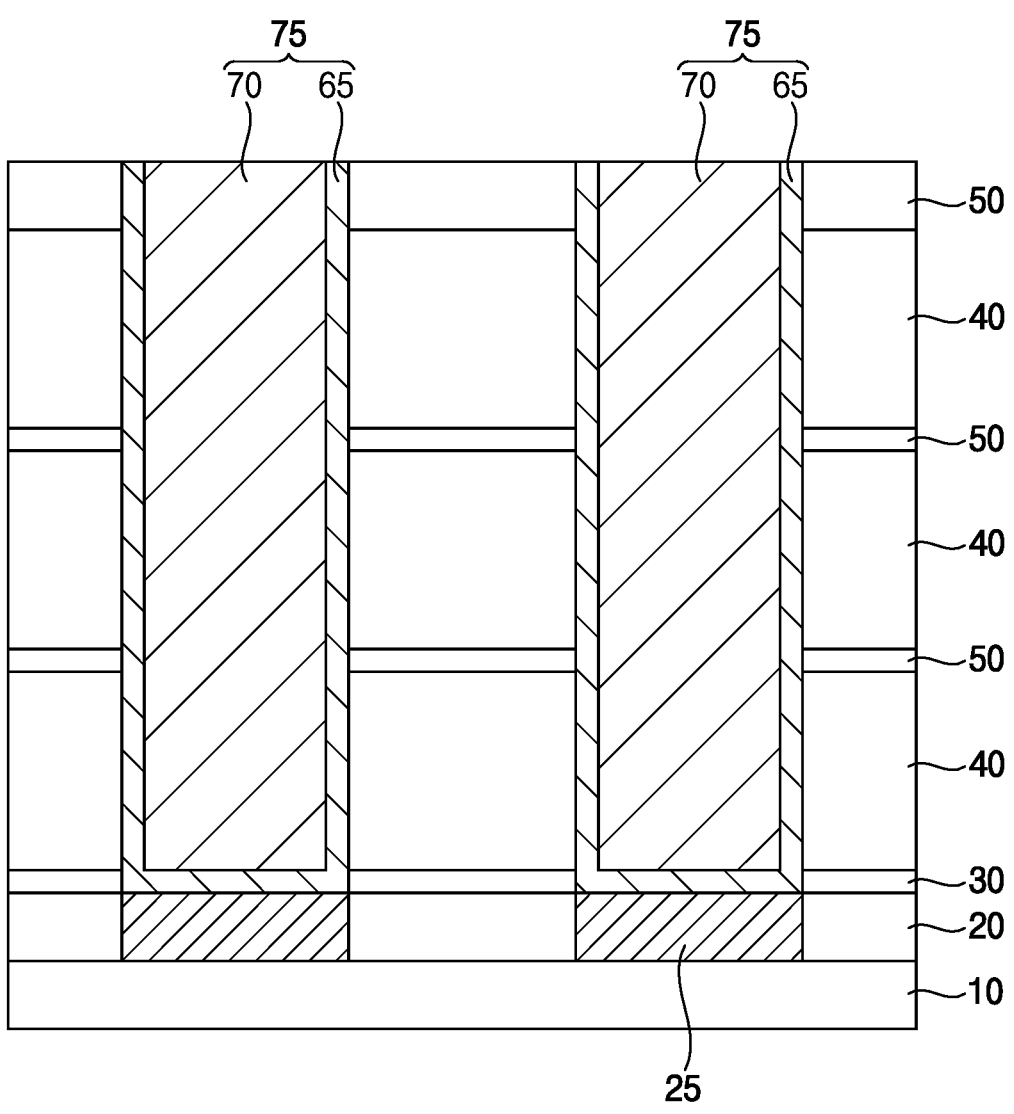

Referring to FIG. 4, a second lower electrode layer may be formed on the first lower electrode layer 60 to fill a remaining portion of the first opening 55, and the second lower electrode layer and the first lower electrode layer 60 may be planarized until the upper surface of the uppermost one of the support layers 50 is exposed.

Thus, a second lower electrode 70 and a first lower electrode 65 at least partially covering a sidewall and a lower surface of the second lower electrode 70 may be formed in each of the first openings 55, which may form a first lower electrode structure 75.

The planarization process may include a chemical mechanical polishing (CMP) process and/or an etch back process.

Figure 5:
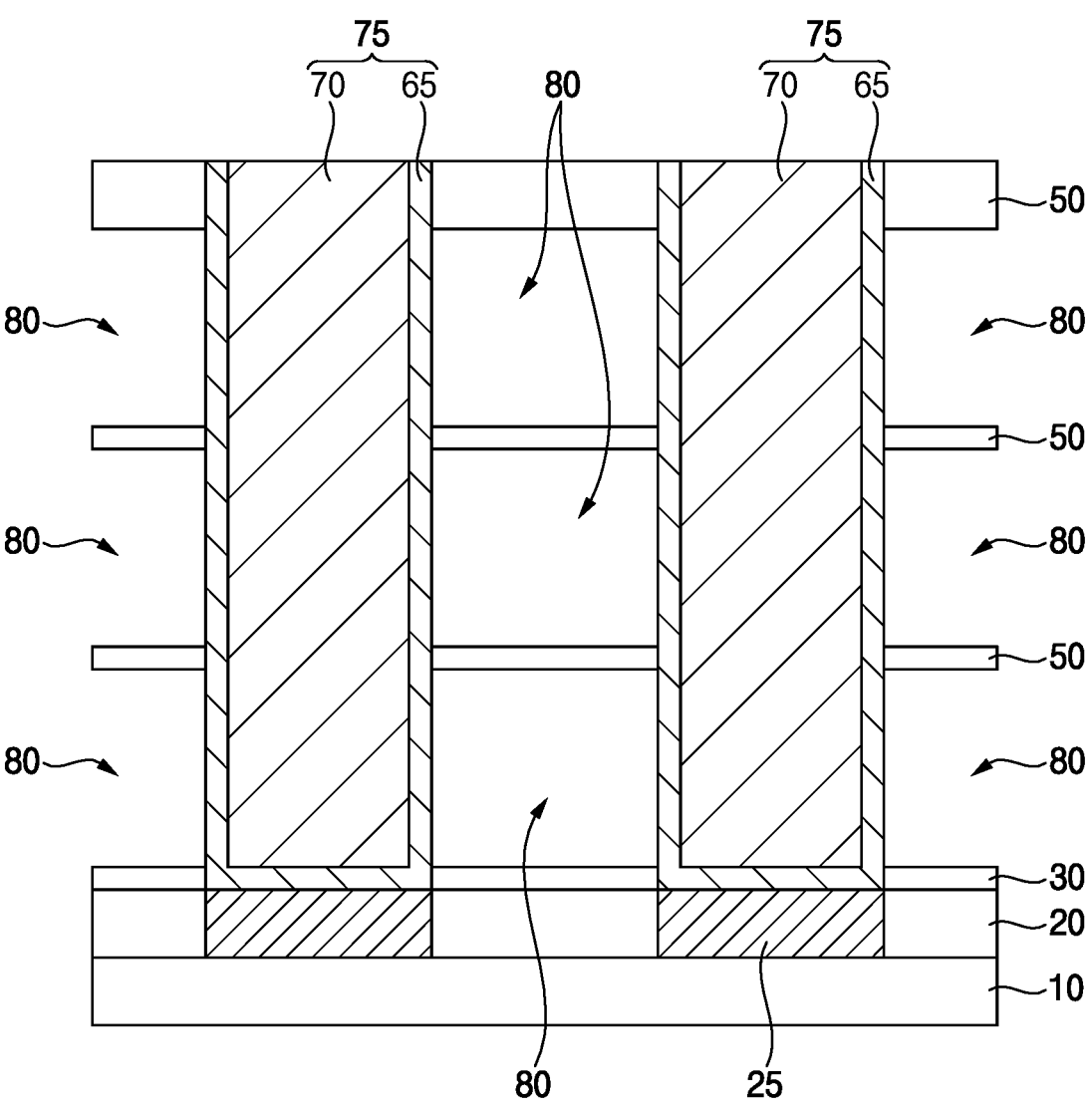

Referring to FIG. 5, the support layer 50 and the mold layer 40 may be partially removed to form a second opening exposing an upper surface of the first etch stop layer 30, and the mold layer 40 may be removed through the second opening.

In example embodiments, the mold layer 40 may be removed by, e.g., a wet etching process, and a third opening 80 may be formed to expose a sidewall of each of the first lower electrode structures 75. However, the support layers 50 may remain on the sidewall of each of the first lower electrode structures 75.

The upper surface of the first etch stop layer 30 and surfaces of the support layers 50 may also be exposed by the third opening 80.

Figure 6:
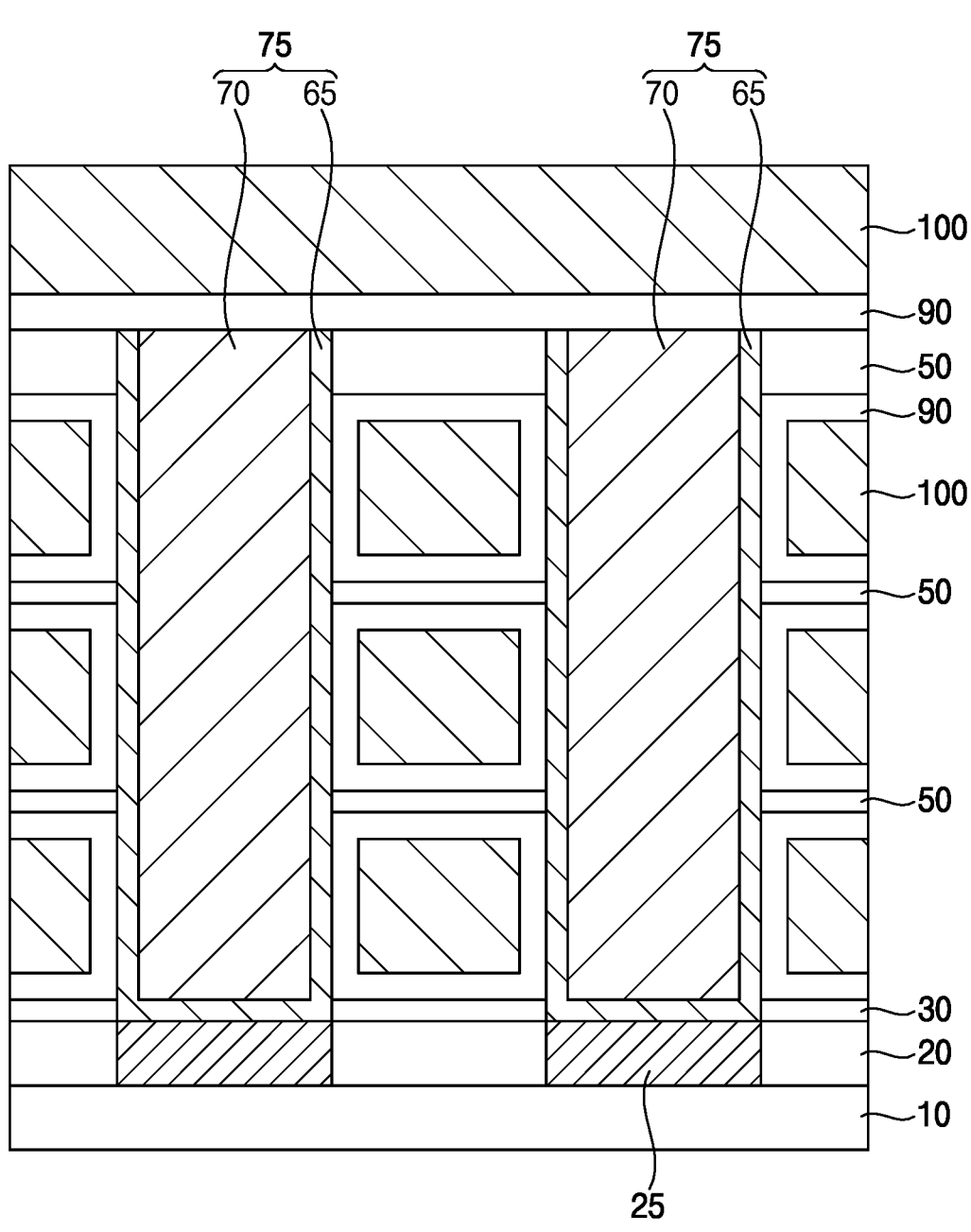

Referring to FIG. 6, a dielectric layer 90 may be formed on the sidewall of each of the first lower electrode structures 75, the upper surface of the first etch stop layer 30 and the surfaces of the support layers 50, and a first upper electrode layer 100 may be formed on the dielectric layer 90 to fill a remaining portion of the third opening 80.

The dielectric layer 90 and the first upper electrode layer 100 may also be stacked on the upper surface of the first lower electrode 75 and the upper surface of the uppermost one of the support layers 50.

The dielectric layer 90 may include an oxide of a metal having 4 valence electrons, and the first upper electrode layer 100 may include an oxide of a metal having 3, 5, 6, or 7 valence electrons as the first lower electrode 65.

In example embodiments, deposition processes for forming the dielectric layer 90 and the first upper electrode layer 100 may be formed in-situ in the same chamber. For example, the dielectric layer 90 may be formed by a first deposition process using a metal source gas of a metal having 4 valence electrons, e.g., hafnium or zirconium and an oxygen source gas, e.g., ozone plasma, and the first upper electrode layer 100 may be formed by a second deposition process using a metal source gas of a metal having 3, 5, 6, or 7 valence electrons in addition to the source gases used in the first deposition process.

Accordingly, an interface oxide layer, e.g., a natural oxide layer might not be formed between the dielectric layer 90 and the first upper electrode layer 100.

Referring to FIG. 1 again, portions of the dielectric layer 90 and the first upper electrode layer 100 on the upper surface of the first lower electrode structure 75 and the upper surface of the uppermost one of the support layers 50 may be removed.

Portions of the dielectric layer 90 and the first upper electrode layers 100 remaining in the third opening 80 may be referred to as a dielectric pattern 95 and a first upper electrode 105, respectively.

The first lower electrode structure 75 including the first and second lower electrodes 65 and 70, the dielectric pattern 95 and the first upper electrode 105 may collectively form a first capacitor 110.

An upper electrode plate 120 may be additionally formed on the first capacitor 110. The upper electrode plate 120 may include, e.g., doped silicon-germanium.

As illustrated above, the first and second deposition processes for forming the dielectric layer 90 and the first upper electrode layer 100 may be performed in-situ in the same chamber, and thus the interface oxide layer might not be formed between the dielectric layer 90 and the first upper electrode layer 100. If the interface oxide layer is formed between the dielectric layer 90 and the first upper electrode layer 100, the interface layer may serve as a depletion layer so as to deteriorate the electric characteristics of the first capacitor 110. However, in example embodiments, no interface oxide layer might be formed between the dielectric pattern 95 and the first upper electrode 105 in the first capacitor 110, so that the first capacitor 110 may have enhanced electric characteristics.

Figure 7:
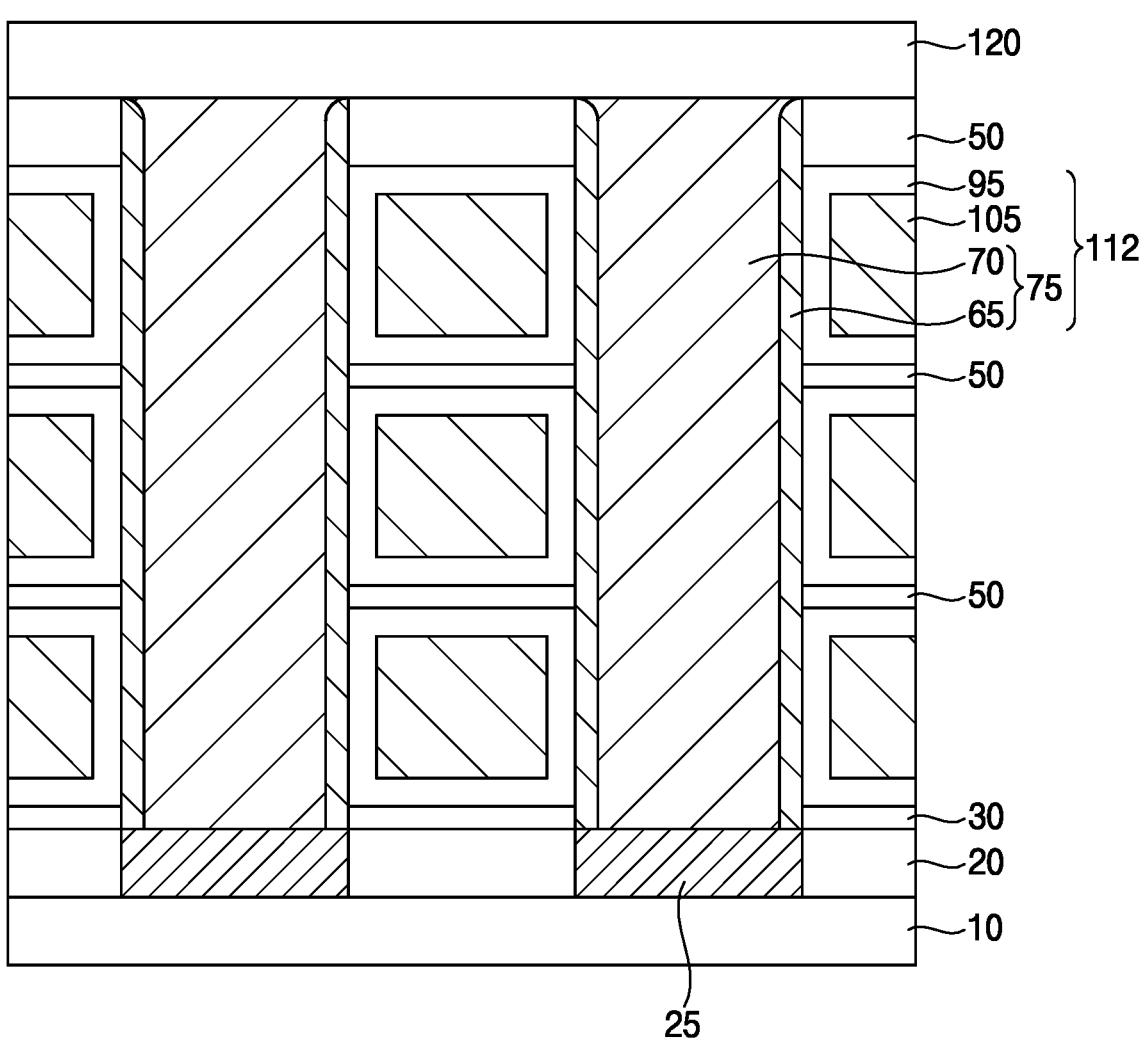
FIG. 7 is a cross-sectional view illustrating a second capacitor structure in accordance with example embodiments.

FIG. 7 is a cross-sectional view illustrating a second capacitor structure in accordance with example embodiments. The second capacitor structure may be substantially the same as or similar to the first capacitor structure, except for the first lower electrode structure, and thus to the extent that an element is not described in detail herein, that element may be assumed to be at least similar to a corresponding element that has been described elsewhere within the instant specification.

Referring to FIG. 7, the second capacitor structure may include a second capacitor 112, and the first lower electrode 65 included in the second capacitor 112 may at least partially cover a sidewall of the second lower electrode 70, however, might not cover a lower surface of the second lower electrode 70.

Thus, the second lower electrode 70, instead of the first lower electrode 65, may contact the upper surface of each of the first conductive patterns 25.

The first lower electrode 65 may be formed by forming the first lower electrode layer 60 by the process illustrated with reference to FIG. 3, and anisotropically etching the first lower electrode layer 60 to remove a portion of the first lower electrode layer 60 on the upper surface of the first conductive pattern 25 and the upper surface of the uppermost one of the support layers 50, so as to remain only on the sidewall of the first opening 55.

Accordingly, an upper surface of the first conductive pattern 25 may be exposed, and the second lower electrode 70 formed by the process illustrated with reference to FIG. 4 may contact the exposed upper surface of the first conductive pattern 25.

Figure 8:
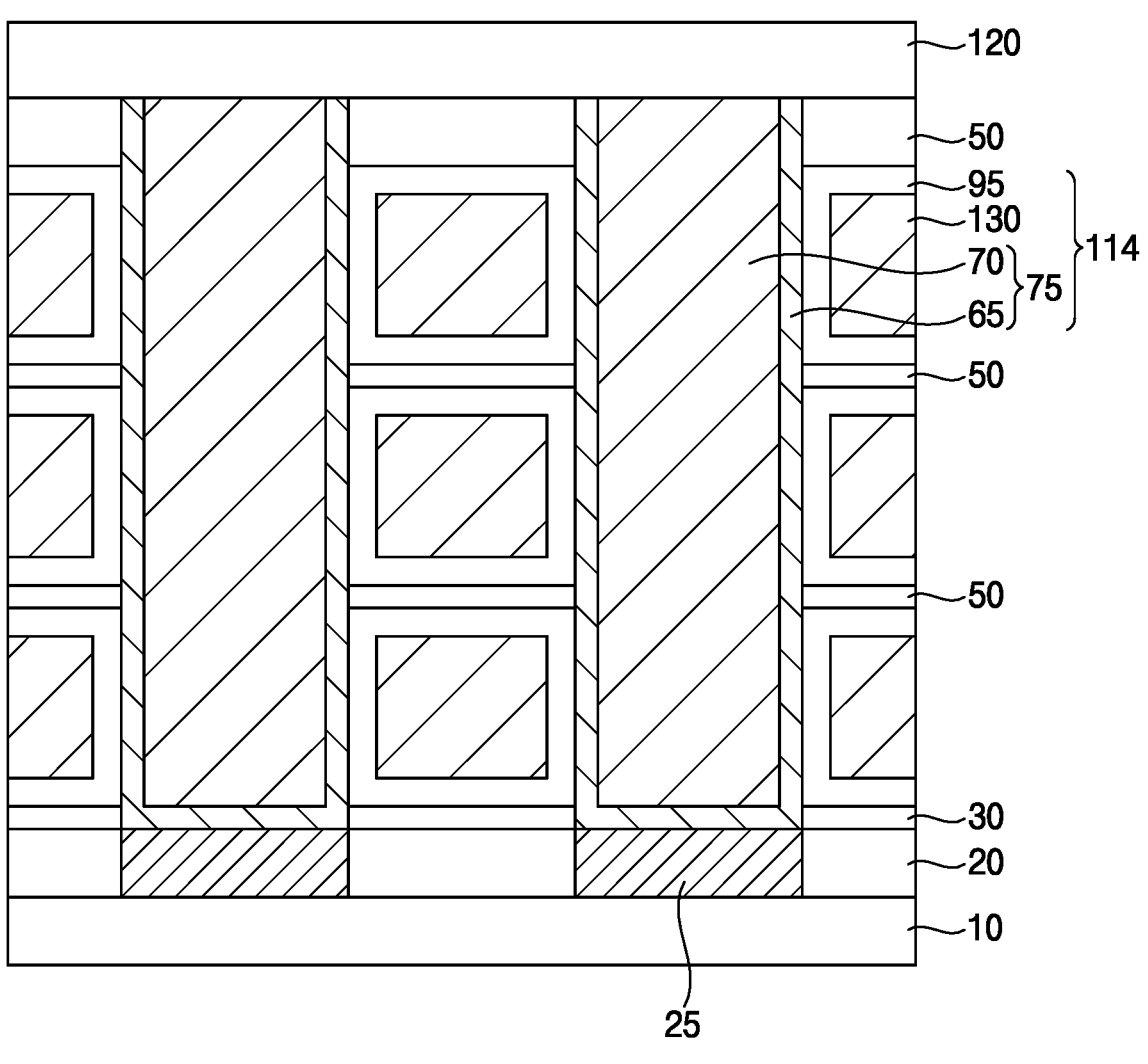
FIG. 8 is a cross-sectional view illustrating a third capacitor structure in accordance with example embodiments.

FIG. 8 is a cross-sectional view illustrating a third capacitor structure in accordance with example embodiments. The third capacitor structure may be substantially the same as or similar to the first capacitor structure, except for including a second upper electrode instead of the first upper electrode, and thus to the extent that an element is not described in detail herein, that element may be assumed to be at least similar to a corresponding element that has been described elsewhere within the instant specification.

Referring to FIG. 8, the third capacitor structure may include a third capacitor 114, and the second upper electrode 130 included in the third capacitor 114 may include a metal nitride, e.g., titanium nitride, tantalum nitride, etc., unlike the first upper electrode 105.

Figure 9:
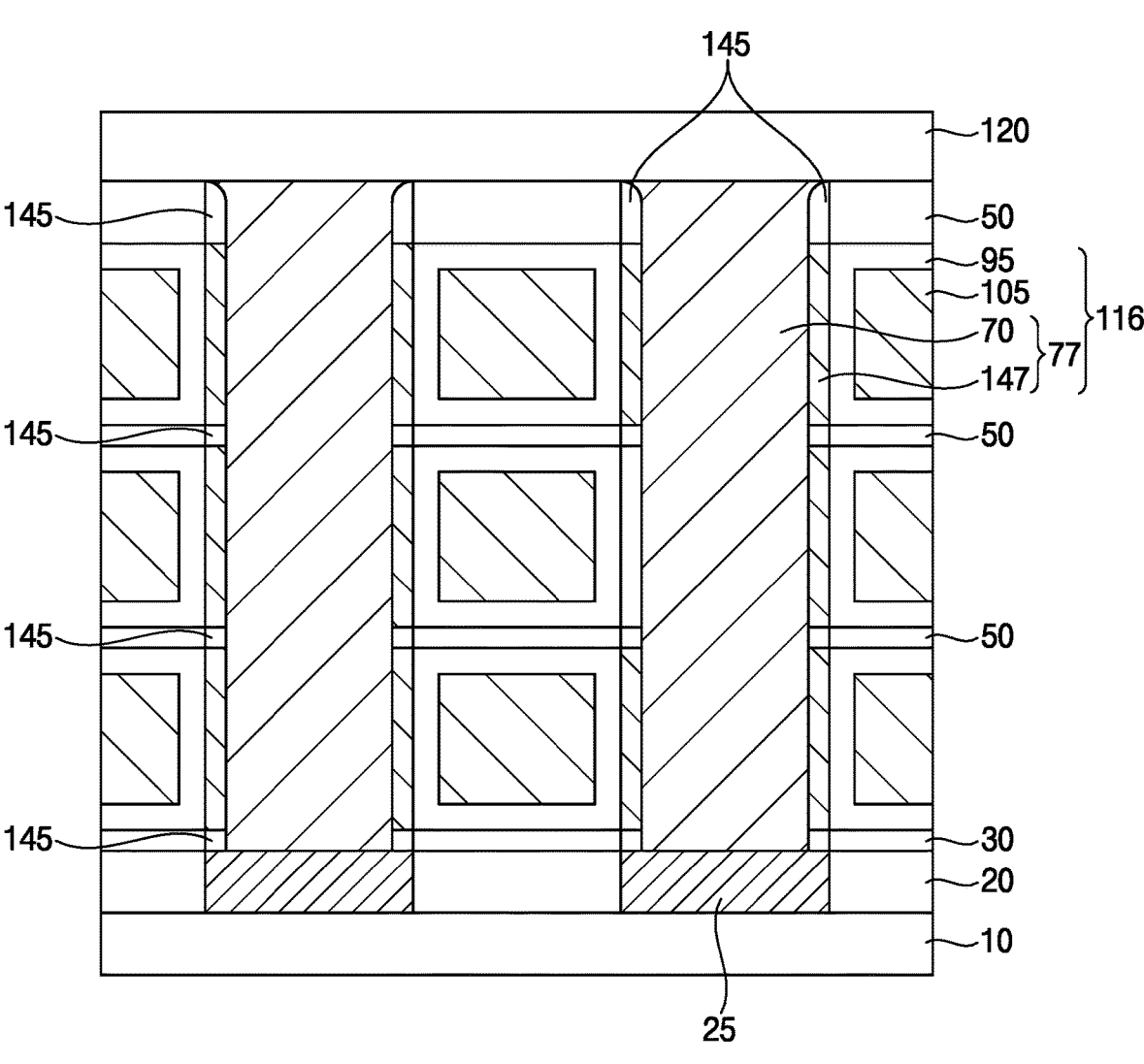
FIG. 9 is a cross-sectional view illustrating a fourth capacitor structure in accordance with example embodiments.

FIG. 9 is a cross-sectional view illustrating a fourth capacitor structure in accordance with example embodiments. The fourth capacitor structure may be substantially the same as or similar to the first capacitor structure, except for including a second lower electrode structure instead of the first lower electrode structure, and thus to the extent that an element is not described in detail herein, that element may be assumed to be at least similar to a corresponding element that has been described elsewhere within the instant specification.

Referring to FIG. 9, the fourth capacitor structure may include a fourth capacitor 116, and the fourth capacitor 116 may include a second lower electrode structure 77 instead of the first lower electrode structure 75.

The second lower electrode structure 77 may include the second lower electrode 70 and a third lower electrode 147 on the sidewall of the second lower electrode 70, and a first insulation pattern 145 may be further formed on a sidewall of the second lower electrode 70.

The second lower electrode 70 may contact the upper surface of the first conductive pattern 25, for example, an upper surface of a central portion of the first conductive pattern 25.

The third lower electrode 147 may be formed on a sidewall of a portion of the second lower electrode 70 facing the dielectric pattern 95, and thus a plurality of third lower electrodes 147 may be spaced apart from each other in the vertical direction. The first insulation pattern 145 may contact an upper surface of an edge portion of the first conductive pattern 25, and may be formed on a portion of the second lower electrode 70 between the third lower electrodes 147.

In example embodiments, the third lower electrode 147 may include an oxynitride of a metal having 4 valence electrons, and a metal having 3, 5, 6, or 7 valence electrons may be doped into the oxy nitride of the metal. Thus, the third lower electrode 147 may include, e.g., hafnium oxynitride or zirconium oxynitride doped with vanadium, chromium, manganese, yttrium, etc. The third lower electrode 147 may include the oxynitride of the metal having 4 valence electrons doped with the metal having 3, 5, 6, or 7 valence electrons so as to be electrically conductive, and thus may serve as an electrode.

The first insulation pattern 145 may include a nitride of a metal having 4 valence electrons, e.g., hafnium nitride, zirconium nitride, etc.

As illustrated below with reference to FIGS. 10 to 12, the dielectric pattern 95 contacting a sidewall of the third lower electrode 147 including the oxynitride of the metal having 4 valence electrons may include an oxide of a metal having 4 valence electrons, which may be similar to the third lower electrode 147, so as to have increased crystallinity.

Figure 10:
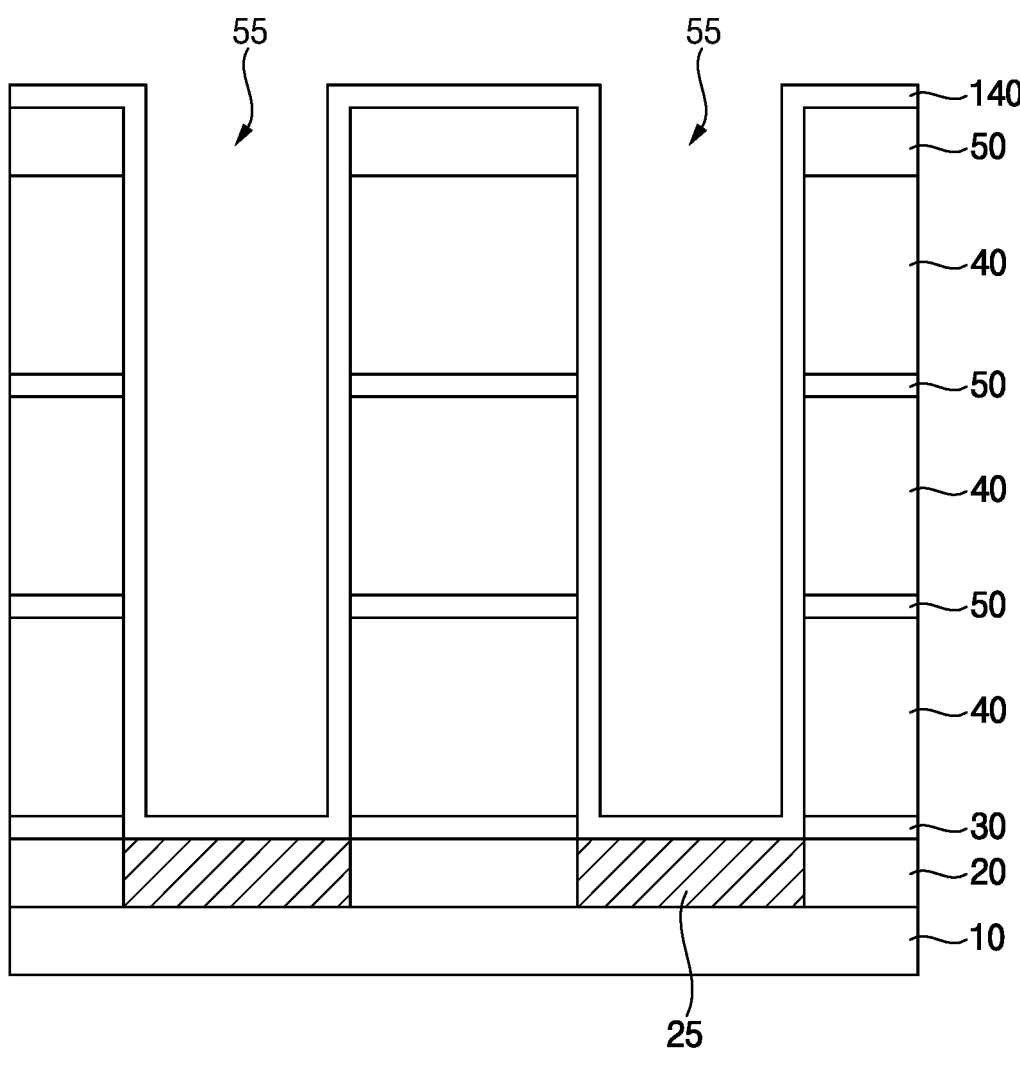
FIGS. 10 to 12 are cross-sectional views illustrating a method of forming a fourth capacitor structure in accordance with example embodiments.
Figure 11:
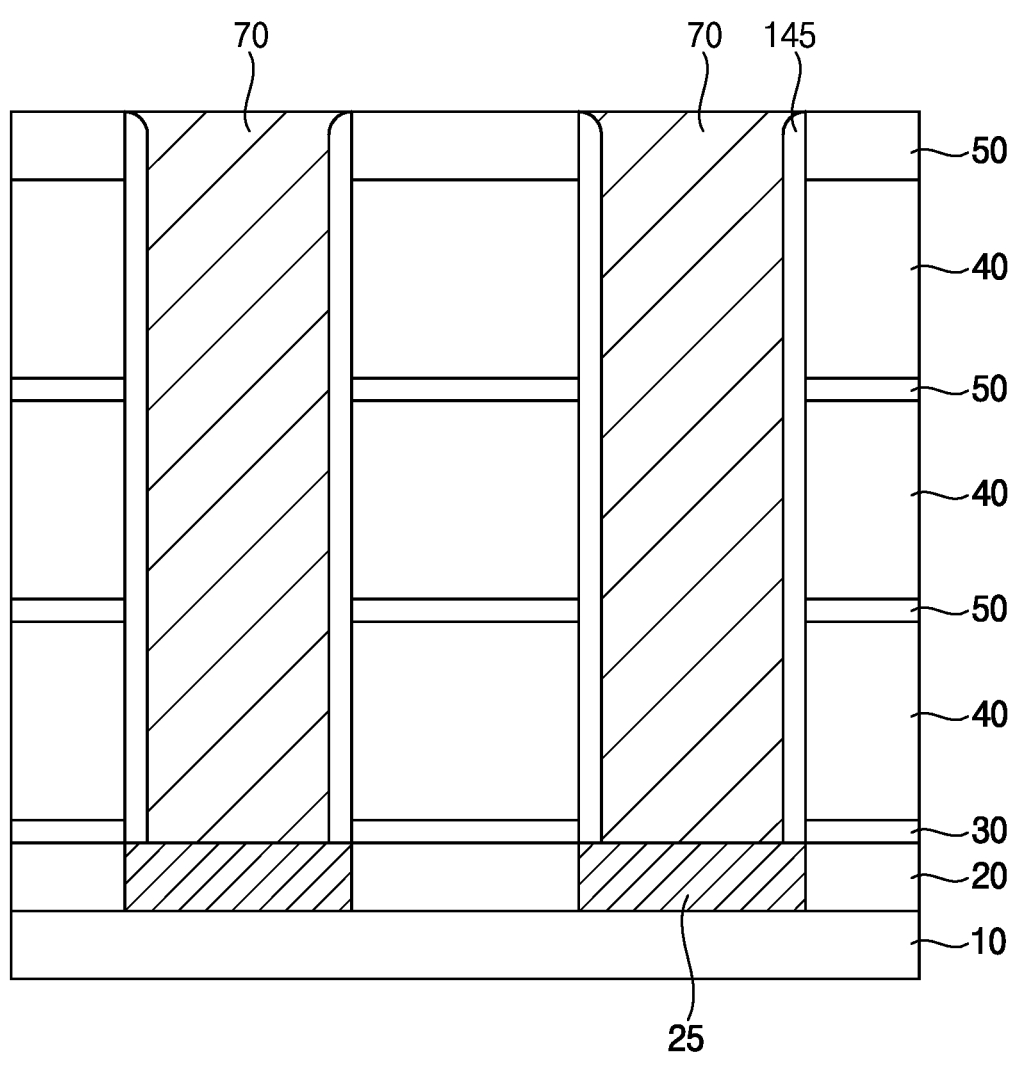
Figure 12:
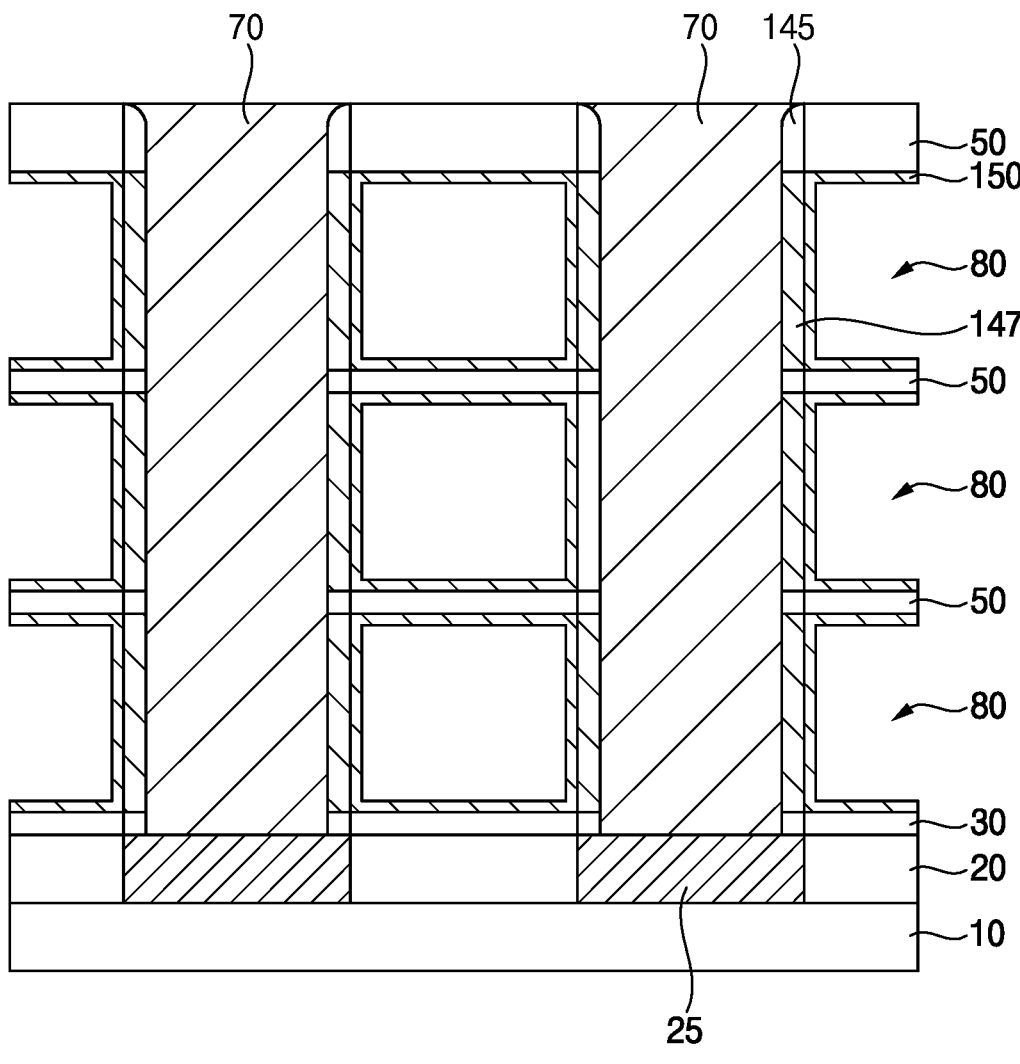

FIGS. 10 to 12 are cross-sectional views illustrating a method of forming a fourth capacitor structure in accordance with example embodiments. This method may include processes substantially the same as or similar to those illustrated with reference to FIGS. 2 to 6, and thus to the extent that a process is not described in detail herein, that process may be assumed to be at least similar to a corresponding process that has been described elsewhere within the instant specification.

Referring to FIG. 10, processes substantially the same as or similar to those illustrated with reference to FIGS. 2 and 3 may be performed.

However, a third preliminary lower electrode layer 140, instead of the first lower electrode layer 60, may be formed on the upper surface of the first conductive pattern 25, the sidewall of the first opening 55 and the upper surface of the uppermost one of the support layers 50.

In example embodiments, the third preliminary lower electrode layer 140 may be formed by a deposition process using a metal source gas of a metal having 4 valence electrons, e.g., hafnium or zirconium and a nitrogen source gas.

Thus, the third preliminary lower electrode layer 140 may include a nitride of a metal having 4 valence electrons, e.g., hafnium nitride, zirconium nitride, etc.

Referring to FIG. 11, the third preliminary lower electrode layer 140 may be anisotropically etched to form a third preliminary lower electrode 145 on the sidewall of the first opening 55, and thus the upper surface of the first conductive pattern 25 may be exposed.

Processes substantially the same as or similar to those illustrated with reference to FIG. 4 may be performed to form the second lower electrode 70 filling a remaining portion of the first opening 55 and contacting the upper surface of the first conductive pattern 25.

Referring to FIG. 12 processes substantially the same as or similar to those illustrated with reference to FIG. 5 may be performed to form the third opening 80.

In example embodiments, the mold layer 40 may be removed by, e.g., a wet etching process. During the wet etching process, the third preliminary lower electrode 145 including a metal nitride may have a high etching selectivity with respect to the mold layer 40 including silicon oxide, and thus might not be removed.

A first sacrificial layer 150 may be formed on an outer sidewall of the third preliminary lower electrode 145, the upper surface of the first etch stop layer 30 and the surfaces of the support layers 50 exposed by the third opening 80.

In example embodiments, the first sacrificial layer 150 may be formed by a deposition process using a metal source gas of a metal having 4 valence electrons, e.g., hafnium or zirconium, an oxygen gas, e.g., ozone plasma, and a metal source gas of a metal having 3, 5, 6 or 7 valence electrons.

Thus, the first sacrificial layer 150 may include an oxide of a metal having 4 valence electrons doped with 3, 5, 6, or 7 valence electrons.

In example embodiments, during the process of forming the first sacrificial layer 150, or by performing an additional annealing process, the metal having 3, 5, 6, or 7 valence electrons of the first sacrificial layer 150 may diffuse into a portion of the third preliminary lower electrode 145 contacting the first sacrificial layer 150, and oxygen may diffuse into the portion of the third preliminary lower electrode 145 from the oxygen source gas, e.g., ozone plasma used in the process of forming the first sacrificial layer 150 so that the portion of the third preliminary lower electrode 145 may be oxidized.

Accordingly, the portion of the third preliminary lower electrode 145 contacting the first sacrificial layer 150 may be converted into a third lower electrode 147 including an oxynitride of a metal having 4 valence electrons doped with a metal having 3, 5, 6, or 7 valence electrons.

Hereinafter, a portion of the third preliminary lower electrode 145 including the initial element may be referred to as a first insulation pattern 145.

Referring to FIG. 9 again, the first sacrificial layer 150 may be removed to expose an outer sidewall of the third lower electrode 147, the upper surface of the first etch stop layer 30 and the surfaces of the support layers 50, and processes substantially the same as or similar to those illustrated with reference to FIG. 6 and FIG. 1 may be performed.

Thus, the dielectric layer 90 may be formed on the outer sidewall of the third lower electrode 147, the upper surface of the first etch stop layer 30 and the surfaces of the support layers 50, the first upper electrode layer 100 may be formed on the dielectric layer 90 to fill a remaining portion of the third opening 80, and the portions of the dielectric layer 90 and the first upper electrode layer 100 on the upper surface of the first lower electrode structure 75 and the upper surface of the uppermost one of the support layers 50 may be removed to form the dielectric pattern 95 and the first upper electrode 105, respectively. The second lower electrode 70, the third lower electrode 147, the dielectric pattern 95 and the first upper electrode 105 may collectively form a fourth capacitor 116, and the second and third lower electrodes 70 and 147 may form a second lower electrode structure 77.

The dielectric layer 90 may include an oxide of a metal having 4 valence electrons, e.g., hafnium or zirconium, the first upper electrode layer 100 may include an oxide of a metal having 3, 5, 6, or 7 valence electrons.

The dielectric layer 90 contacting the sidewall of the third lower electrode 147 including the oxynitride of the metal having 4 valence electrons may include the oxide of the metal having 4 valence electrons, so as to have increased crystallinity.

Additionally, the dielectric layer 90 and the first upper electrode layer 100 may be formed in-situ in the same chamber so that no interface oxide layer might be formed between the dielectric layer 90 and the first upper electrode layer 100, Accordingly, the fourth capacitor structure may have enhanced electric characteristics.

Figure 13:
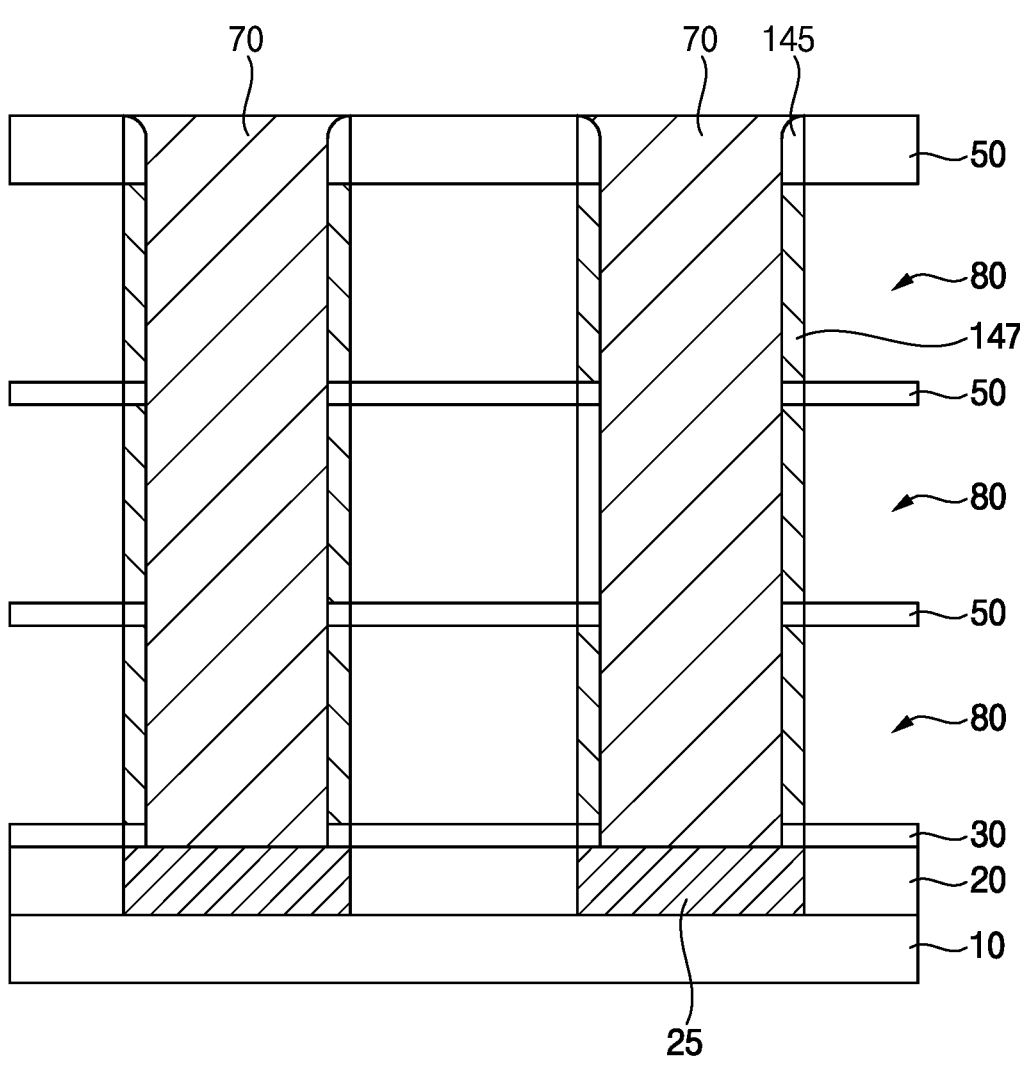
FIG. 13 is a cross-sectional view illustrating a method of forming the fourth capacitor structure in accordance with example embodiments.

FIG. 13 is a cross-sectional view illustrating a method of forming the fourth capacitor structure in accordance with example embodiments. This method may include processes substantially the same as or similar to those illustrated with reference to FIGS. 10 to 12 and FIG. 9, and thus to the extent that a process is not described in detail herein, that process may be assumed to be at least similar to a corresponding process that has been described elsewhere within the instant specification.

First, processes substantially the same as or similar to those grated with reference to FIGS. 10 and 11 may be performed.

Referring to FIG. 13, processes substantially the same as or similar to those illustrated with reference to FIG. 5 may be performed to form the third opening 80, and a metal having 3, 5, 6, or 7 valence electrons may be doped into a portion of the third preliminary lower electrode 145 exposed by the third opening 80, and an oxygen source gas, e.g., ozone plasma may also be used to oxidize the portion of the third preliminary lower electrode 145.

Thus, the portion of the third preliminary lower electrode 145 exposed by the third opening 80 may be converted into the third lower electrode 147 including an oxynitride of a metal having 4 valence electrons doped with a metal having 3, 5, 6, or 7 valence electrons.

Processes substantially the same as or similar to those illustrated with reference to FIG. 9 may be performed to form the fourth capacitor 116.

Figure 14:
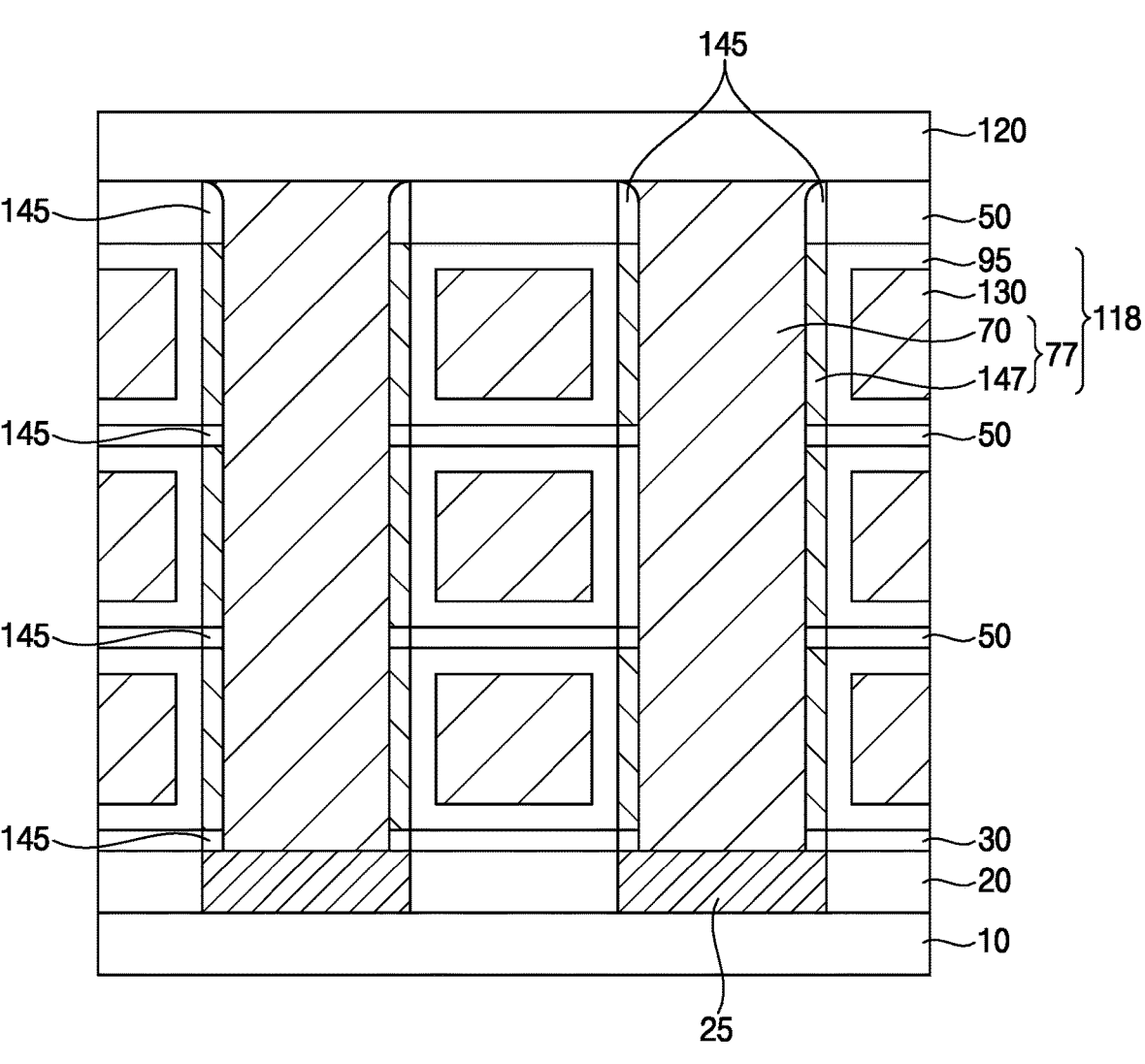
FIG. 14 is a cross-sectional view illustrating a fifth capacitor structure in accordance with example embodiments.

FIG. 14 is a cross-sectional view illustrating a fifth capacitor structure in accordance with example embodiments. The fifth capacitor structure may be substantially the same as or similar to the first capacitor structure, except for including a second upper electrode instead of the first upper electrode, and thus to the extent that an element is not described in detail herein, that element may be assumed to be at least similar to a corresponding element that has been described elsewhere within the instant specification.

Referring to FIG. 14, the fifth capacitor structure may include a fifth capacitor 118, and the second upper electrode 130 included in the fifth capacitor 118 may include a metal nitride, e.g., titanium nitride, tantalum nitride, etc., unlike the first upper electrode 105.

Figure 15:
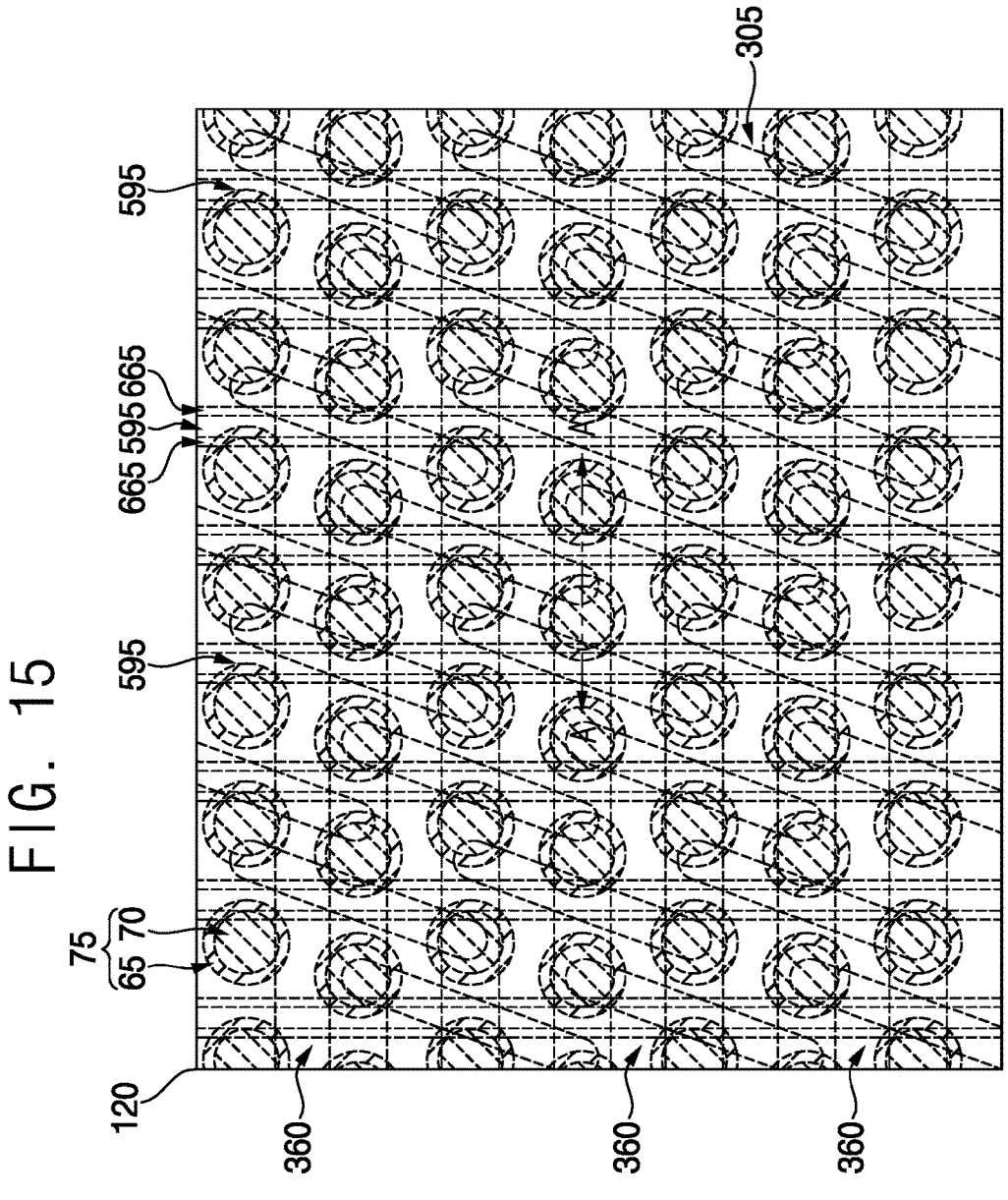
FIG. 15 is a plan view illustrating a semiconductor device in accordance with example embodiments.
Figure 16:
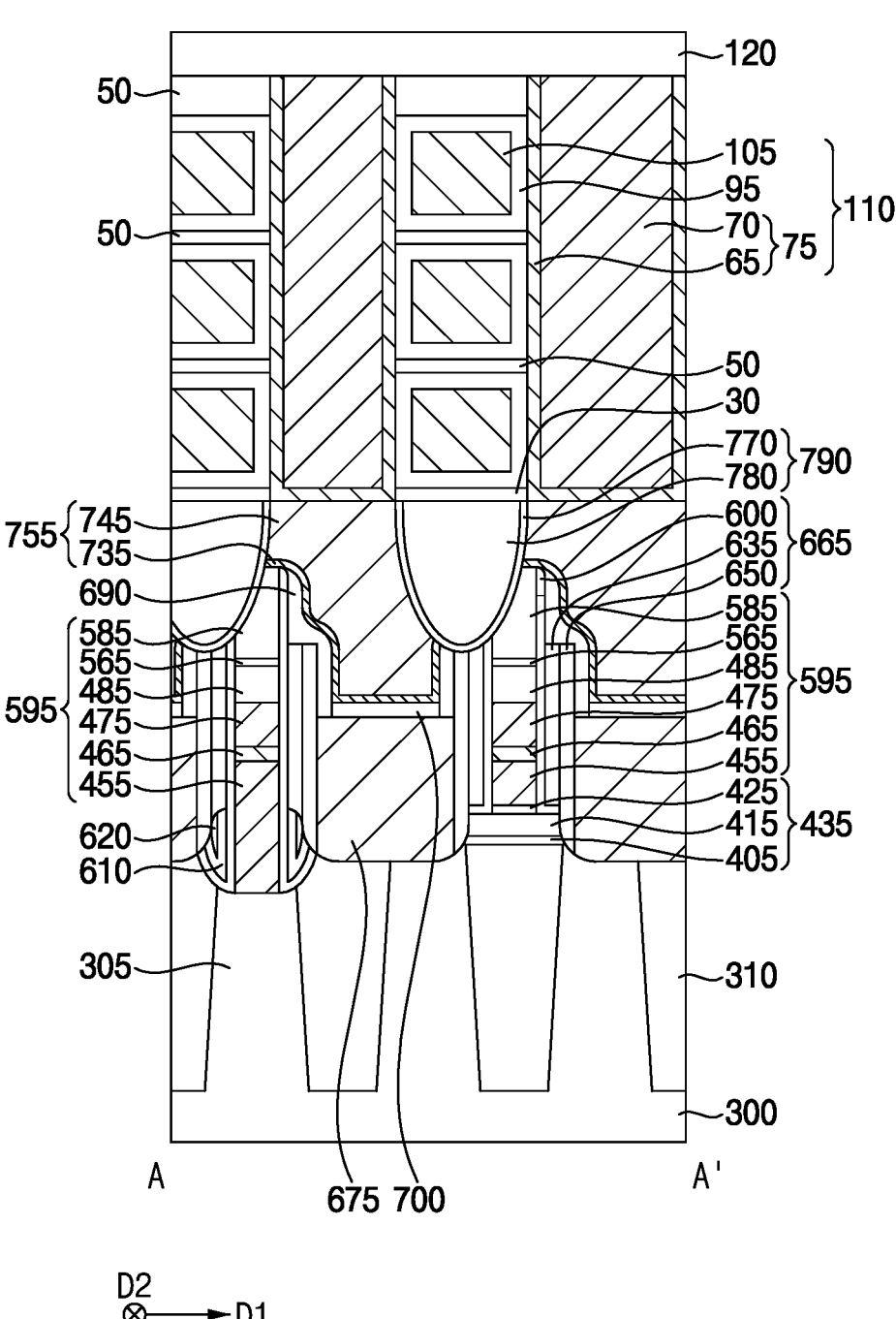
FIG. 16 is a cross-sectional view taken along line A-A' of FIG. 15.

FIG. 15 is a plan view illustrating a semiconductor device in accordance with example embodiments, and FIG. 16 is a cross-sectional view taken along line A-A' of FIG. 15.

This semiconductor device may be an application of the first capacitor structure illustrated with reference to FIG. 1 to a DRAM device, and thus the first capacitor structure may be assumed to be at least similar to other first capacitor structures described herein. However, the semiconductor device may include one of the second to fifth capacitor structures shown in FIGS. 7, 8, 9 and 14 instead of the first capacitor structure.

Hereinafter, two directions among horizontal directions that are substantially parallel to an upper surface of a substrate 300, which may be substantially orthogonal to each other, may be referred as first and second directions D1 and D2, respectively, and a direction among the horizontal directions, which may have an acute angle with respect to each of the first and second directions D1 and D2, may be referred to as a third direction D3. Additionally, a direction that is substantially perpendicular to the upper surface of the substrate 300 may be referred to as a vertical direction.

Referring to FIGS. 15 and 16, the semiconductor device may include an active pattern 305, a gate structure 360, a first bit line structure 595, a contact plug structure, and the first capacitor structure disposed on the substrate 300.

The semiconductor device may further include an isolation pattern 310, a spacer structure 665, a fourth spacer 690, a second capping pattern 685, first and second insulation pattern structures 435 and 790, fifth and sixth insulation patterns 610 and 620, and a metal silicide pattern 700.

The active pattern 305 may extend in the third direction D3, and a plurality of active patterns 305 may be spaced apart from each other in the first and second directions D1 and D2. A sidewall of the active pattern 305 may be at least partially covered by the isolation pattern 310. The active pattern 305 may include substantially the same material as the substrate 300, and the isolation pattern 310 may include an oxide, e.g., silicon oxide.

Figure 18:
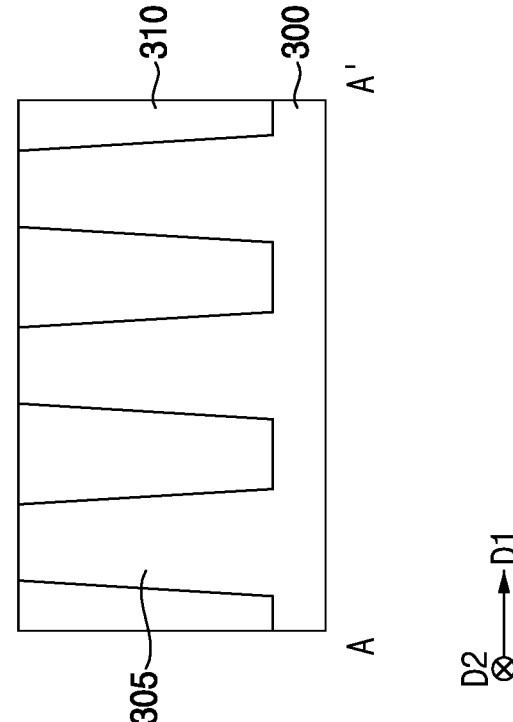

Referring to FIGS. 15 and 16 together with FIG. 18, the gate structure 360 may be formed in a second recess extending in the first direction D1 through upper portions of the active pattern 305 and the isolation pattern 310. The gate structure 360 may include a first gate insulation pattern 330 disposed on a bottom and a sidewall of the second recess, a first gate electrode 340 disposed on a portion of the first gate insulation pattern 330 on the bottom and a lower sidewall of the second recess, and a gate mask 350 disposed on the first gate electrode 340 and filling an upper portion of the second recess.

The first gate insulation pattern 330 may include an oxide, e.g., silicon oxide, the first gate electrode 340 may include, e.g., a metal, a metal nitride, a metal silicide, etc., and the gate mask 350 may include an insulating nitride, e.g., silicon nitride.

In example embodiments, the gate structure 360 may extend in the first direction D1, and a plurality of gate structures 360 may be spaced apart from each other in the second direction D2.

Figure 19:
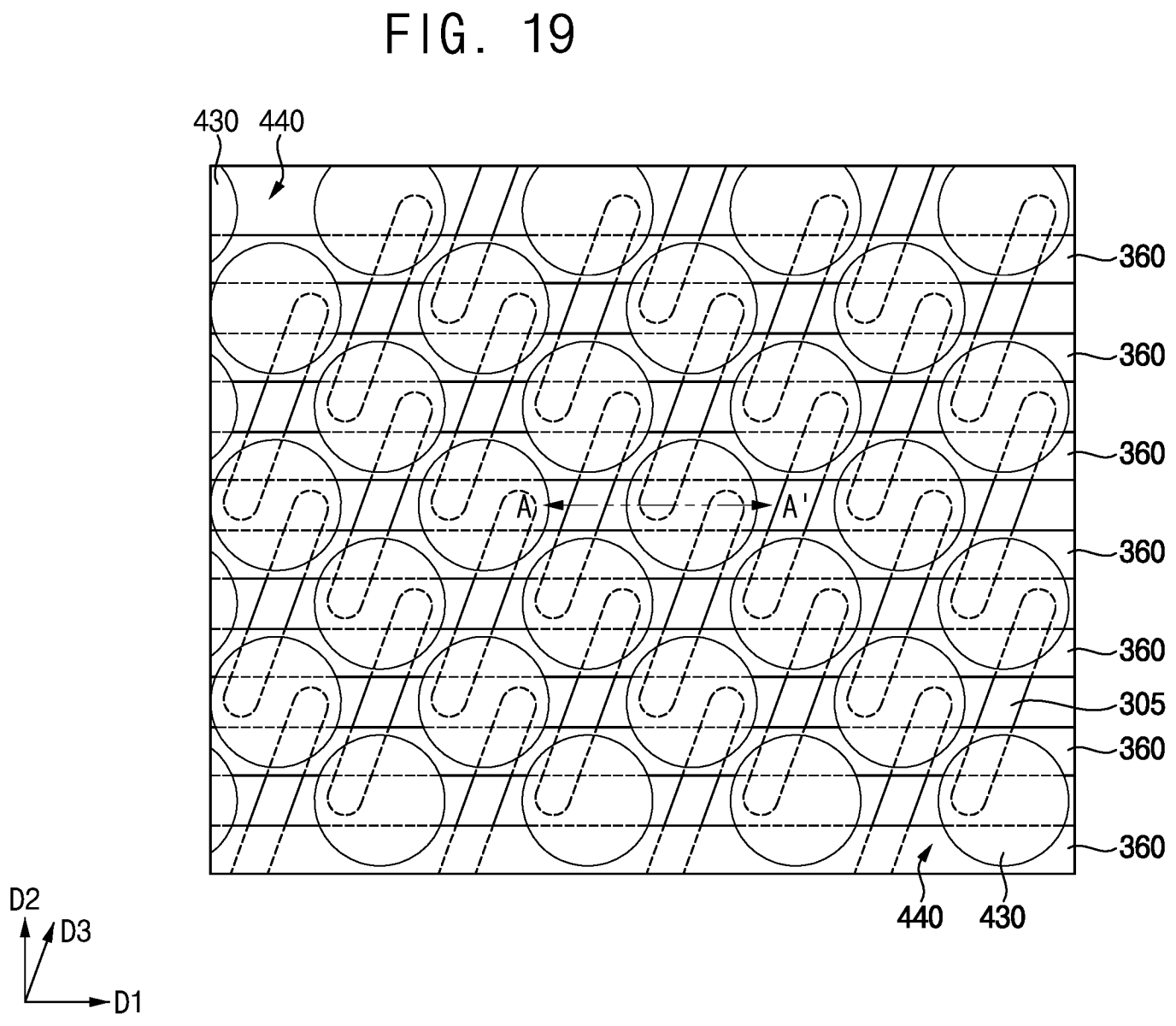
Figure 20:
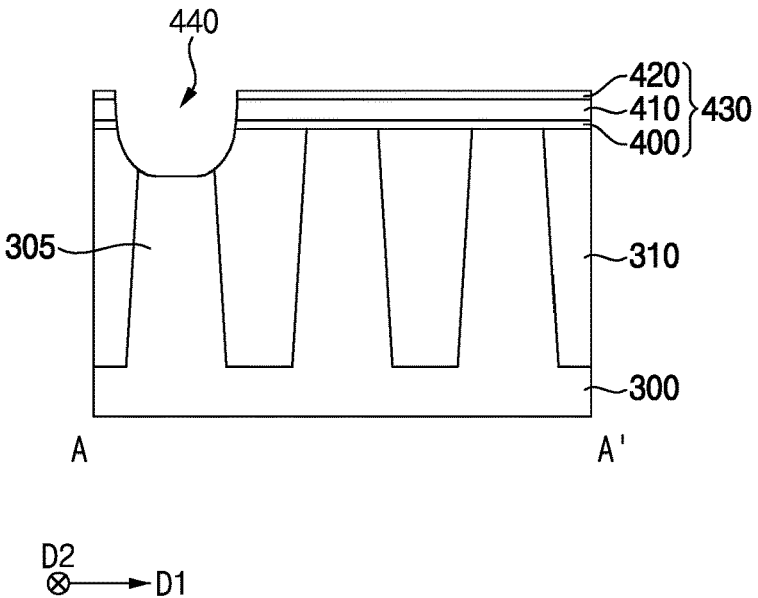

Referring to FIGS. 15 and 16 together with FIGS. 19 and 20, a fourth opening 440 extending through an insulation layer structure 430 and exposing upper surfaces of the active pattern 305, the isolation pattern 310 and the gate mask 350 of the gate structure 360 may be formed, and an upper surface of a central portion in the third direction D3 of the active pattern 305 may be exposed by the fourth opening 440.

In example embodiments, an area of a bottom of the fourth opening 440 may be greater than an area of the upper surface of the active pattern 305. Thus, the fourth opening 440 may also expose an upper surface of a portion of the isolation pattern 310 adjacent to the active pattern 305. Additionally, the fourth opening 440 may extend through upper portions of the active pattern 305 and the portion of the isolation pattern 310 adjacent thereto, and thus the bottom of the fourth opening 440 may be lower than an upper surface of each of opposite edge portions in the third direction D3 of the active pattern 305.

The first bit line structure 595 may include a second conductive pattern 455, a first barrier pattern 465, a third conductive pattern 475, a first mask 485, a second etch stop pattern 565 and a first capping pattern 585 sequentially stacked in the vertical direction on the fourth opening 440 or the first insulation pattern structure 435. The second conductive pattern 455, the first barrier pattern 465 and the third conductive pattern 475 may collectively form a conductive structure, and the first mask 485, the second etch stop pattern 565 and the first capping pattern 585 may collectively form an insulation structure.

The second conductive pattern 455 may include, e.g., doped polysilicon, the first barrier pattern 465 may include a metal nitride, e.g., titanium nitride, or a metal silicon nitride, e.g., titanium silicon nitride, the third conductive pattern 475 may include a metal, e.g., tungsten, and each of the first mask 485, the second etch stop pattern 565 and the first capping pattern 585 may include an insulating nitride, e.g., silicon nitride.

In example embodiments, the first bit line structure 595 may extend in the second direction D2 on the substrate 300, and a plurality of first bit line structures 595 may be spaced apart from each other in the first direction D1.

The fifth and sixth insulation patterns 610 and 620 may be formed in the fourth opening 440, and may contact a lower sidewall of the first bit line structure 595. The fifth insulation pattern 610 may include an oxide, e.g., silicon oxide, and the sixth insulation pattern 620 may include an insulating nitride, e.g., silicon nitride.

The first insulation pattern structure 435 may be formed on the active pattern 305 and the isolation pattern 310 under the first bit line structure 595, and may include second, third and fourth insulation patterns 405, 415 and 425 sequentially stacked in the vertical direction. The second and fourth insulation patterns 405 and 425 may include an oxide, e.g., silicon oxide, and the third insulation pattern 415 may include an insulating nitride, e.g., silicon nitride.

The contact plug structure may include a lower contact plug 675, a metal silicide pattern 700 and an upper contact plug 755 sequentially stacked in the vertical direction on the active pattern 305 and the isolation pattern 310.

The lower contact plug 675 may contact the upper surface of each of opposite edge portions in the third direction D3 of the active pattern 305. In example embodiments, a plurality of lower contact plugs 675 may be spaced apart from each other in the second direction D2, and a second capping pattern 685 may be formed between neighboring ones of the lower contact plugs 675 in the second direction D2. The second capping pattern 685 may include an insulating nitride, e.g., silicon nitride.

The lower contact plug 675 may include, e.g., doped polysilicon, the metal silicide pattern 700 may include, e.g., titanium silicide, cobalt silicide, nickel silicide, etc.

The upper contact plug 755 may include a second metal pattern 745 and a second barrier pattern 735 at least partially covering a lower surface of the second metal pattern 745. The second metal pattern 745 may include a metal, e.g., tungsten, and the second barrier pattern 735 may include a metal nitride, e.g., titanium nitride.

In example embodiments, a plurality of upper contact plugs 755 may be spaced apart from each other in the first and second directions D1 and D2, and may be arranged in a honeycomb pattern or a lattice pattern in a plan view. Each of the upper contact plugs 755 may have a shape of, e.g., a circle, an ellipse, or a polygon in a plan view.

The spacer structure 665 may include a first spacer 600 at least partially covering sidewalls of the first bit line structure 595 and the fourth insulation pattern 425, an air spacer 600 on a lower outer sidewall of the first spacer 600, and a third spacer 650 on an outer sidewall of the air spacer 635, a sidewall of the first insulation pattern structure 435, and upper surfaces of the fifth and sixth insulation patterns 610 and 620.

Each of the first and third spacers 600 and 650 may include an insulating nitride, e.g., silicon nitride, and the air spacer 895 may include air.

The fourth spacer 690 may be formed on an outer sidewall of a portion of the first spacer 600 on an upper sidewall of the first bit line structure 595, and may at least partially cover an upper end of the air spacer 635 and an upper surface of the third spacer 650. The fourth spacer 690 may include an insulating nitride, e.g., silicon nitride.

Figure 30:
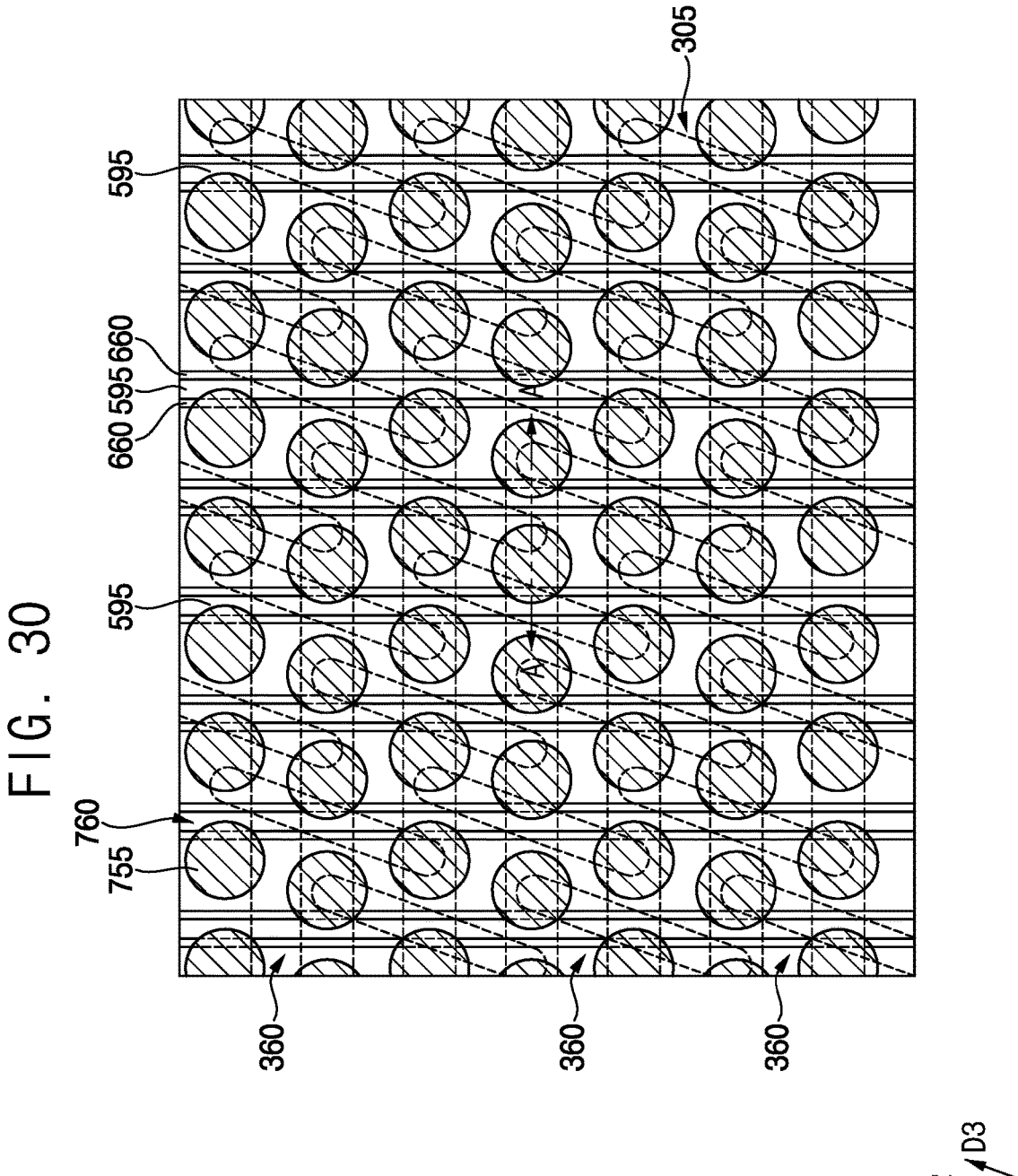
Figure 31:
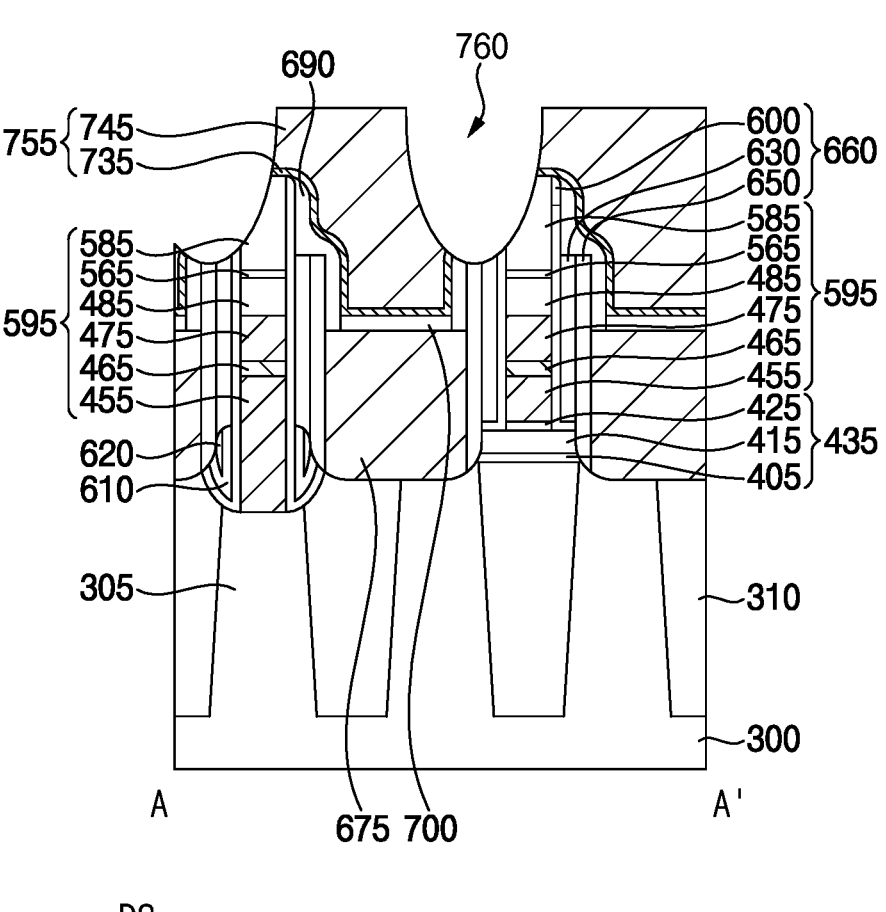

Referring to FIGS. 15 and 16 together with FIGS. 30 and 31, the second insulation pattern structure 790 may include a seventh insulation pattern 770 on an inner wall of a ninth opening 760, which may extend through the upper contact plug 755, a portion of the insulation structure of the first bit line structure 595 and portions of the first, third and fourth spacers 600, 650 and 690 and surround the upper contact plug 755 in a plan view, and an eighth insulation pattern 780 on the seventh insulation pattern 770 and fill a remaining portion of the ninth opening 760. The upper end of the air spacer 635 may be closed by the seventh insulation pattern 770.

The seventh and eighth insulation patterns 770 and 780 may include an insulating nitride, e.g., silicon nitride.

The first etch stop layer 30 may be formed on the seventh and eighth insulation patterns 770 and 780, the upper contact plug 755 and the second capping pattern 685.

The first capacitor 110 may contact an upper surface of the upper contact plug 755.

FIGS. 17 to 32 are plan views and cross-sectional views illustrating a method of manufacturing a semiconductor device according to example embodiments. For example, FIGS. 17, 19, 22, 26 and 30 are the plan views, FIG. 18 includes cross-sectional views taken along lines A-A' and B-B' of FIG. 17, and FIGS. 20-21, 23-25, 27-29 and 31-32 are cross-sectional views taken along lines A-A' and B-B', respectively, of corresponding plan views.

The method of manufacturing the semiconductor device is an application of the method of forming the first capacitor structure described with reference to FIGS. 1 to 6 to a method of manufacturing a DRAM device, and thus to the extent that a process for forming the capacitor structure is not described in detail herein, that process may be assumed to be at least similar to a corresponding process that has been described elsewhere within the instant specification.

Figure 17:
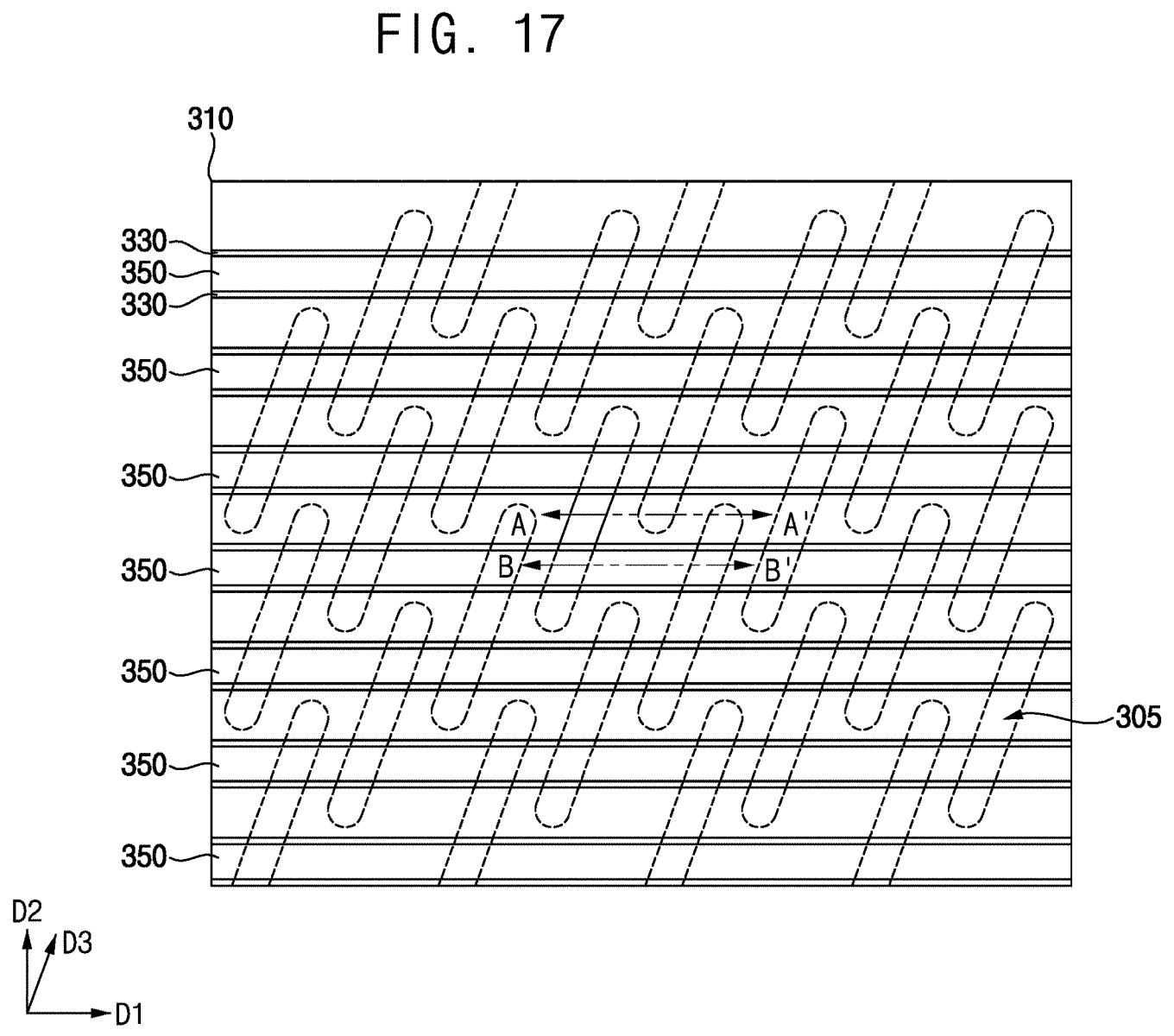

Referring to FIGS. 17 and 18, an upper portion of a substrate 300 may be removed to form a first recess, and an isolation pattern 310 may be formed in the first recess.

As the isolation pattern 310 is formed on the substrate 300, an active pattern 305 of which a sidewall is covered by the isolation pattern 310 may be defined.

The active pattern 305 and the isolation pattern 310 on the substrate 300 may be partially etched to form a second recess extending in the first direction D1, and a gate structure 360 may be formed in the second recess. In example embodiments, the gate structure 360 may extend in the first direction D1, and a plurality of gate structures may be spaced apart from each other in the second direction D2.

Referring to FIGS. 19 and 20, an insulating layer structure 430 may be formed on the active pattern 305, the isolation pattern 310, and the gate structure 360. The insulating layer structure 430 may include second to fourth insulating layers 400, 410, and 420 that are sequentially stacked.

The insulating layer structure 430 may be patterned, and the active pattern 305, the isolation pattern 310, and the gate mask 350 included in the gate structure 360 may be partially etched using the patterned insulating layer structure 430 as an etching mask to form a fourth opening 440. In example embodiments, the insulating layer structure 430 may have a circular shape or an elliptical shape in a plain view, and a plurality of insulating layer structures 430 may be spaced apart from each other in the first and second direction D1 and D2. Each of the insulating layer structures 430 may overlap end portions of ones of the active patterns 305 neighboring in the third direction D3, which may face each other, in a vertical direction that is substantially orthogonal to the upper surface of the substrate 300.

Figure 21:
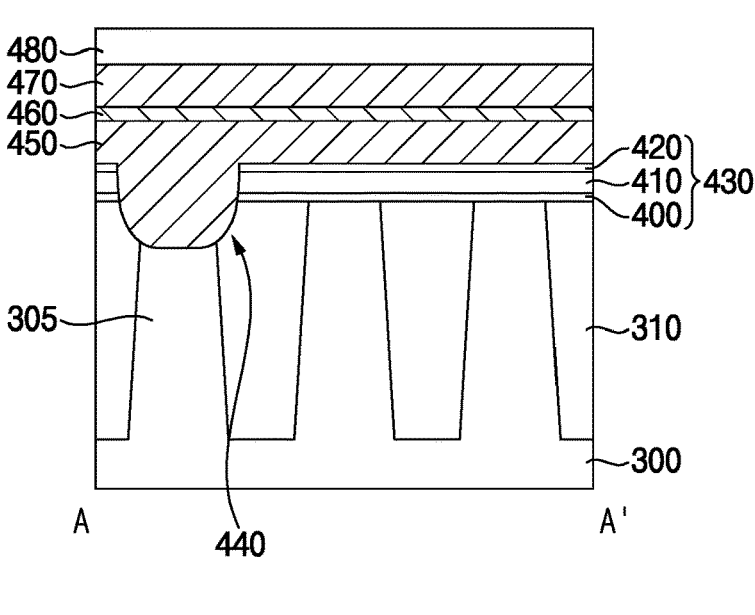

Referring to FIG. 21, a first conductive layer 450, a first barrier layer 460, a second conductive layer 470 and a first mask layer 480 may be sequentially stacked on the insulating layer structure 430, and the active pattern 305, the isolation pattern 310 and the gate structure 360 exposed by the fourth opening 440. The first conductive layer 450 may fill the fourth opening 440.

Figure 22:
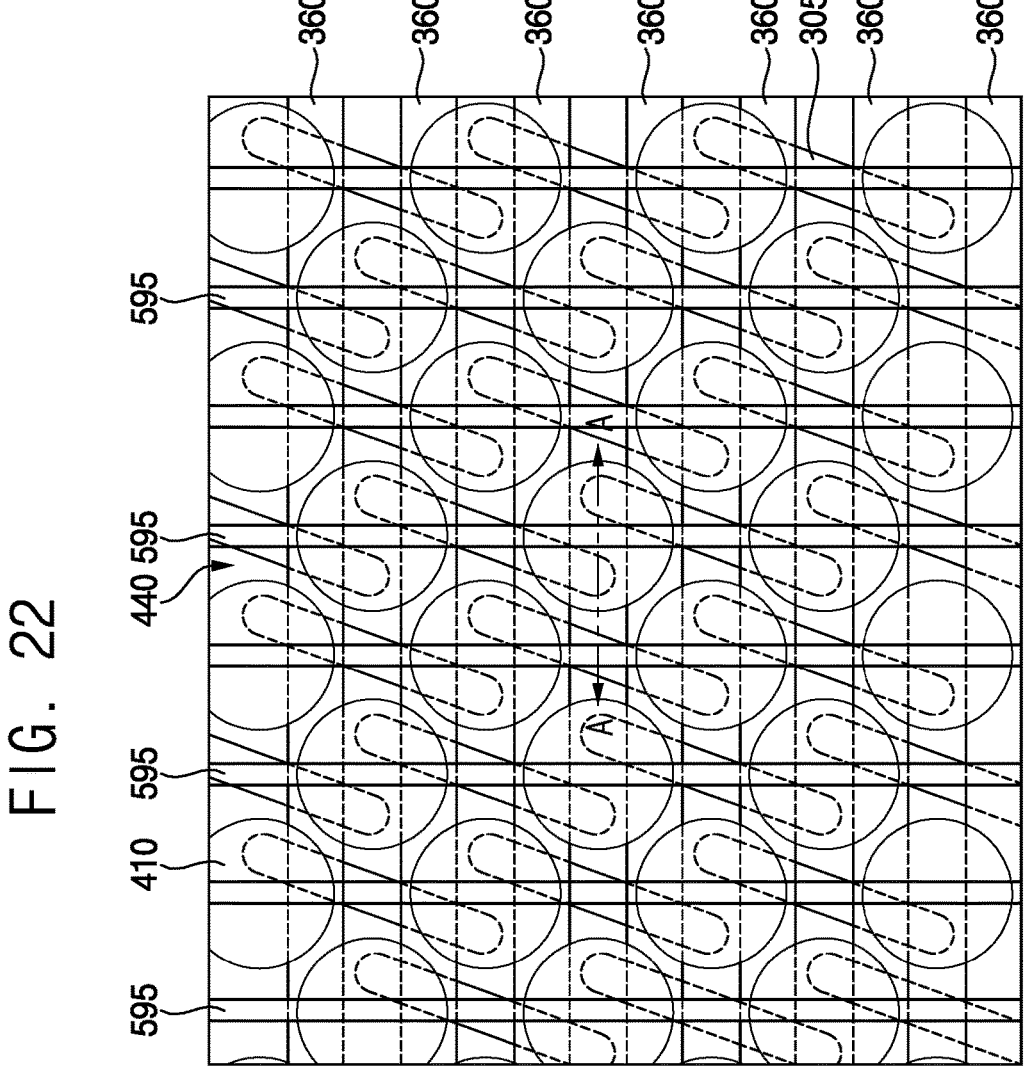
Figure 22:
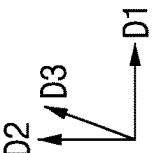
Figure 23:
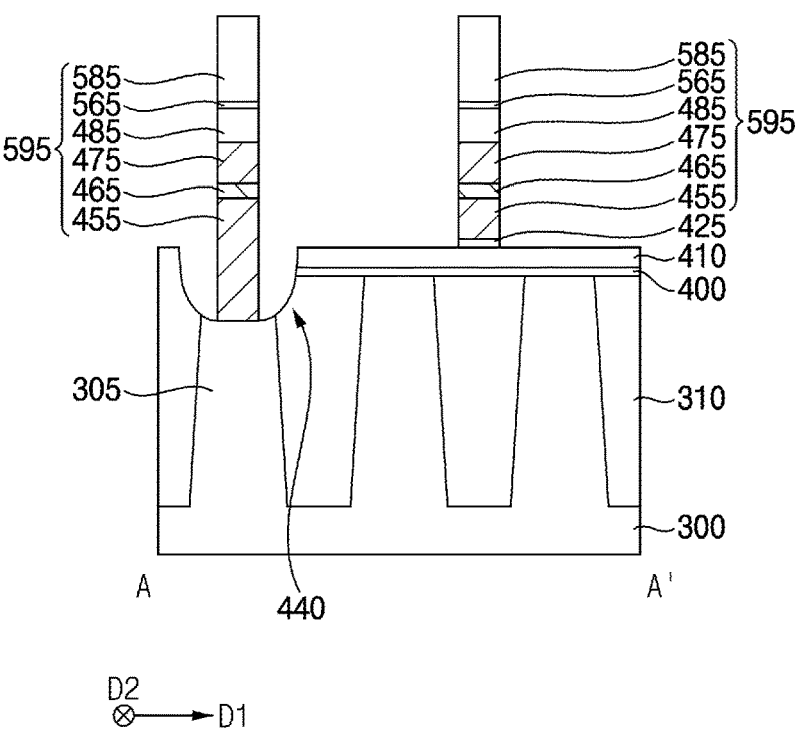

Referring to FIGS. 22 and 23, a second etch stop layer and a first capping layer may be sequentially formed on the conductive structure layer, the first capping layer may be etched to form a first capping pattern 585, and the second etch stop layer, the first mask layer 480, the second conductive layer 470, the first barrier layer 460 and the first conductive layer 450 may be sequentially etched using the first capping pattern 585 as an etch mask.

In example embodiments, the first capping pattern 585 may extend in the second direction D2, and a plurality of first capping patterns 585 may be spaced apart from each other in the first direction D1.

By the etching process, a second conductive pattern 455, a first barrier pattern 465, a third conductive pattern 475, a first mask 485, a second etch stop pattern 565 and the first capping pattern 585 may be formed on the fourth opening 440, and a fourth insulation pattern 425, the second conductive pattern 455, the first barrier pattern 465, the third conductive pattern 475, the first mask 485, the second etch stop pattern 565 and the first capping pattern 585 may be sequentially stacked on the third insulating layer 410 of the insulating layer structure 430 at an outside of the fourth opening 440.

Hereinafter, the second conductive pattern 455, the first barrier pattern 465, the third conductive pattern 475, the first mask 485, the second etch stop pattern 565 and the first capping pattern 585, sequentially stacked, may be referred to as a first bit line structure 595. The second conductive pattern 455, the first barrier pattern 465 and the third conductive pattern 475 may form a conductive structure, and the first mask 485, the second etch stop pattern 565 and the first capping pattern 585 may form an insulating structure. In example embodiments, the first bit line structure 595 may extend in the second direction D2, and a plurality of first bit line structures 595 may be spaced apart from each other in the first direction D1.

Figure 24:
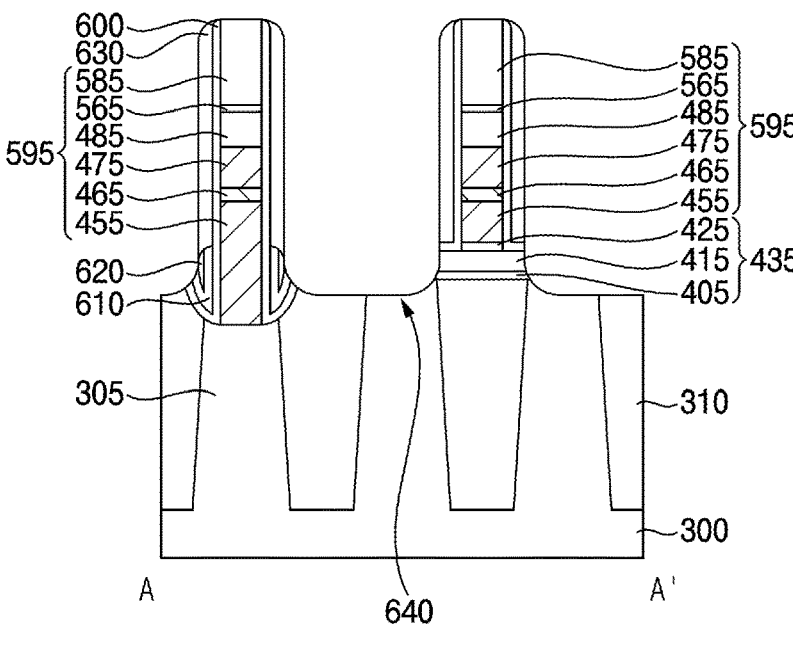

Referring to FIG. 24, a first spacer layer may be formed on the substrate 300 on which the first bit line structure 595 is formed, and fifth and sixth insulating layers may be sequentially formed on the first spacer layer.

The first spacer layer may also at least partially cover a sidewall of the fourth insulation pattern 425 under the first bit line structure 595 on the third insulating layer 410, and the sixth insulating layer may fill a remaining portion of the fourth opening 440.

The fifth and sixth insulating layers may be etched by an etching process. In example embodiments, the etching process may be a wet etching process using, for example, phosphoric acid ($H_2PO_3$), standard clean 1 (SC1), and hydrofluoric acid (HF) as an etchant, and portions of the fifth and sixth insulating layers except for portions thereof in the fourth opening 440 may be removed. Accordingly, most portion of a surface of the first spacer layer, for example, all portions of the surface of the first spacer layer except for a portion of the surface thereof in the fourth opening 440 may be exposed, and the fifth and sixth insulating layers remaining in the fourth opening 440 may form fifth and sixth insulation patterns 610 and 620, respectively.

A second spacer layer may be formed on the exposed surface of the first spacer layer and the fifth and sixth insulation patterns 610 and 620 in the fourth opening 440. The second spacer layer may be anisotropically etched to form a second spacer 630 at least partially covering a sidewall of the first bit line structure 595 on the surface of the first spacer layer and on the fifth and sixth insulation patterns 610 and 620.

A dry etching process may be performed using the first capping pattern 585 and the second spacer 630 as an etch mask to form a fifth opening 640 exposing an upper surface of the active pattern 305, and upper surfaces of the isolation pattern 310 the gate mask 350 may also be exposed by the fifth opening 640.

By the dry etching process, portions of the first spacer layer disposed on upper surfaces of the first capping pattern 585 and the second insulating layer 410 may be removed, and thus a first spacer 600 may be formed on the sidewall of the first bit line structure 595. By the dry etching process, the second and third insulating layers 400 and 410 may be partially removed to remain as second and third insulation patterns 405 and 415, respectively, under the first bit line structure 595. The second to fourth insulation patterns 405, 415 and 425 sequentially stacked under the first bit line structure 595 may form a first insulation pattern structure.

Figure 25:
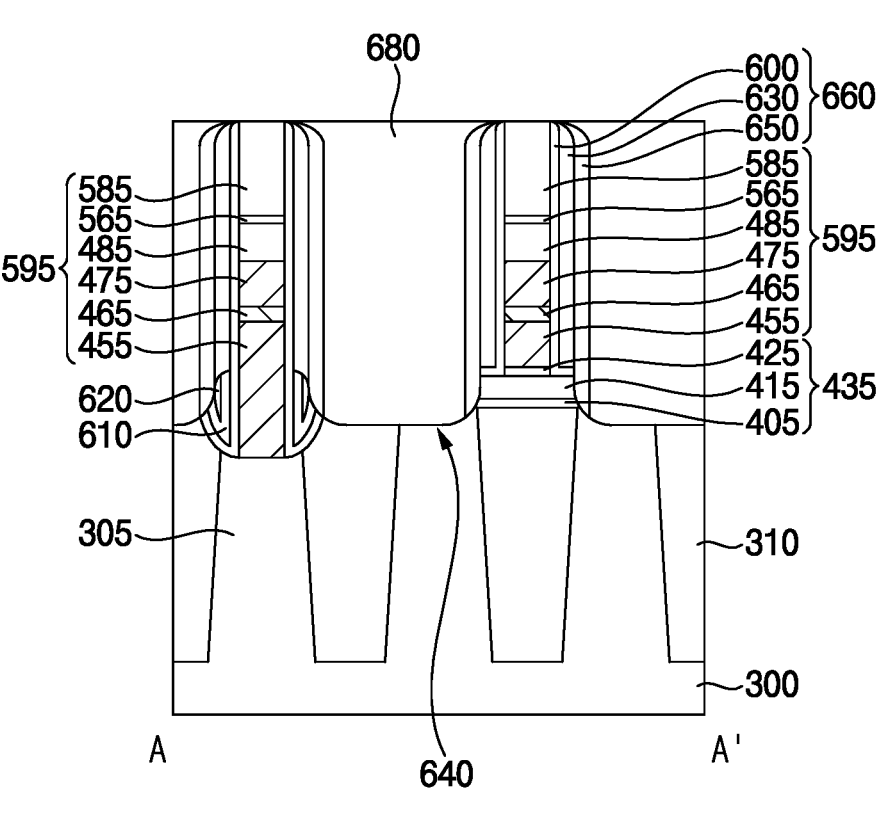

Referring to FIG. 25, a third spacer layer may be formed on an upper surface of the first capping pattern 585, an outer sidewall of the second spacer 630, portions of the upper surfaces of the fifth and sixth insulation patterns 610 and 620, and upper surfaces of the active pattern 305, the isolation pattern 310 and the gate mask 350 exposed by the fifth opening 640. The third spacer layer may be anisotropically etched to form a third spacer 650 at least partially covering the sidewall of the first bit line structure 595.

The first to third spacers 600, 630 and 650 sequentially stacked on the sidewall of the first bit line structure 595 in the horizontal direction may be referred to as a preliminary spacer structure 660.

A second sacrificial layer may be formed to fill the fifth opening 640 on the substrate 300 to a sufficient height, and an upper portion of the second sacrificial layer may be planarized until the upper surface of the first capping pattern 585 is exposed to form a second sacrificial pattern 680 in the fifth opening 640.

In example embodiments, the second sacrificial pattern 680 may extend in the second direction D2, and a plurality of second sacrificial patterns 680 may be spaced apart from each other in the first direction D1 by the first bit line structures 595. The second sacrificial pattern 680 may include, for example, an oxide such as silicon oxide.

Figure 26:
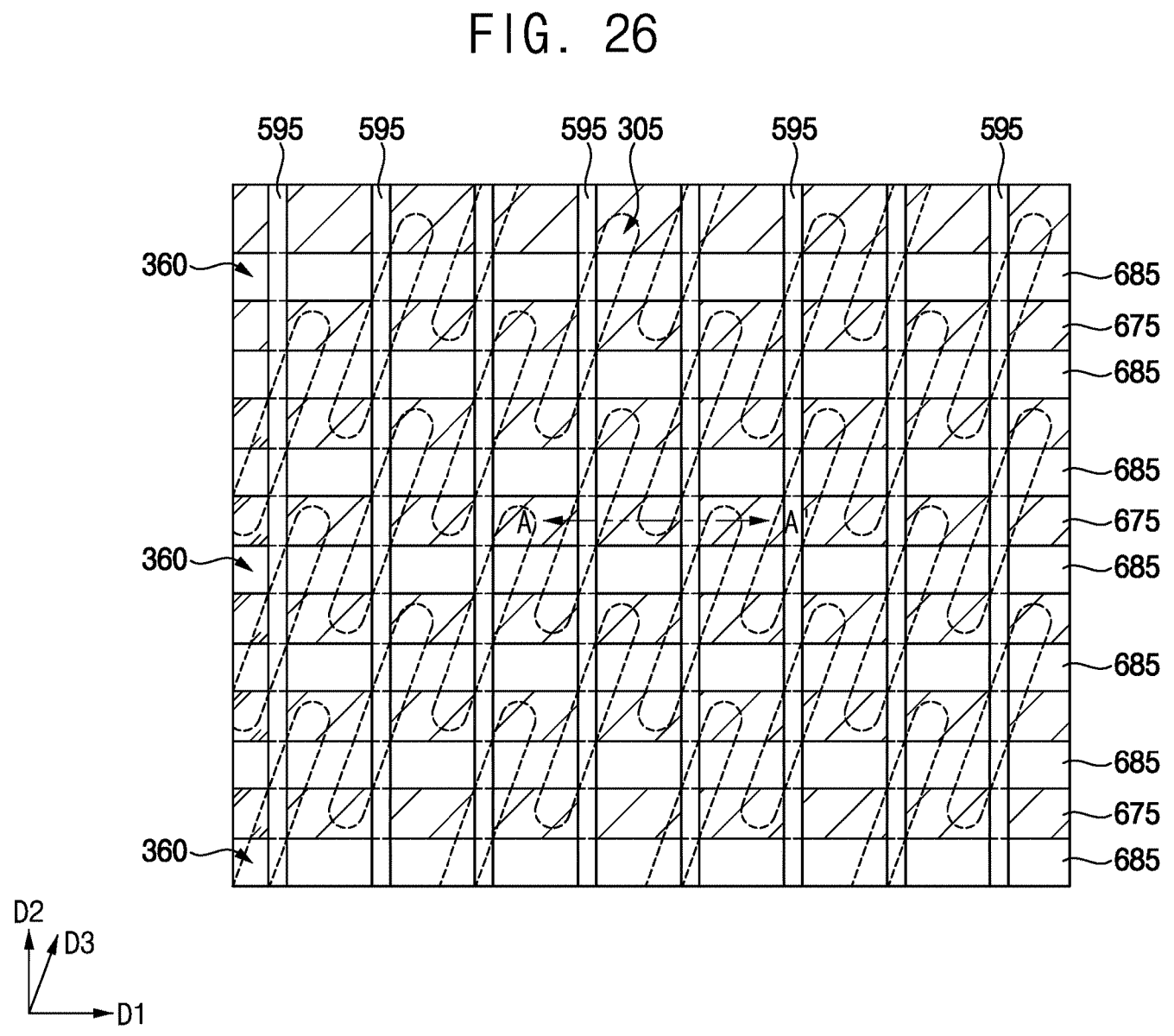
Figure 27:
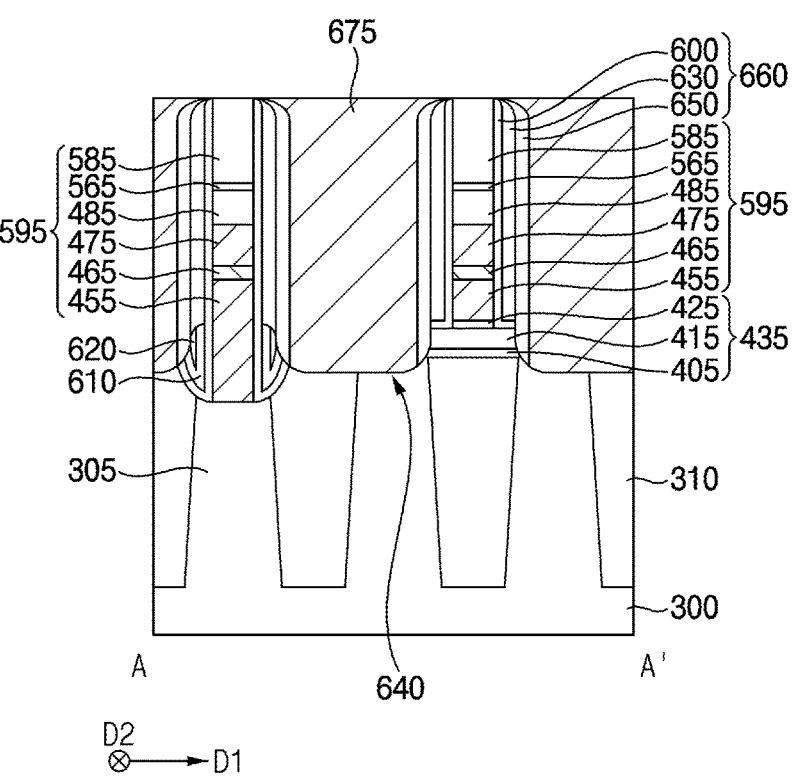

Referring to FIGS. 26 and 27, a second mask including a plurality of sixth openings, each of which may extend in the first direction D1, spaced apart from each other in the second direction D2, may be formed on the first capping pattern 585, the second sacrificial pattern 680 and the preliminary spacer structure 660, and may be etched using the second mask as an etching mask.

In example embodiments, each of the sixth openings may overlap a region between the gate structures 360 in the vertical direction. By the etching process, a seventh opening exposing upper surfaces of the active pattern 305 and the isolation pattern 310 may be formed between the first bit line structures 595 on the substrate 300.

The second mask may be removed, a lower contact plug layer may be formed to fill the seventh opening to a sufficient height, and an upper portion of the lower contact plug layer may be planarized until the upper surface of the first capping pattern 585 and upper surfaces of the second sacrificial pattern 680 and the preliminary spacer structure 660 are exposed. Thus, the lower contact plug layer may be transformed into a plurality of lower contact plugs 675 spaced apart from each other in the second direction D2 between the first bit line structures 595. Additionally, the second sacrificial pattern 680 extending in the second direction D2, between the first bit line structures 595, may be divided into a plurality of parts in the second direction D2 by the lower contact plugs 675.

The second sacrificial pattern 680 may be removed to form an eighth opening, and a second capping pattern 685 may be formed to fill the eighth opening. In example embodiments, the second capping pattern 685 may overlap the gate structure 360 in the vertical direction.

Figure 28:
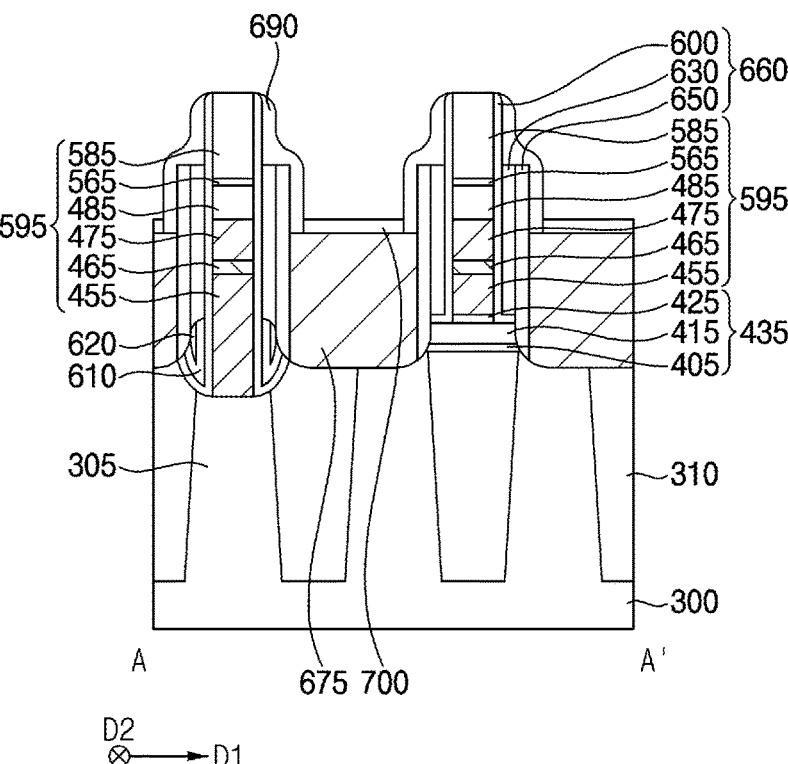

Referring to FIG. 28, an upper portion of the lower contact plug 675 may be removed to expose an upper portion of the preliminary spacer structure 660 on the sidewall of the first bit line structure 595, and upper portions of the second and third spacers 630 and 650 of the exposed preliminary spacer structure 660 may be removed.

An upper portion of the lower contact plug 675 may be additionally removed. Thus, an upper surface of the lower contact plug 675 may be lower than upper surfaces of the second and third spacers 630 and 650.

A fourth spacer layer may be formed on the first bit line structure 595, the preliminary spacer structure 660, the second capping pattern 685 and the lower contact plug 675, and may be anisotropically etched to form a fourth spacer 690 at least partially covering an upper portion of the preliminary spacer structure 660 on the sidewall of the first bit line structure 595, and the upper surface of the lower contact plug 675 may be exposed by the etching process.

A metal silicide pattern 700 may be formed on the exposed upper surface of the lower contact plug 675. In example embodiments, the metal silicide pattern 700 may be formed by forming a first metal layer disposed on the first and second capping patterns 585 and 685, the fourth spacer 690 and the lower contact plug 675, performing a heat treatment thereon, and removing an unreacted portion of the first metal layer.

Figure 29:
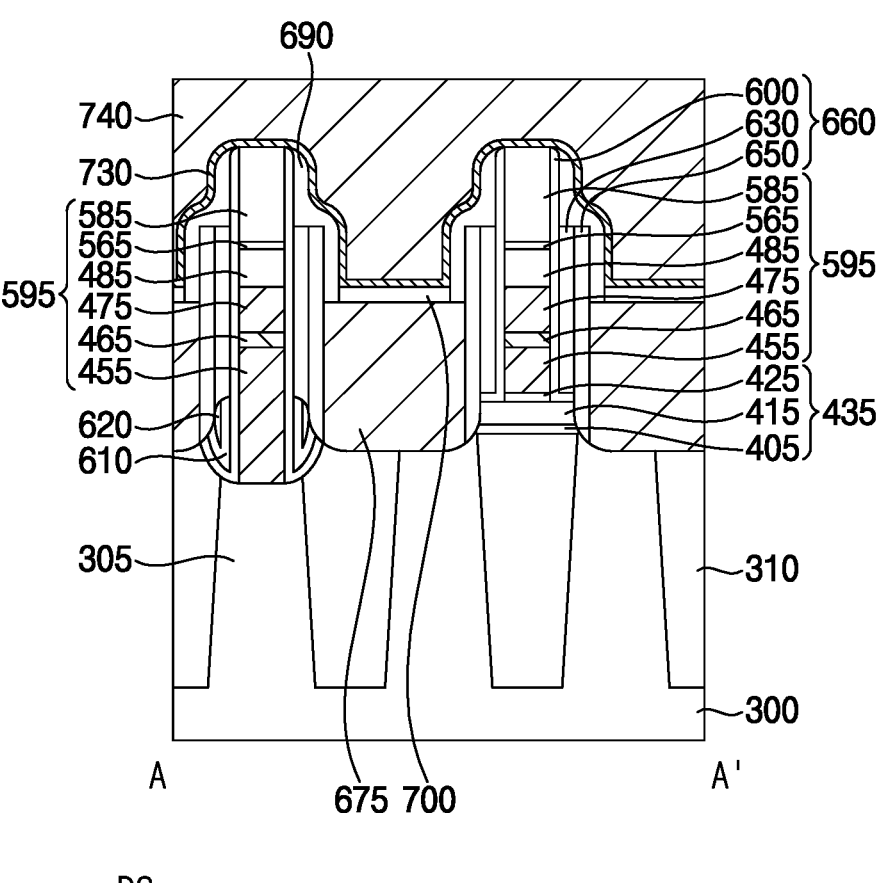

Referring to FIG. 29, a second barrier layer 730 may be formed on the first and second capping patterns 585 and 685, the fourth spacer 690, the metal silicide pattern 700 and the lower contact plug 675, and a second metal layer 740 may be formed on the second barrier layer 730 to fill a space between the first bit line structures 595.

A planarization process may be performed on an upper portion of the second metal layer 740. The planarization process may include, for example, a chemical mechanical polishing (CMP) process and/or an etch-back process.

Referring to FIGS. 30 and 31, the second metal layer 740 and the second barrier layer 730 may be patterned to form an upper contact plug 755. In example embodiments, a plurality of upper contact plugs 755 may be formed, and a ninth opening 760 may be formed between the upper contact plugs 755.

The ninth opening 760 may be formed by partially removing the first and second capping patterns 585 and 685, the preliminary spacer structure 660 and the fourth spacer 690 as well as the second metal layer 740 and the second barrier layer 730.

The upper contact plug 755 may include a second metal pattern 745 and a second barrier pattern 735 at least partially covering a lower surface of the second metal pattern 745. In example embodiments, the upper contact plug 755 may have a shape of a circle, an ellipse, or a rounded polygon in a plan view, and the upper contact plugs 755 may be arranged, for example, in a honeycomb pattern in the first and second direction D1 and D2, in a plan view.

The lower contact plug 675, the metal silicide pattern 700 and the upper contact plug 755, sequentially stacked on the substrate 300, may collectively form a contact plug structure.

Figure 32:
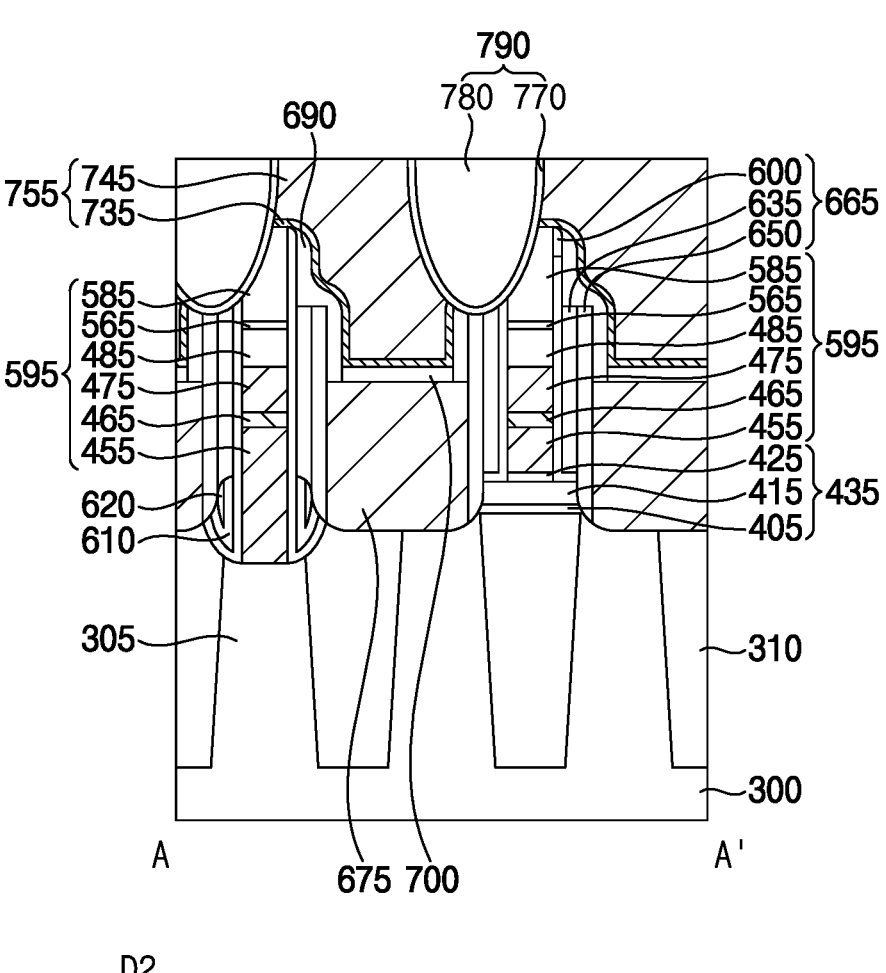

Referring to FIG. 32, the second spacer 630 included in the preliminary spacer structure 660, exposed by the ninth opening 760, may be removed to form an air gap, a seventh insulation pattern 770 may be formed on a bottom and a sidewall of the ninth opening 760, and an eighth insulation pattern 780 may be formed to fill a remaining portion of the ninth opening 760.

Each of the seventh and eighth insulation patterns 770 and 780 may form a second insulation pattern structure 790.

A top end of the air gap may be at least partially covered by the seventh insulation pattern 770, and thus an air spacer 635 may be formed. The first spacer 600, the air spacer 635 and the third spacer 650 may form a spacer structure 665.

Referring to FIGS. 15 and 16 again, the first capacitor 110, the first etch stop layer 30, the support layer 50 and the upper electrode plate 120 may be formed by processes substantially the same as or similar to the processes described with reference to FIGS. 1 to 6.

The first lower electrode structure 75 included in the first capacitor 110 may contact an upper surface of the upper contact plug 755.

Figure 33:
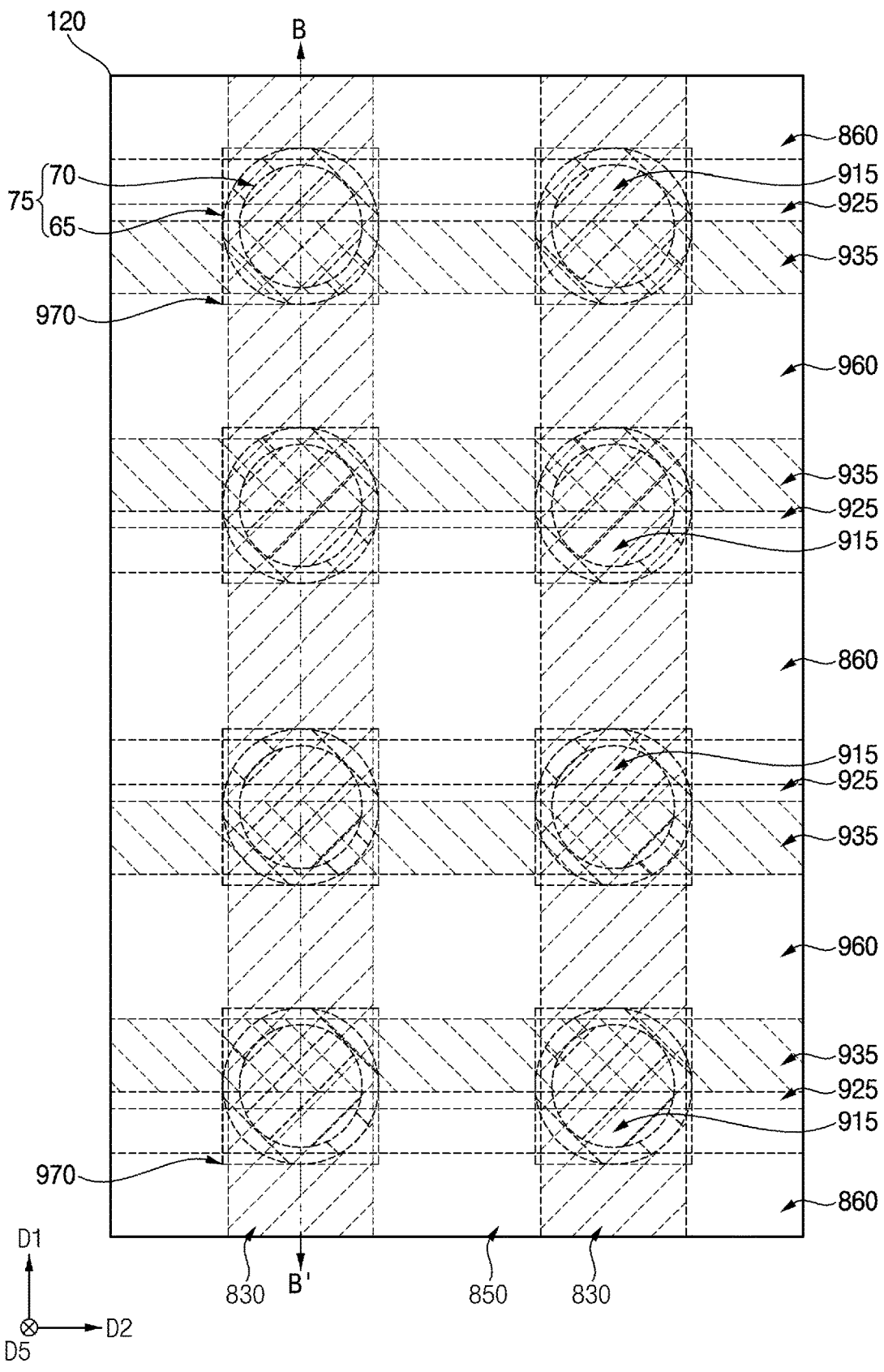
FIGS. 33 and 34 are a plan view and a cross-sectional view, respectively, illustrating a semiconductor device according to example embodiments.
Figure 34:
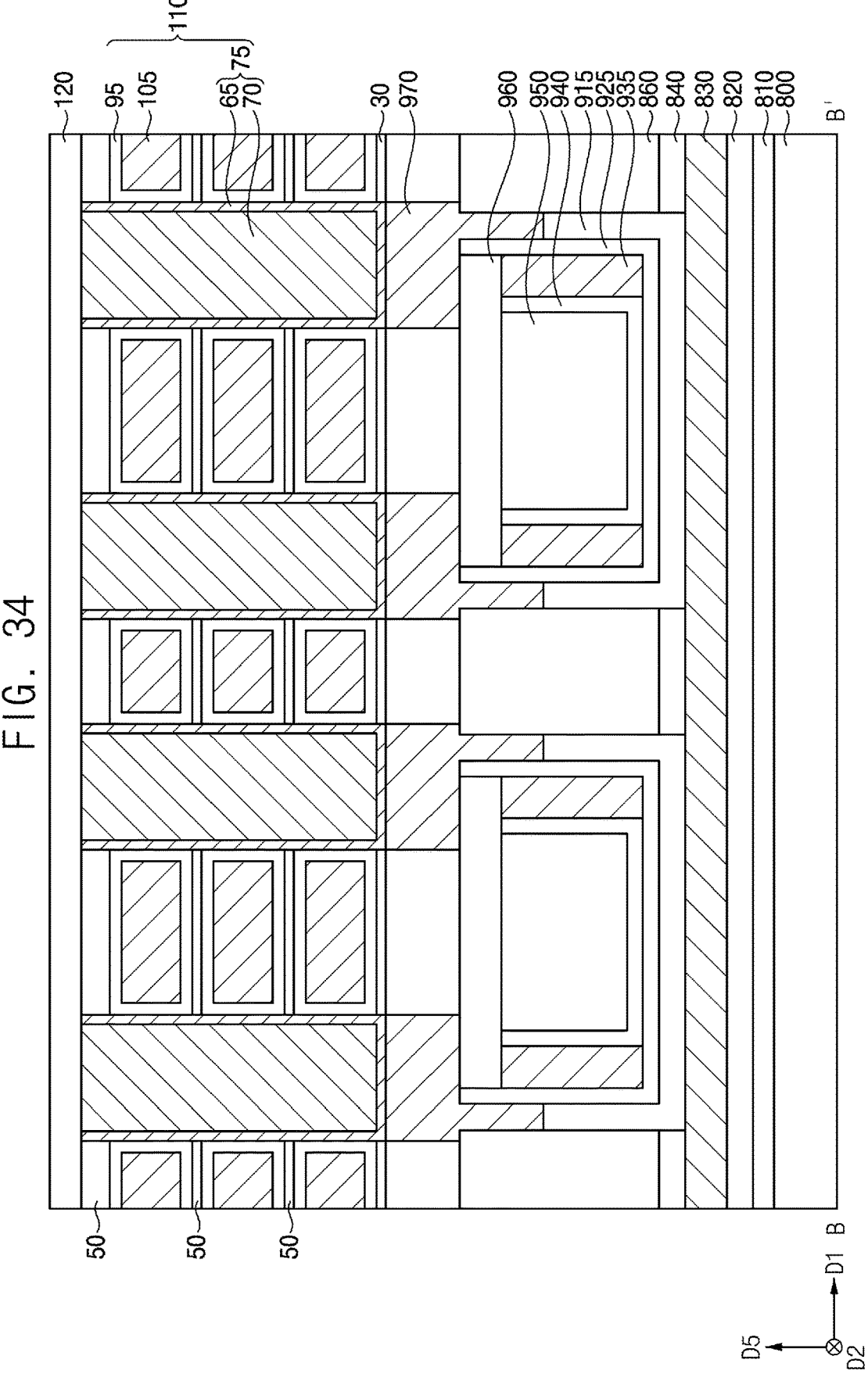

FIGS. 33 and 34 are a plan view and a cross-sectional view, respectively, illustrating a semiconductor device according to example embodiments. FIG. 34 is a cross-sectional view taken along line B-B' of FIG. 33.

This semiconductor device may be an application of the first capacitor structure illustrated with reference to FIG. 1 to a vertical channel transistor (VCT) DRAM device, and thus the first capacitor structure may be assumed to be at least similar to other first capacitor structures described elsewhere within the instant specification. However, the semiconductor device may include one of the second to fifth capacitor structures shown in FIGS. 7, 8, 9 and 14 instead of the first capacitor structure.

Hereinafter, two directions among horizontal directions that are substantially parallel to an upper surface of a substrate 800, which may be substantially orthogonal to each other, may be referred as first and second directions D1 and D2, respectively, and a direction that is substantially perpendicular to the upper surface of the substrate 800 may be referred to as a fifth direction D5.

Referring to FIGS. 33 and 34, the semiconductor device may include a second bit line structure, a second gate electrode 935, a second gate insulation pattern 925, a channel 915, a contact plug 970 and the first capacitor structure disposed on a substrate 800.

The semiconductor device may further include a ninth insulation layer 810, twelfth and thirteenth insulation patterns 940 and 960, and second to fifth insulating interlayer patterns 850, 860, 950 and 980.

The substrate 800 may include, e.g., a semiconductor material, an electrically insulating material or an electrically conductive material.

Figure 35:
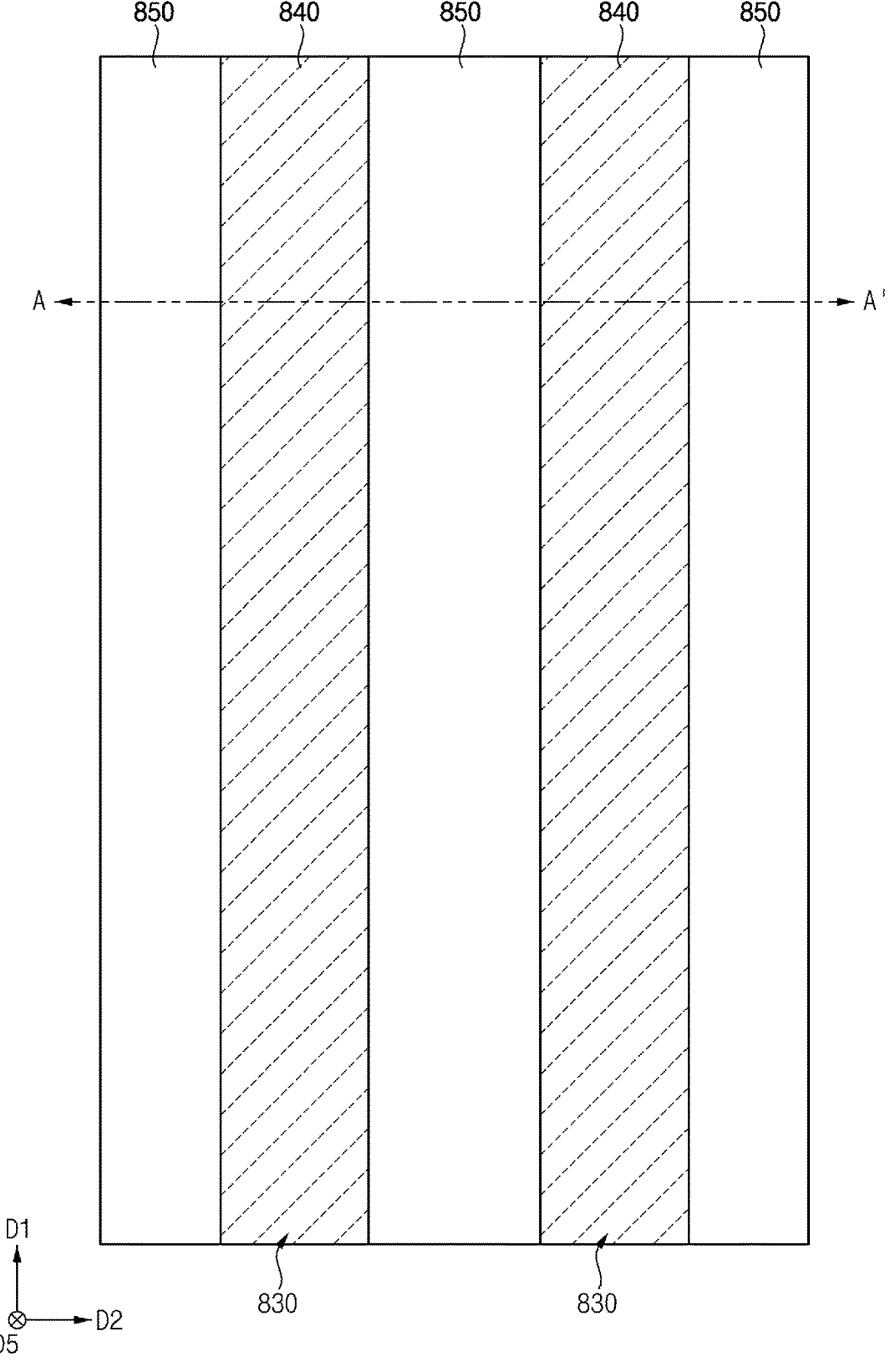
Figure 36:
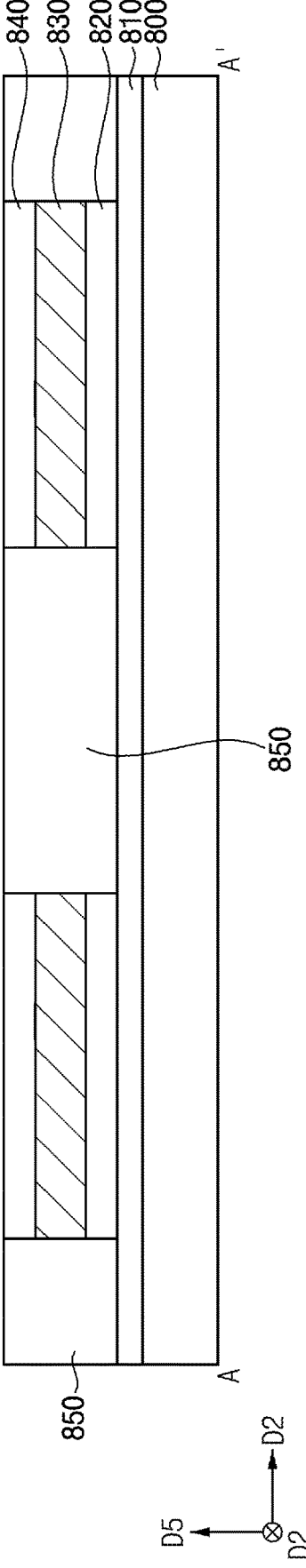

Referring to FIGS. 33 and 34 together with FIGS. 35 and 36, the ninth insulation layer 810 may be formed on the substrate 800, and the second bit line structure may extend in the first direction D1 on the ninth insulation layer 810.

In example embodiments, the second bit line structure may include a tenth insulation pattern 820, a second bit line 830 and an eleventh insulation pattern 840 sequentially stacked on the ninth insulation layer 810. Each of the tenth insulation pattern 820 and the second bit line 830 may extend in the first direction D1, and a plurality of eleventh insulation patterns 840 may be spaced apart from each other in the first direction D1 on the second bit line 830.

In example embodiments, a plurality of second bit line structures may be spaced apart from each other in the second direction D2, and the second insulating interlayer pattern 850 may extend in the first direction D1 on the ninth insulation layer 810 between neighboring ones of the second bit line structures in the second direction D2.

An upper surface of a portion of the second insulating interlayer pattern 850 that is adjacent to the eleventh insulation pattern 840 in the second direction D2 may be substantially coplanar with an upper surface of the eleventh insulation pattern 840, and an upper surface of a portion of the second insulating interlayer pattern 850 that is not adjacent to the eleventh insulation pattern 840 in the second direction D2 may be substantially coplanar with an upper surface of the second bit line 830. For example, a height of the upper surface of the second insulating interlayer pattern 850 may periodically change in the first direction D1.

Each of the ninth insulation layer 810 and the second insulating interlayer pattern 850 may include an oxide, e.g., silicon oxide, the second bit line 830 may include an electrically conductive material, e.g., a metal, a metal nitride, a metal silicide, and each of the tenth and eleventh insulation patterns 820 and 840 may include an insulating nitride, e.g., silicon nitride.

The third insulating interlayer pattern 860 extending in the second direction D2 may be formed on the eleventh insulation pattern 840 and the second insulating interlayer pattern 850. The third insulating interlayer pattern 860 may include an oxide, e.g., silicon oxide. Hereinafter, the third insulation pattern 860, the eleventh insulation pattern 840 and an upper portion of the second insulating interlayer pattern 850 at the same height as the eleventh insulation pattern 840 may be collectively referred to as a bar structure. In example embodiments, the bar structure may extend in the second direction D2, and a plurality of bar structures may be spaced apart from each other in the first direction D1.

In example embodiments, the channel 915 may be formed between neighboring ones of the bar structures in the first direction D1, and a plurality of channels 915 may be spaced apart from each other in the second direction D2 on the second bit line 830 and the second insulating interlayer pattern 850. A fourteenth insulation pattern 500 may be formed between neighboring ones of the channels 915 in the second direction D2. The fourteenth insulation pattern 500 may include an oxide, e.g., silicon oxide or an insulating nitride, e.g., silicon nitride.

Additionally, a plurality of channels 915 may be spaced apart from each other in the first direction D1 on the second bit line 830 extending in the first direction D1. FIG. 33 shows that a width in the second direction D2 of the channel 915 may be substantially the same as a width in the second direction D2 of the second bit line 830, however, the inventive concept is not necessarily limited thereto.

In example embodiments, the channel 915 may be conformally formed on an upper surface of the second bit line 830, an upper surface of the second insulating interlayer pattern 850 and a sidewall of the bar structure, and thus a cross-section of the channel 915 in the first direction D1 may have a shape of a cup.

In example embodiments, the channel 915 may include an oxide semiconductor material. The oxide semiconductor material may include zinc tin oxide (ZTO), indium zinc oxide (IZO), zinc oxide (ZnO$_x$), indium gallium zinc oxide (IGZO), indium gallium silicon oxide (IGSO), indium oxide (InO$_x$, In$_2$O$_3$), tin oxide (SnO$_2$), titanium oxide (TiON$_x$), zinc oxide nitride (Zn$_x$O$_y$N$_z$), magnesium zinc oxide (Mg$_x$Zn$_y$O$_z$), indium zinc oxide (In$_x$Zn$_y$O$_z$), indium gallium zinc oxide (In$_x$Ga$_y$Zn$_z$O$_a$), zirconium indium zinc oxide (Zr$_x$In$_y$Zn$_z$O$_a$), hafnium indium zinc oxide (Hf$_x$In$_y$Zn$_z$O$_a$), tin indium zinc oxide (Sn$_x$In$_y$Zn$_z$O$_a$), aluminum tin indium zinc oxide (Al$_x$Sn$_y$In$_z$Zn$_a$O$_d$), silicon indium zinc oxide (Si$_x$In$_y$Zn$_z$O$_a$), zinc tin oxide (Zn$_x$Sn$_y$O$_z$), aluminum zinc tin oxide (Al$_x$Zn$_y$Sn$_z$O$_a$), gallium zinc tin oxide (Ga$_x$Zn$_y$Sn$_z$O$_a$), zirconium zinc tin oxide (Zr$_x$Zn$_y$Sn$_z$O$_a$), and/or indium gallium silicon oxide (InGaSiO).

In example embodiments, the channel 915 may include amorphous oxide semiconductor material. In example embodiments, an upper surface of the channel 915 may be lower than an upper surface of the bar structure.

The fourth insulating interlayer pattern 950 may extend on a portion of the channel 915 on the second bit line 830 and the second insulating interlayer pattern 850 between neighboring ones of the bar structures in the first direction D1, and a lower surface and a sidewall of the fourth insulating interlayer pattern 950 may be at least partially covered by the twelfth insulation pattern 940. A cross-section of the twelfth insulation pattern 940 in the first direction D1 may have a cup shape, and may contact an upper surface of the portion of the channel 915 on the second bit line 830 and the second insulating interlayer pattern 850.

The fourth insulating interlayer pattern 950 may include an oxide, e.g., silicon oxide, and the twelfth insulation pattern 940 may include an insulating nitride, e.g., silicon nitride.

The second gate insulation pattern 925 and the second gate electrode 935 may be formed between a portion of the channel 915 on the sidewall of the bar structure and the twelfth insulation pattern 940.

The second gate electrode 935 may contact an outer sidewall of the twelfth insulation pattern 940, and may extend in the second direction D2. An upper surface of the second gate electrode 935 may be substantially coplanar with upper surfaces of the fourth insulating interlayer pattern 950 and the twelfth insulation pattern 940. The second gate electrode 935 may include an electrically conductive material, e.g., a metal, a metal nitride, a metal silicide, etc.

The second gate insulation pattern 925 may extend in the second direction D2, and may contact a lower surface and an outer sidewall of the second gate electrode 935. Additionally, the second gate insulation pattern 925 may contact inner sidewalls of the portion of the channel 915 and a lower portion of the contact plug 970 on the sidewall of the bar structure, and an upper surface of the portion of the channel 915 on the second bit line 830 and the second insulating interlayer pattern 850. Thus, a cross-section of the second gate insulation pattern 925 in the first direction D1 may have an "L" shape.

The second gate insulation pattern 925 may include a metal oxide, e.g., aluminum oxide, hafnium oxide, zirconium oxide, etc., or silicon oxide.

The thirteenth insulation pattern 960 may be formed on the fourth insulating interlayer pattern 950, the twelfth insulation pattern 940 and the second gate electrode 935, and may extend in the second direction D2. The thirteenth insulation pattern 960 may contact the upper surfaces of the fourth insulating interlayer pattern 950, the twelfth insulation pattern 940 and the second gate electrode 935, and an upper inner sidewall of the second gate insulation pattern 925.

In example embodiments, an upper surface of the thirteenth insulation pattern 960 may be substantially coplanar with the upper surface of the second gate insulation pattern 925. The thirteenth insulation pattern 960 may include an insulating nitride, e.g., silicon nitride.

The contact plug 970 may contact the upper surface of the channel 915 at each area where the second bit lines 830 and the second gate electrodes 935 cross each other in the third direction D3. The contact plug 970 may contact the upper surfaces of the second gate insulation pattern 925, the third insulating interlayer pattern 860 and the thirteenth insulation pattern 960 adjacent to the channel 915, and may be spaced apart from the upper surface of the second gate electrode 935 by the thirteenth insulation pattern 960.

In example embodiments, the contact plug 970 may include the lower portion contacting the upper surface of the channel 915, and an upper portion on the lower portion and having a width greater than a width of the lower portion. The lower portion of the contact plug 970 may contact the second gate insulation pattern 925 and the third insulating interlayer pattern 860, and a lower surface of the lower portion of the contact plug 970 may be lower than an upper surface of the second gate electrode 935.

In example embodiments, a plurality of contact plugs 970 may be spaced apart from each other in the first and second directions D1 and D2, and may be arranged in a lattice pattern or a honeycomb pattern in a plan view. The contact plug 970 may include an electrically conductive material, e.g., a metal, a metal nitride, a metal silicide, etc.

The fifth insulating interlayer pattern 980 may be formed on the third insulating interlayer pattern 860, the channel 915, the second gate insulation pattern 925 and the thirteenth insulation pattern 960, and may at least partially cover a sidewall of the contact plug 970. The fifth insulating interlayer pattern 980 may include an oxide, e.g., silicon oxide.

The first lower electrode structure 75 included in the first capacitor 110 may contact an upper surface of the contact plug 970. As the contact plugs 970 are spaced apart from each other in the first and second directions D1 and D2, a plurality of first lower electrode structures 75 may be spaced apart from each other in the first and second directions D1 and D2.

In the semiconductor device, current may flow in the fifth direction D5, for example, in the vertical direction in the channel 915 between the second bit line 830 and the contact plug 970, and thus the semiconductor device may include a vertical channel transistor (VCT) having a vertical channel.

FIGS. 35 to 45 are plan views and cross-sectional views illustrating a method of manufacturing a semiconductor device in accordance with example embodiments. Particularly, FIGS. 35, 37, 40, 42 and 44 are the plan views, and FIG. 36 is a cross-sectional view taken along line A-A' of FIG. 35, and FIGS. 38-39, 41, 43 and 45 are cross-sectional views taken along lines B-B' of corresponding plan views, respectively.

This method may be an application of the method of forming the first capacitor structure illustrated with reference to FIGS. 1 to 6 to a method of manufacturing a VCT DRAM device, and thus the method of forming the first capacitor structure may be assumed to be at least similar to the approach described elsewhere within the instant specification.

Referring to FIGS. 35 and 36, a ninth insulation layer 810, a tenth insulation layer, a second bit line layer and an eleventh insulation layer may be sequentially stacked on a substrate 800, and the eleventh insulation layer, the second bit line layer and the tenth insulation layer may be patterned to form an eleventh insulation pattern 840, a second bit line 830 and a tenth insulation pattern 820, respectively.

The tenth insulation pattern 820, the second bit line 830 and the eleventh insulation pattern 840, sequentially stacked on the substrate 800, may be referred to as a second bit line structure. In example embodiments, the second bit line structure may extend in the first direction D1 on the substrate 800, and a plurality of second bit line structures may be spaced apart from each other in the second direction D2. Thus, a tenth opening may be formed between neighboring ones of the second bit line structures in the second direction D2 to expose an upper surface of the ninth insulation layer 810.

A second insulating interlayer may be formed on the second bit line structures and the ninth insulation layer 810 to fill the tenth opening, and an upper portion of the second insulating interlayer may be planarized until upper surfaces of the second bit line structures are exposed. Thus, a second insulating interlayer pattern 850 extending in the first direction D1 may be formed on the ninth insulation layer 810 between the second bit line structures.

In example embodiments, the planarization process may include a chemical mechanical polishing (CMP) process and/or an etch back process.

Figure 37:
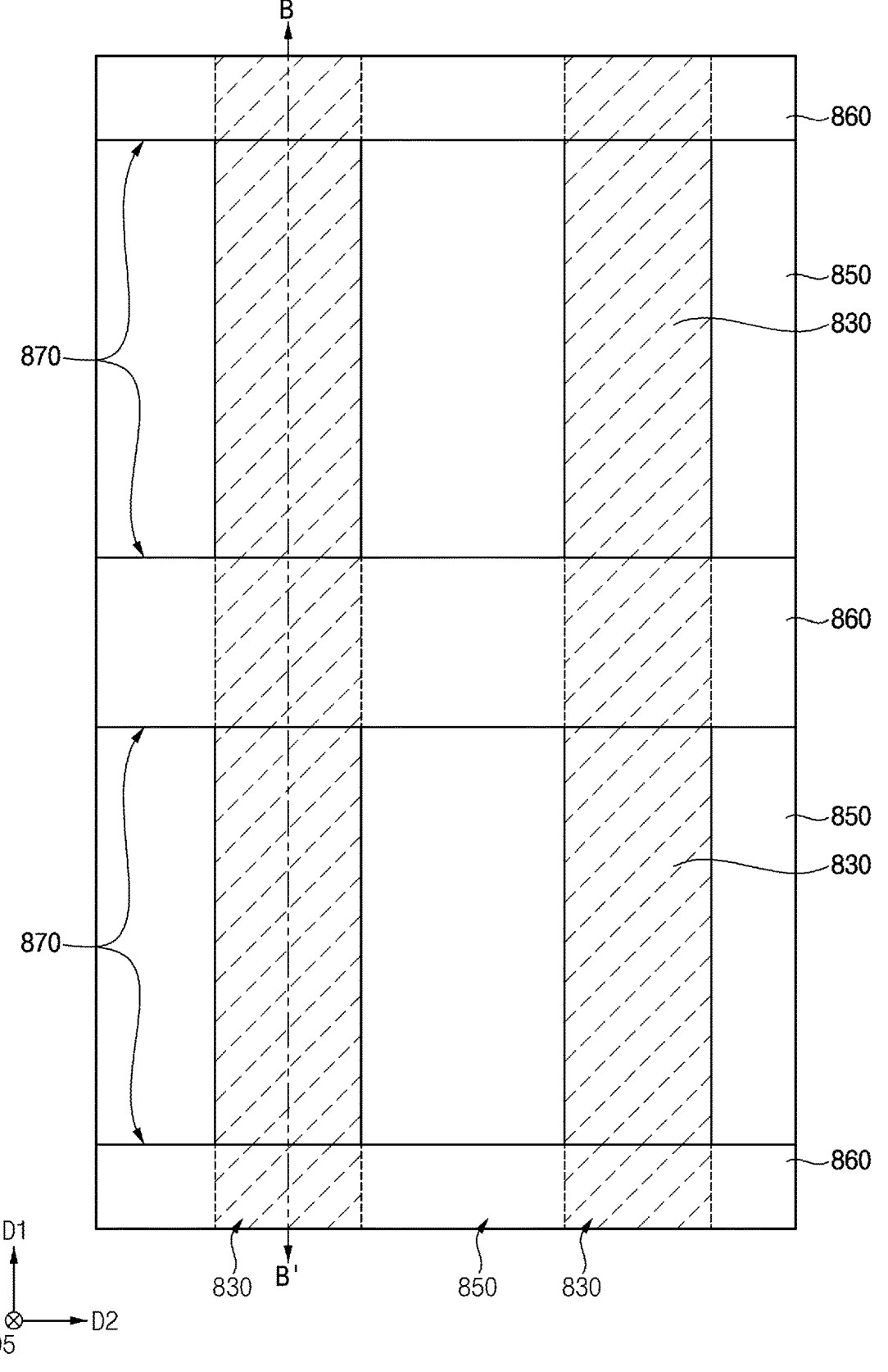
Figure 38:
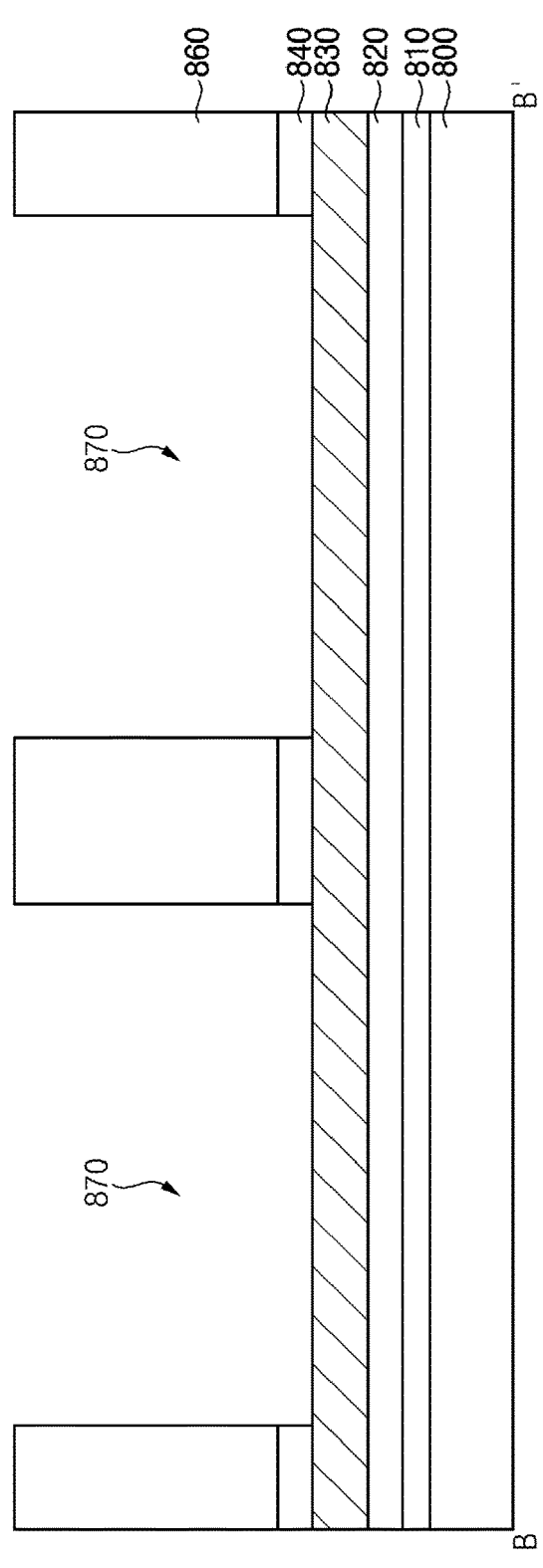
Figure 38:
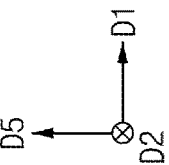

Referring to FIGS. 37 and 38, a third insulating interlayer may be formed on the second bit line structures and the second insulating interlayer patterns 850, and the third insulating interlayer and the eleventh insulation pattern 840 may be partially removed by, e.g., a dry etching process to form an eleventh opening 870 extending in the second direction D2 and exposing upper surfaces of the second bit line 830 and the second insulating interlayer pattern 850.

Thus, the third insulating interlayer may be divided into a plurality of third insulating interlayer patterns 860, each of which may extend in the second direction D2, spaced apart from each other in the first direction D1.

Figure 39:
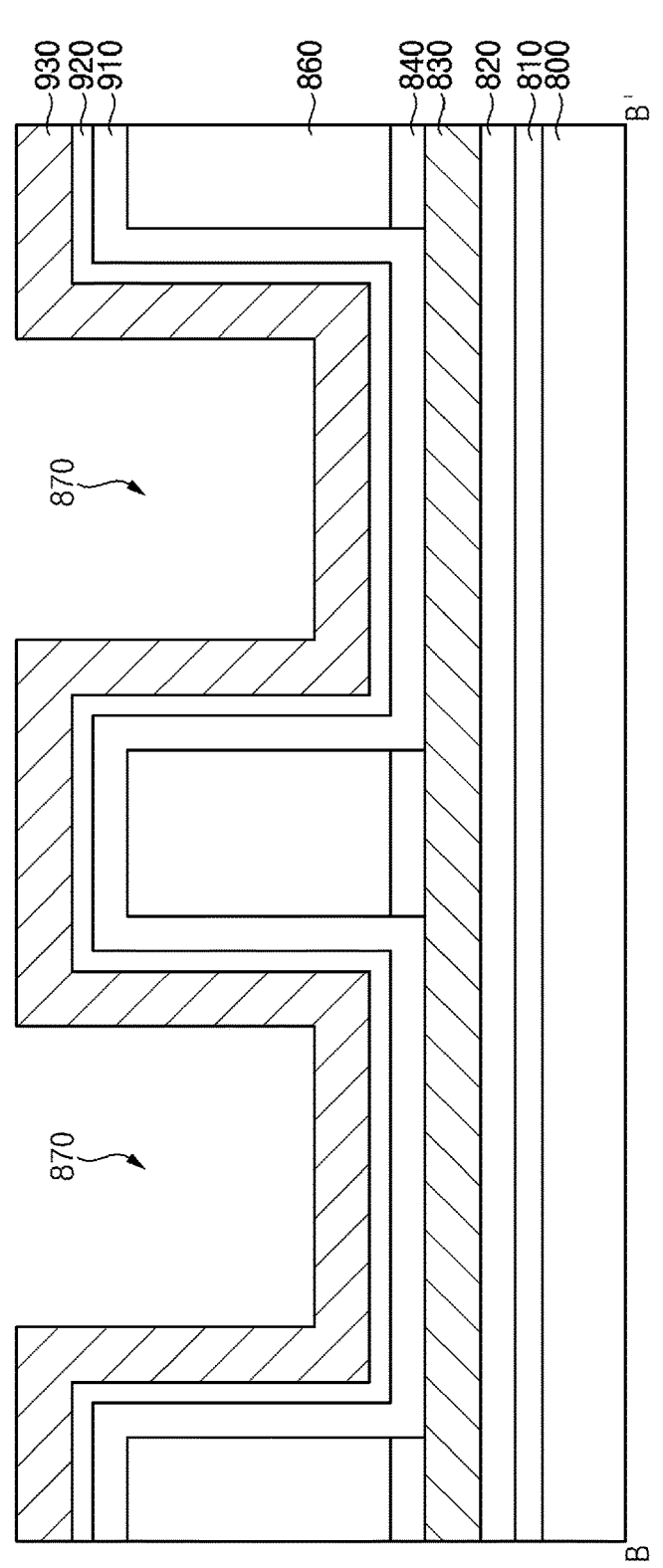
Figure 39:
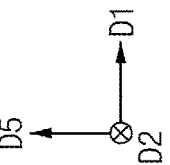

Referring to FIG. 39, a channel layer 910, a second gate insulation layer 920 and a second gate electrode layer 930 may be sequentially stacked on upper surfaces of the second bit line 830 and the second insulating interlayer pattern 850 exposed by the tenth opening 870 and a sidewall and an upper surface of the third insulating interlayer pattern 860.

In example embodiments, the channel layer 910, the second gate insulation layer 920 and the second gate electrode layer 930 may be formed by a deposition process, e.g., an atomic layer deposition (ALD) process, a chemical vapor deposition (CVD) process, etc.

In example embodiments, the channel layer 910 may include an amorphous oxide semiconductor material, e.g., indium gallium zinc oxide (IGZO), and may be formed at a relatively low temperature. The second gate insulation layer 920 and the second gate electrode layer 930 may be formed at a relatively high temperature.

Figure 40:
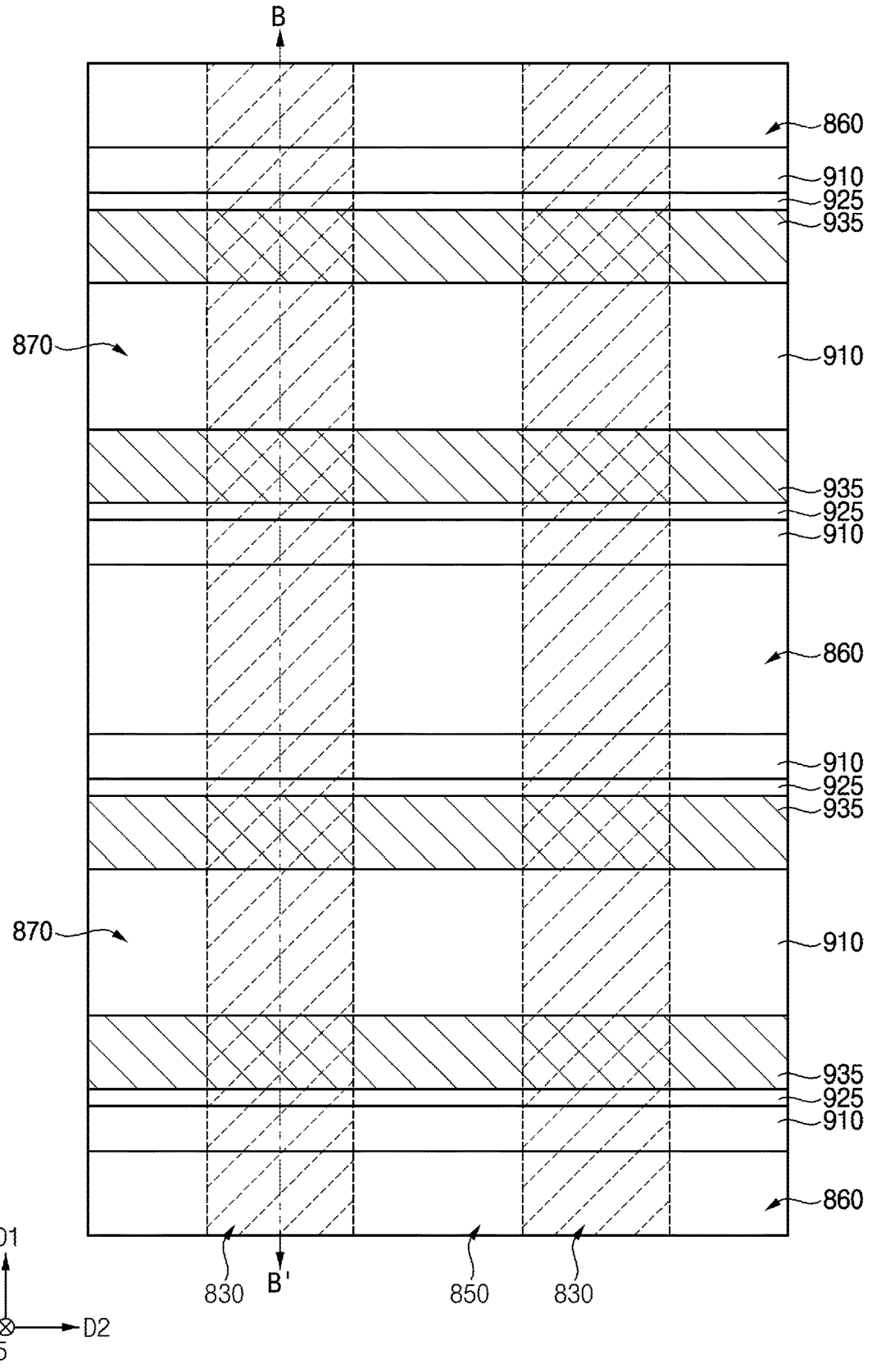
Figure 41:
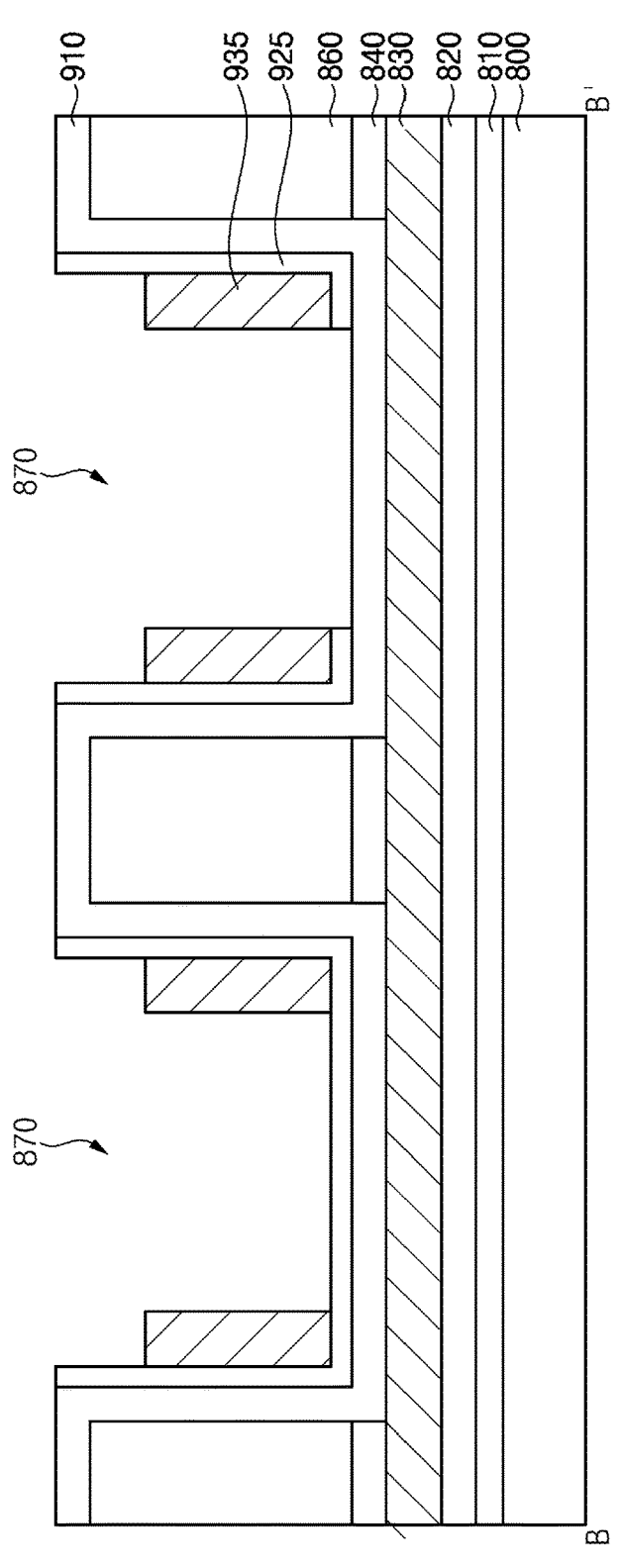
Figure 41:
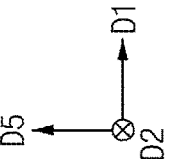

Referring to FIGS. 40 and 41, the second gate electrode layer 930 and the second gate insulation layer 920 may be anisotropically etched to form a second gate electrode 935 and a second gate insulation pattern 925, respectively, on a sidewall of the eleventh opening 870.

In example embodiments, an outer sidewall of the second gate insulation pattern 925 may contact an inner sidewall of the channel layer 910 and an upper surface of an edge portion in the first direction D1 of the channel layer 910. In example embodiments, a cross-section of the second gate insulation pattern 925 in the first direction D1 may have an "L" shape.

The second gate electrode 935 may contact an inner sidewall of the second gate insulation pattern 925 and an upper surface of a portion of the second gate insulation pattern 925 that is on the upper surface of the edge portion of the channel layer 910.

An upper portion of the second gate electrode 935 may be removed by, e.g., an etch back process. Thus, an upper surface of the second gate electrode 935 may be lower than an upper surface of the second gate insulation pattern 925, and an upper inner sidewall of the second gate insulation pattern 925 may be exposed. In example embodiments, the upper surface of the second gate electrode 935 may be lower than an upper surface of the third insulating interlayer pattern 860.

Figure 42:
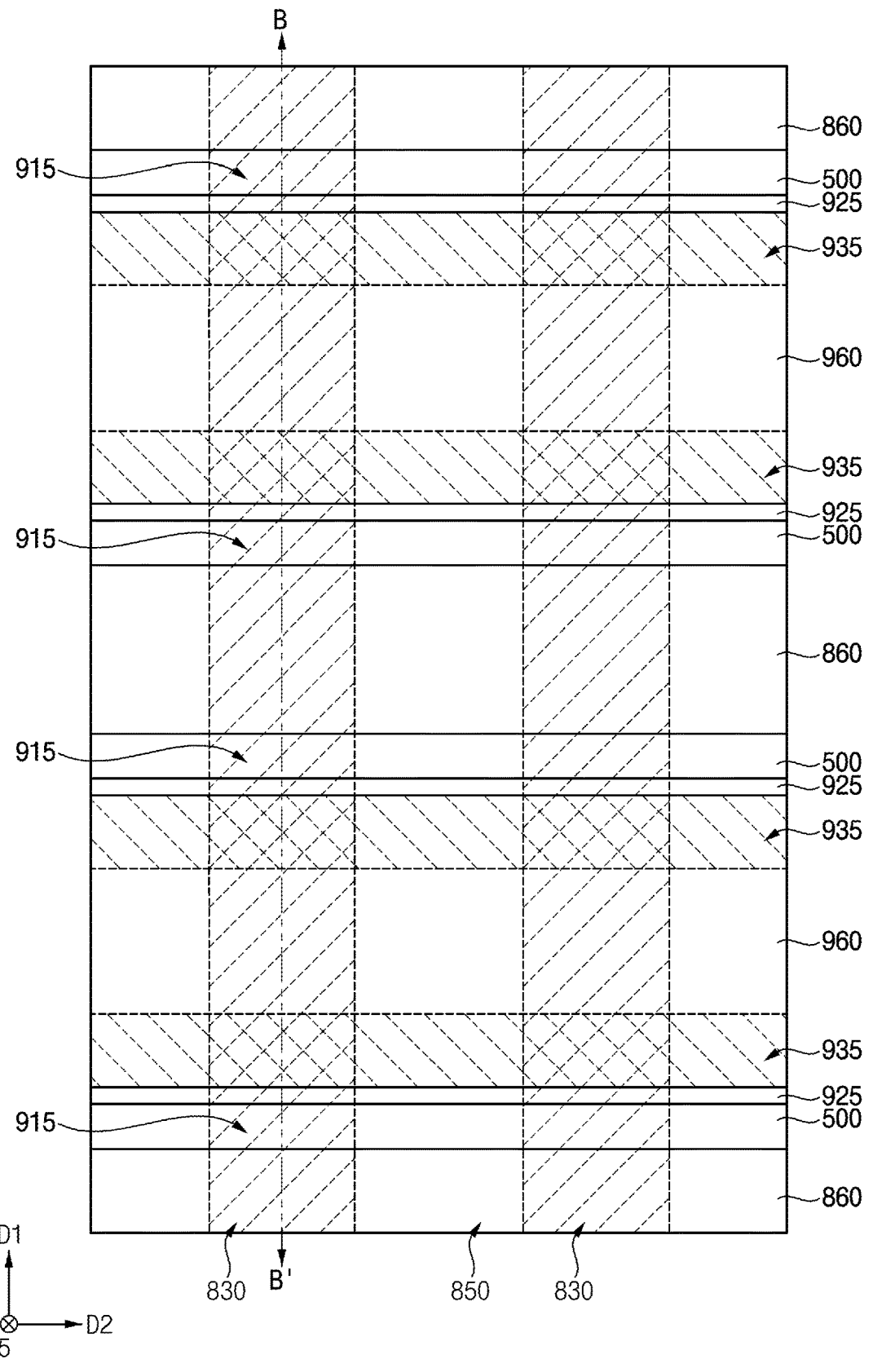
Figure 43:
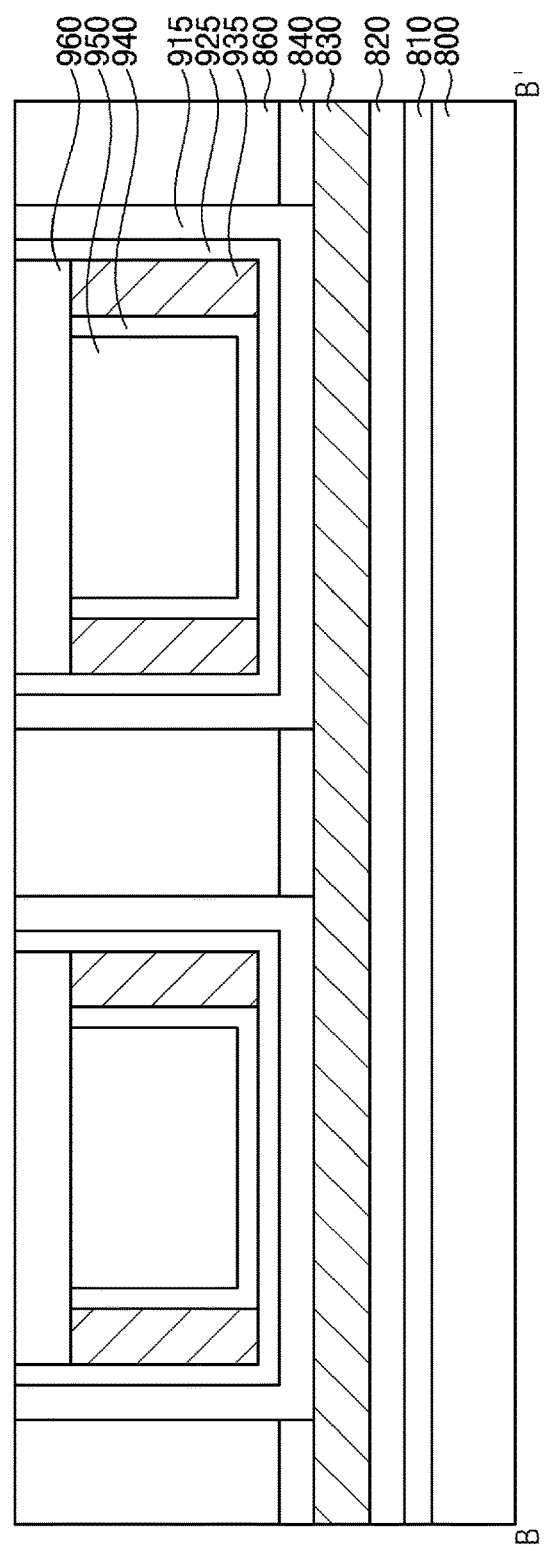
Figure 43:
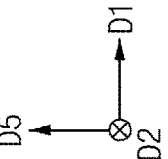

Referring to FIGS. 42 and 43, a twelfth insulation layer may be formed on a sidewall and the upper surface of the second gate electrode 935, the upper inner sidewall and the upper surface of the second gate insulation pattern 925, and an upper surface of the channel layer 910, a fourth insulating interlayer may be formed on the twelfth insulation layer to fill a remaining portion of the eleventh opening 870, and a planarization process may be performed on the fourth insulating interlayer, the twelfth insulation layer, the second gate insulation pattern 925 and the channel layer 910 until the upper surface of the third insulating interlayer pattern 860 is exposed.

The planarization process may include a chemical-mechanical polishing (CMP) process and/or an etch back process.

By the planarization process, a fourth insulating interlayer pattern 950 and a twelfth insulation pattern 940 at least partially covering a lower surface and a sidewall of the fourth insulating interlayer pattern 950 may be formed in the eleventh opening 870, and the channel layer 910 may be divided into a plurality of channels 915 spaced apart from each other in the first direction D1. In example embodiments, each of the channels 915 may extend in the second direction D2, and a cross-section in the first direction D1 of each of the channels 915 may have a cup shape.

Upper portions of the fourth insulating interlayer pattern 950 and the twelfth insulation pattern 940 may be removed to form a third recess exposing the upper surface of the second gate electrode 935, and a thirteenth insulation pattern 960 may be formed in the third recess.

The thirteenth insulation pattern 960 may be formed by forming a thirteenth insulation layer disposed on the second gate electrode 235, the fourth insulating interlayer pattern 950, the twelfth insulation pattern 940, the second gate insulation pattern 925, the channel 915 and the third insulating interlayer pattern 860 to fill the third recess, and planarizing the thirteenth insulation layer until the upper surface of the third insulating interlayer pattern 860 is exposed.

The channel 915 may be partially removed to form a twelfth opening exposing upper surfaces of the second bit line 830 and the second upper insulating interlayer pattern 850, and a fourteenth insulation pattern 500 may be formed in the twelfth opening. Thus, the channel 915 extending in the second direction D2 may be divided into a plurality of parts spaced apart from each other in the second direction D2. As a result, a plurality of channels 915 may be spaced apart from each other in the first and second directions D1 and D2.

Figure 44:
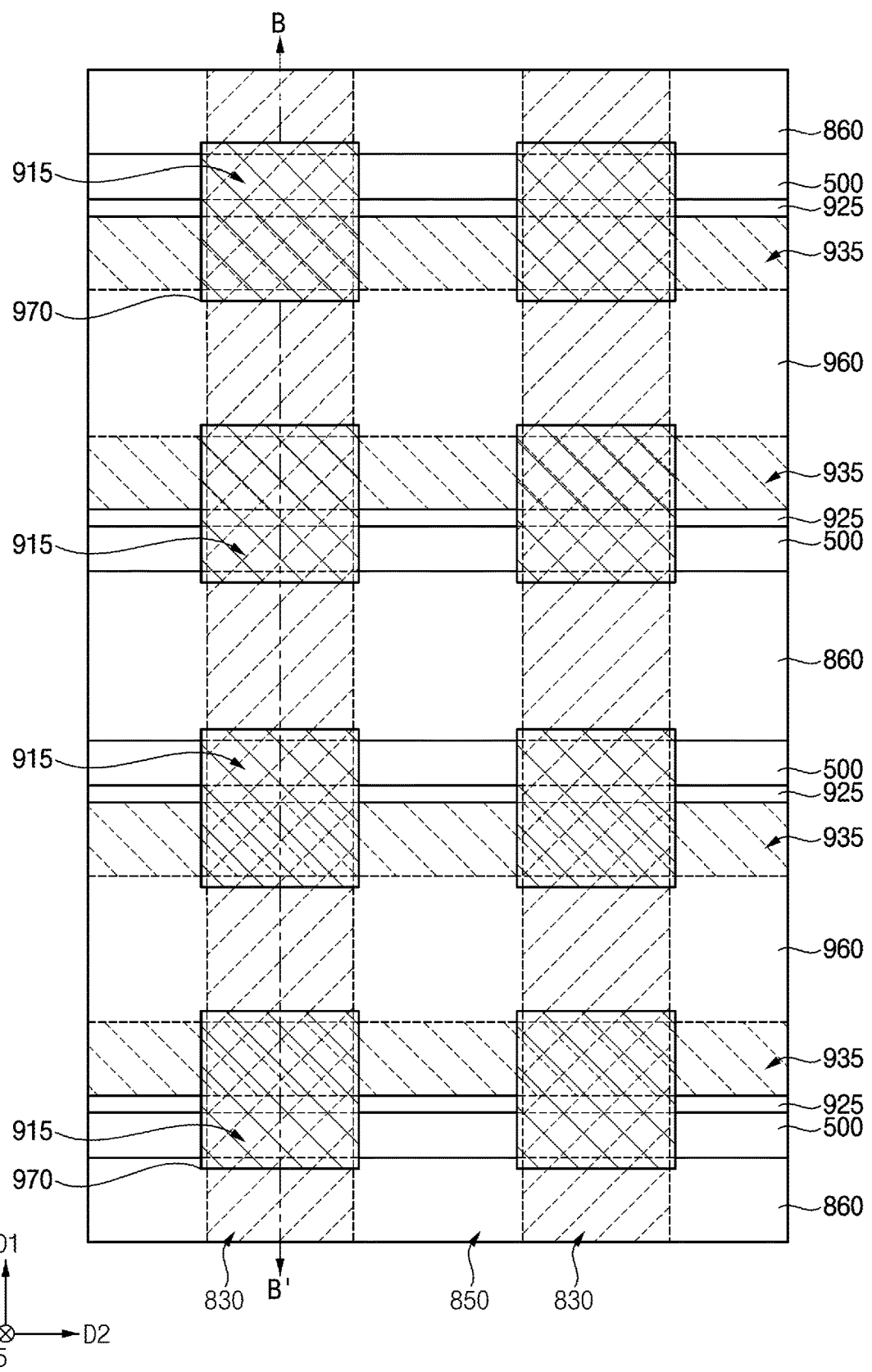

Referring to FIGS. 44 and 45, an upper portion of the channel 915 may be removed to form a fourth recess, and a contact plug layer may be formed on the channel 915, the third insulating interlayer pattern 860, the second gate insulation pattern 925 and the thirteenth insulation pattern 960, and may be patterned to form a contact plug 970 contacting an upper surface of the channel 915.

In example embodiments, a plurality of contact plugs 970 may be spaced apart from each other in the first and second directions D1 and D2. In an example embodiment, the contact plugs 970 may be arranged in a lattice pattern in a plan view. Alternatively, the contact plugs 970 may be arranged in a honeycomb pattern in a plan view.

Referring to FIGS. 33 and 34 again, a fifth insulating interlayer may be formed on the third insulating interlayer pattern 860, the channel 915, the second gate insulation pattern 925 and the thirteenth insulation pattern 960 to at least partially cover the contact plug 970, and an upper portion of the fifth insulating interlayer may be planarized until an upper surface of the contact plug 970 is exposed to form a fifth insulating interlayer pattern 980 at least partially covering a sidewall of the contact plug 970.

The first capacitor structure may be formed on the contact plug 970 and the fifth insulating interlayer pattern 980 so the fabrication of the semiconductor device may be completed.

Figure 46:
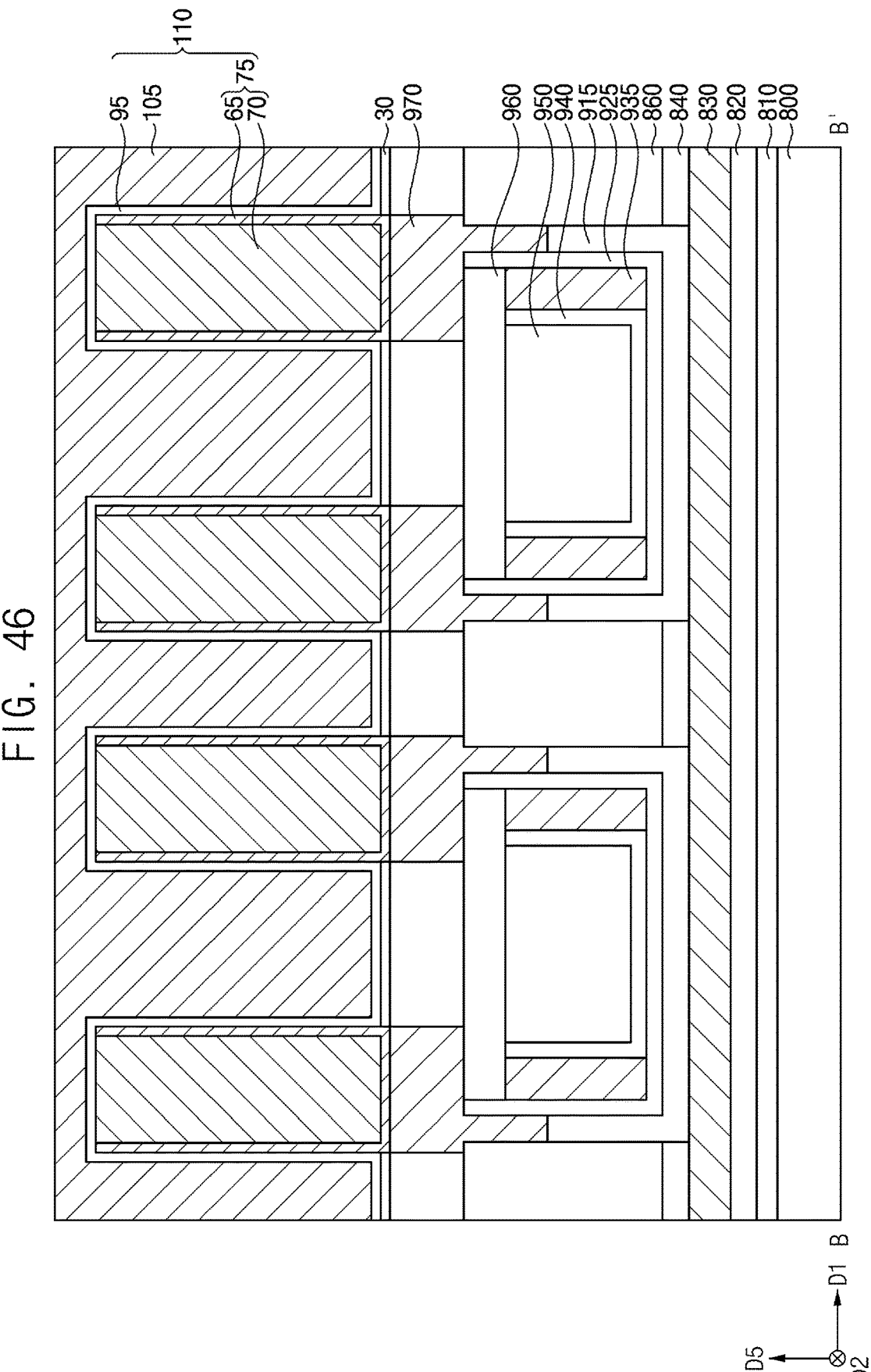
FIG. 46 is a cross-sectional view illustrating a semiconductor device in accordance with example embodiments.

FIG. 46 is a cross-sectional view illustrating a semiconductor device in accordance with example embodiments, which may correspond to FIG. 34.

This semiconductor device may be substantially the same as or similar to the semiconductor device of FIGS. 33 and 34, except that the first capacitor structure does not include the support layer 50. Thus, the dielectric pattern 95 included in the first capacitor structure may at least partially cover a sidewall and an upper surface of the first lower electrode structure 75 and an upper surface of the first etch stop layer 30, and the first upper electrode 105 may be formed on the dielectric pattern 95.

FIG. 46 shows that the first capacitor structure does not include the upper electrode plate 120, however, the inventive concept is not necessarily limited thereto.\

While example embodiments have been particularly shown and described, it will be understood by one of ordinary skill in the art that variations in form and detail may be made therein without departing from the spirit and scope of the present disclosure.

What is claimed is:

1. A capacitor structure, comprising:
   a lower electrode structure disposed on a substrate, the lower electrode structure including an oxide of a first metal having 4 valence electrons and being doped with a second metal having 3, 5, 6, or 7 valence electrons;

a dielectric pattern disposed on a sidewall of the lower electrode structure; and
   an upper electrode disposed on a sidewall of the dielectric pattern.

2. The capacitor structure of claim 1, wherein the first metal is hafnium or zirconium.

3. The capacitor structure of claim 1, wherein the second metal is vanadium, niobium, tantalum, chromium, molybdenum, tungsten, manganese, yttrium or lanthanum.

4. The capacitor structure of claim 1, wherein the lower electrode structure includes:
   a second lower electrode; and
   a first lower electrode disposed on a sidewall of the second lower electrode,
   wherein the first lower electrode includes an oxide of the first metal and is doped with the second metal.

5. The capacitor structure of claim 4, wherein the first lower electrode at least partially covers a lower surface of the second lower electrode.

6. The capacitor structure of claim 1, wherein the dielectric pattern includes an oxide of a third metal having 4 valence electrons.

7. The capacitor structure of claim 6, wherein the third metal and the first metal are the same metal.

8. The capacitor structure of claim 1, wherein the upper electrode includes an oxide of a third metal having 4 valence electrons and is doped with a fourth metal having 3, 5, 6, or 7 valence electrons.

9. The capacitor structure of claim 8, wherein the upper electrode includes a material that is the same as a material of the lower electrode structure.

10. The capacitor structure of claim 1, further comprising a support layer disposed on the sidewall of the lower electrode structure.

11. The capacitor structure of claim 10, wherein the dielectric pattern contacts; the sidewall of the lower electrode structure, an upper surface of the support layer, and a lower surface of the support layer.

12. A capacitor structure, comprising:
   a lower electrode structure including:
      a second lower electrode disposed on a substrate; and
      a first lower electrode disposed on a sidewall of the second lower electrode, the first lower electrode including an oxynitride of a first metal having 4 valence electrons and being doped with a second metal having 3, 5, 6, or 7 valence electrons;
   a dielectric pattern disposed on a sidewall of the lower electrode structure; and
   an upper electrode disposed on a sidewall of the dielectric pattern.

13. The capacitor structure of claim 12, wherein the second lower electrode extends in a vertical direction that is substantially perpendicular to an upper surface of the substrate, and
   wherein the first lower electrode is one of a plurality of first lower electrodes spaced apart from each other in the vertical direction.

14. The capacitor structure of claim 13, further comprising an insulation pattern disposed on a portion of the sidewall of the second electrode, between neighboring pairs of the plurality of first lower electrodes.

15. The capacitor structure of claim 14, further comprising a support layer disposed on a sidewall of the insulation pattern.

16. The capacitor structure of claim 12, wherein the insulation pattern includes an oxide of a third metal having 4 valence electrons.

17. The capacitor structure of claim 12, wherein the second metal is vanadium, niobium, tantalum, chromium, molybdenum, tungsten, manganese, yttrium/or lanthanum.

18. The capacitor structure of claim 12, wherein the dielectric pattern includes an oxide of a third metal having 4 valence electrons.

19. The capacitor structure of claim 12, wherein the upper electrode includes an oxide of a third metal having 4 valence electrons and is doped with a fourth metal having 3, 5, 6, or 7 valence electrons.

20. A capacitor structure, comprising:

a lower electrode structure including:

a second lower electrode disposed on a substrate, the second lower electrode extending in a vertical direction that is substantially perpendicular to an upper surface of the substrate; and a first lower electrode disposed on a sidewall of the second lower electrode, the first lower electrode including an oxide of a first metal having 4 valence electrons and being doped with a second metal having 3, 5, 6, or 7 valence electrons;

support layers contacting a sidewall of the lower electrode structure, the support layers being spaced apart from each other in the vertical direction;

a dielectric pattern disposed on a portion of the sidewall of the lower electrode structure, between neighboring pairs of the support layers; and an upper electrode disposed on a sidewall of the dielectric pattern.

\*    \*    \*    \*    \*